US011370965B2

(12) United States Patent
Parham et al.

(10) Patent No.: US 11,370,965 B2
(45) Date of Patent: Jun. 28, 2022

(54) MATERIALS FOR ORGANIC ELECTROLUMINESCENT DEVICES

(71) Applicant: Merck Patent GmbH, Darmstadt (DE)

(72) Inventors: Amir Parham, Frankfurt am Main (DE); Jonas Kroeber, Frankfurt am Main (DE); Jens Engelhart, Darmstadt (DE); Anja Jatsch, Frankfurt am Main (DE); Christian Eickhoff, Mannheim (DE); Christian Ehrenreich, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/646,772

(22) PCT Filed: Sep. 10, 2018

(86) PCT No.: PCT/EP2018/074253

§ 371 (c)(1),
(2) Date: Mar. 12, 2020

(87) PCT Pub. No.: WO2019/052933

PCT Pub. Date: Mar. 21, 2019

(65) Prior Publication Data

US 2020/0291291 A1 Sep. 17, 2020

(30) Foreign Application Priority Data

Sep. 12, 2017 (EP) .................................... 17190495

(51) Int. Cl.

| | |
|---|---|
| ***C09K 11/02*** | (2006.01) |
| ***C07F 5/02*** | (2006.01) |
| ***C09K 11/06*** | (2006.01) |
| ***H01L 51/00*** | (2006.01) |
| *H01L 51/50* | (2006.01) |

(52) U.S. Cl.

CPC ................ *C09K 11/02* (2013.01); *C07F 5/02* (2013.01); *C09K 11/06* (2013.01); *H01L 51/0059* (2013.01); *H01L 51/0065* (2013.01); *H01L 51/0067* (2013.01); *H01L 51/0068* (2013.01); *H01L 51/0072* (2013.01); *C09K 2211/1007* (2013.01); *C09K 2211/1029* (2013.01); *C09K 2211/185* (2013.01); *H01L 51/5016* (2013.01); *H01L 51/5056* (2013.01); *H01L 51/5072* (2013.01)

(58) Field of Classification Search

CPC ..................................................... C09K 11/02

See application file for complete search history.

(56) References Cited

U.S. PATENT DOCUMENTS

| | | | | |
|---|---|---|---|---|
| 3,079,432 | A | 2/1963 | Petterson et al. | |
| 8,674,141 | B2 | 3/2014 | Stoessel et al. | |
| 8,835,626 | B2 | 9/2014 | Parham et al. | |
| 9,434,877 | B2 | 9/2016 | Pflumm et al. | |
| 2016/0351811 | A1* | 12/2016 | Lam | H01L 51/0071 |

FOREIGN PATENT DOCUMENTS

| | | | |
|---|---|---|---|
| WO | WO-2006117052 | A1 | 11/2006 |
| WO | WO-2011110262 | A1 | 9/2011 |
| WO | WO-2011116865 | A1 | 9/2011 |
| WO | WO-2016143819 | A1 | 9/2016 |

OTHER PUBLICATIONS

International Search Report for PCT/EP2018/074253 dated Nov. 13, 2018.

Written Opinion of the International Searching Authority for PCT/EP2018/074253 dated Nov. 13, 2018 (English translation).

* cited by examiner

*Primary Examiner* — William D Young

(74) *Attorney, Agent, or Firm* — Faegre Drinker Biddle & Reath LLP

(57) ABSTRACT

The present invention relates to cyclic diazaboroles, in particular for use as triplet matrix materials in organic electroluminescent devices. The invention further relates to a method for producing the compounds according to the invention, and to electronic devices comprising same.

8 Claims, No Drawings

MATERIALS FOR ORGANIC ELECTROLUMINESCENT DEVICES

CROSS-REFERENCE TO RELATED APPLICATIONS

This application is a national stage application (under 35 U.S.C. § 371) of PCT/EP2018/074253, filed Sep. 10, 2018, which claims benefit of European Application No. 17190495.6, filed Sep. 12, 2017, both of which are incorporated herein by reference in their entirety.

The present invention relates to cyclic diazaboroles, especially for use as triplet matrix materials in organic electroluminescent devices. The invention further relates to a process for preparing the compounds of the invention and to electronic devices comprising these compounds.

Emitting materials used in organic electroluminescent devices (OLEDs) are frequently organometallic complexes that exhibit phosphorescence. For quantum-mechanical reasons, up to four times the energy efficiency and power efficiency is possible using organometallic compounds as phosphorescent emitters. In general terms, there is still a need for improvement in OLEDs, especially also in OLEDs which exhibit phosphorescence, for example with regard to efficiency, operating voltage and lifetime.

The properties of phosphorescent OLEDs are not just determined by the triplet emitters used. More particularly, the other materials used, for example matrix materials, are also of particular significance here. Improvements to these materials can thus also lead to distinct improvements in the OLED properties. In general terms, in the case of these materials for use as matrix materials, there is still need for improvement, particularly in relation to lifetime and oxidation sensitivity, but also in relation to the efficiency and operating voltage of the device.

It is an object of the present invention to provide compounds suitable for use in a phosphorescent or fluorescent OLED, especially as matrix material. More particularly, it is an object of the present invention to provide matrix materials which are suitable for red-, orange-, yellow- and green-phosphorescing OLEDs and possibly also for blue-phosphorescing OLEDs, and which lead to long lifetime, good efficiency and low operating voltage. Particularly the properties of the matrix materials too have an essential influence on the lifetime and efficiency of the organic electroluminescent device.

It has been found that, surprisingly, electroluminescent devices containing compounds of the formula (1) below have improvements over the prior art, especially when used as matrix material for phosphorescent dopants.

The present invention therefore provides a compound of the following formula (1):

Formula (1)

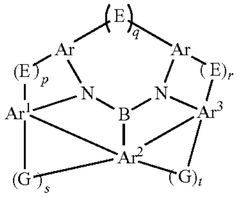

where the symbols and indices used are as follows:

E is the same or different at each instance and is selected from the group consisting of a single bond, NR, $CR_2$, O, S and C═O;

G is the same or different at each instance and is selected from the group consisting of NR, $CR_2$, O, S and C═O;

p, q, r are the same or different at each instance and are selected from the group consisting of 0, 1 and 2;

s, t are the same or different at each instance and are selected from the group consisting of 0 and 1;

R is the same or different at each instance and is selected from the group consisting of H, D, F, Cl, Br, I, CN, $NO_2$, $N(Ar^4)_2$, $N(R^1)_2$, $OAr^4$, $OR^1$, $SAr^4$, $SR^1$, $C(═O)Ar^4$, $C(═O)R^1$, $P(═O)(Ar^4)_2$, $P(Ar^4)_2$, $B(Ar^4)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl group or alkynyl group having 2 to 40 carbon atoms, each of which may be substituted by one or more $R^1$ radicals and where one or more nonadjacent $CH_2$ groups may be replaced by $R^1C═CR^1$, C═O, C═S, $C═NR^1$, $P(═O)(R^1)$, SO, $SO_2$, $NR^1$, O, S or $CONR^1$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^1$ radicals, or an aralkyl or heteroaralkyl group which has 5 to 60 aromatic ring atoms and may be substituted by one or more $R^1$ radicals, or a combination of these systems; at the same time, it is optionally possible for two or more substituents R preferably bonded to the same carbon atom or to adjacent carbon atoms to form a monocyclic or polycyclic, aliphatic, heteroaliphatic, aromatic or heteroaromatic ring system which may be substituted by one or more $R^1$ radicals;

Ar, $Ar^1$, $Ar^2$, $Ar^3$ are the same or different at each instance and are an aromatic or heteroaromatic ring system which has 5 to 40 aromatic ring atoms and may be substituted by one or more R radicals, where, when q is 0, both Ar together may also be an Ar group bonded to at least both nitrogen atoms;

$Ar^4$ is the same or different at each instance and is an aromatic or heteroaromatic ring system which has 5 to 40 aromatic ring atoms and may be substituted by one or more $R^2$ radicals; at the same time, two $Ar^4$ radicals bonded to the same nitrogen atom or phosphorus atom may also be bridged to one another by a single bond or a bridge selected from $N(R^2)$, $C(R^2)_2$, O and S;

$R^1$ is the same or different at each instance and is selected from the group consisting of H, D, F, Cl, Br, I, CN, $NO_2$, $N(R^2)_2$, $OR^2$, $SR^2$, $C(═O)R^2$, a straight-chain alkyl, alkoxy or thioalkyl group having 1 to 20 carbon atoms or a branched or cyclic alkyl, alkoxy or thioalkyl group having 3 to 20 carbon atoms or an alkenyl group or alkynyl group having 2 to 20 carbon atoms, each of which may be substituted by one or more $R^2$ radicals and where one or more nonadjacent $CH_2$ groups may be replaced by $R^2C═CR^2$, C═O, C═S, $C═NR^2$, $P(═O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, or an aralkyl or heteroaralkyl group which has 5 to 40 aromatic ring atoms and may be substituted by one or more $R^2$ radicals; at the same time, it is optionally possible for two substituents $R^1$ bonded to the same carbon atom or adjacent carbon atoms to form a monocyclic or polycyclic, aliphatic, heteroaliphatic, aromatic or heteroaromatic ring system which may be substituted by one or more $R^2$ radicals; and $R^2$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F or CN or substituted by one or more alkyl groups each having 1 to 10 carbon atoms; at the same time, two or more adjacent $R^2$ substituents together may form a mono- or polycyclic, aliphatic, aromatic or heteroaromatic ring system.

What is meant here by p, q or r=0 is that the corresponding E group is absent. In addition, what is meant by s or t=0 is that the corresponding G group is absent.

Adjacent atoms, especially carbon atoms, in the context of the present invention are atoms bonded directly to one another.

The wording that two or more radicals together may form a ring, in the context of the present description, should be understood to mean, inter alia, that the two radicals are joined to one another by a chemical bond with formal elimination of two hydrogen atoms. This is illustrated by the following scheme:

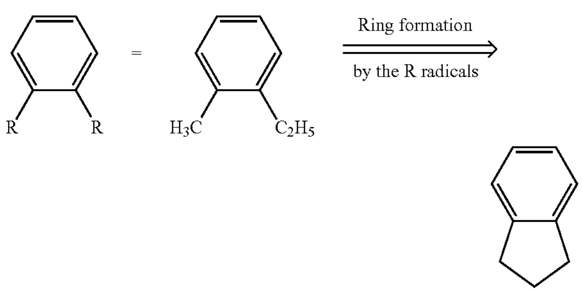

In addition, the abovementioned wording shall also be understood to mean that, if one of the two radicals is hydrogen, the second radical binds to the position to which the hydrogen atom was bonded, forming a ring. This shall be illustrated by the following scheme:

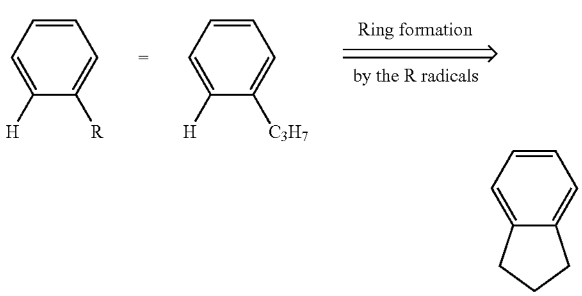

A fused aryl group in the context of the present invention is a group in which two or more aromatic groups are fused, i.e. annellated, to one another along a common edge, as, for example, in naphthalene. By contrast, for example, fluorene is not a fused aryl group in the context of the present invention, since the two aromatic groups in fluorene do not have a common edge. The same applies to fused heteroaryl groups.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{40}$-alkyl group in which individual hydrogen atoms or $CH_2$ groups may also be substituted by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy or 2,2,2-trifluoroethoxy. A thioalkyl group having 1 to 40 carbon atoms is understood to mean especially methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio. In general, alkyl, alkoxy or thioalkyl groups according to the present invention may be straight-chain, branched or cyclic, where one or more nonadjacent $CH_2$ groups may be replaced by the abovementioned groups; in addition, it is also possible for one or more hydrogen atoms to be replaced by D, F, Cl, Br, I, CN or $NO_2$, preferably F, Cl or CN, further preferably F or CN, especially preferably CN.

An aromatic or heteroaromatic ring system, preferably having 5-40 aromatic ring atoms, which may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment, s and t are each 0. This means that the respective $Ar^1$, $Ar^2$ and $Ar^3$ groups are bonded to one another solely via a single bond in each case, and not by an additional G group.

In a preferred embodiment, b and r are the same or different at each instance and are selected from 0 and 1, and q is selected from 0, 1 and 2.

Preferably, in $Ar^1$ and $Ar^3$, the respective single bond to $Ar^2$ is adjacent to the respective nitrogen atom in $Ar^1$, or $Ar^3$, i.e. in the ortho position.

Preferably, the single bonds to $Ar^1$ and $Ar^2$ and the bond to the boron atom in $Ar^3$ are adjacent, i.e. in the ortho position.

Preferably, in $Ar^1$ and $Ar^3$, the respective bond to $Ar^2$ is adjacent to the respective nitrogen atom in $Ar^1$, or $Ar^3$, and the single bonds to $Ar^1$ and $Ar^2$ and the bond to the boron atom in $Ar^3$ are adjacent. As a result, $Ar^1$, $Ar^2$ together with B and N, and $Ar^3$ and $Ar^2$ together with B and N, each form a six-membered ring.

In a further embodiment of the invention, the compound is selected from compounds of the formula (2)

Formula (2)

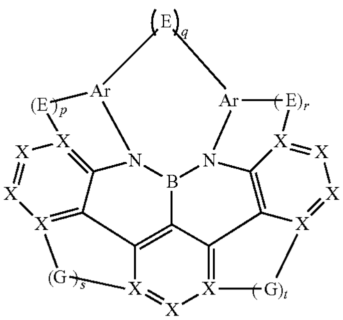

where symbols and indices correspond to the symbols and indices of formula (1), and in addition:

X is the same or different at each instance and is CR or N, or exactly two adjacent X groups together are a group selected from NR, O and S and the remaining X are the same or different and are CR or N, forming a five-membered ring; in this case, X is C or N or exactly two X are N when there is a bond to E or G thereon; with the proviso that not more than 3 X, preferably not more than 2 X, in any cycle are N.

In a preferred embodiment of the invention, the compound is selected from the compounds of the formulae (2-1) to (2-3)

Formula (2-1)

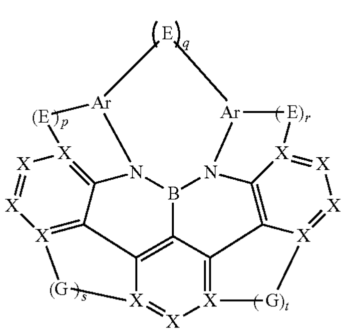

-continued

Formula (2-2)

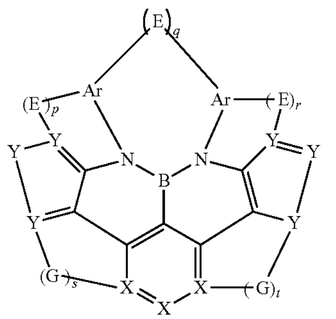

Formula (2-3)

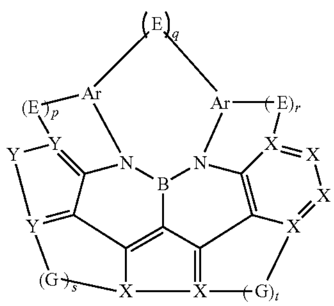

where the symbols and indices have the definitions given above, and in addition:

X is the same or different at each instance and is CR or N, where X is C when there is a bond to E or G thereon, and where not more than 2 X in any cycle are N; and Y is the same or different at each instance and is CR, NR, O or S, where Y may also be N when one Y in the same cycle is already NR, O or S, where Y is C or N when there is a bond to E thereon.

In a particularly preferred embodiment, the compound is a compound of the formula (2-1). More preferably, in the formulae (2-1), (2-2) and (2-3), all X are CR, or C if there is a bond to E or G thereon.

In a further preferred embodiment, the compound is a compound of the formula (3-1) to (3-6)

Formula (3-1)

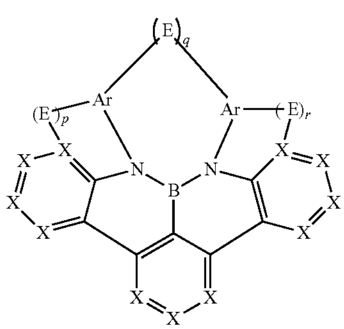

-continued

Formula (3-2)

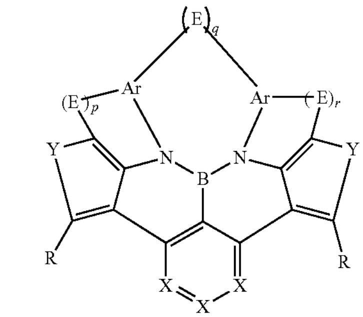

Formula (3-3)

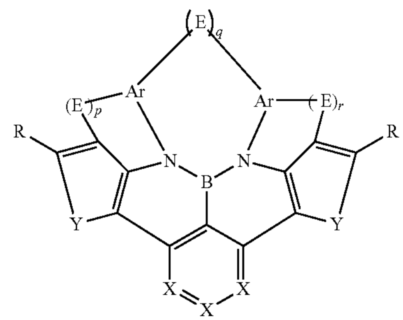

Formula (3-4)

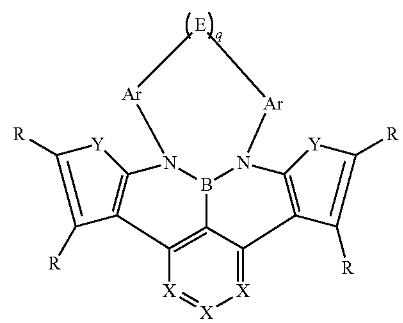

Formula (3-5)

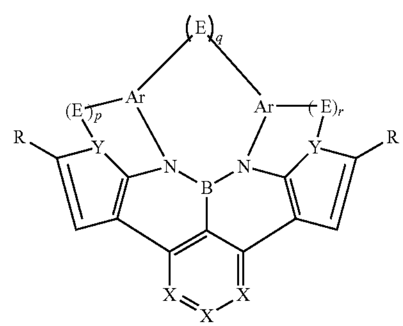

Formula (3-6)

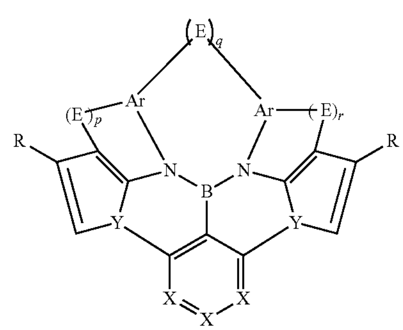

where, in addition to the formulae (2-1) to (2-3):

Y in formulae (3-1) to (3-4) is the same or different at each instance and is NR, 4 or S, and in formulae (3-5) and (3-6) is NR, O or S when the E group bonded to Y is absent, i.e. the corresponding index p or r=0, or is N when the E group bonded to Y is present, i.e. the corresponding index p or r=1 or 2.

In a preferred embodiment, the compound is a compound of one of the formulae (3-1) to (3-6), as specified above, where, when p or r=0, an R group is present in each case in place of the bond to E.

In a further preferred embodiment of the invention, Ar is the same or different at each instance and is an aromatic or heteroaromatic ring system having 6 to 24 aromatic ring atoms, preferably 6 to 18 aromatic ring atoms, and is more preferably an aromatic ring system having 6 to 12 aromatic ring atoms or a heteroaromatic ring system having 6 to 13 aromatic ring atoms, each of which may be substituted by one or more R radicals, but is preferably unsubstituted, where Ar preferably comprises aryl groups or heteroaryl groups having up to 15 aromatic ring atoms. Examples of suitable Ar groups are selected from the group consisting of phenyl, ortho-, meta- or para-biphenyl, terphenyl, especially branched terphenyl, quaterphenyl, especially branched quaterphenyl, 1-, 2-, 3- or 4-fluorenyl, 1-, 2-, 3- or 4-spirobifluorenyl, pyridyl, pyrimidinyl, triazinyl, 1-, 2-, 3- or 4-dibenzofuranyl and 1-, 2-, 3- or 4-dibenzothienyl, each of which may be substituted by one or more R radicals, but are preferably unsubstituted.

In a preferred embodiment of the invention, Ar is selected from the structures of the formulae (Ar-1) to (Ar-21)

Formula (Ar-1)

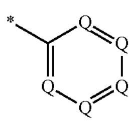

Formula (Ar-2)

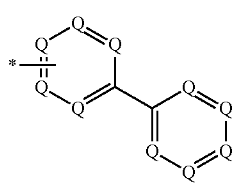

Formula (Ar-3)

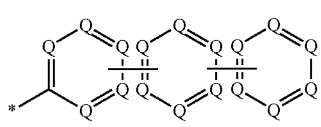

Formula (Ar-4)

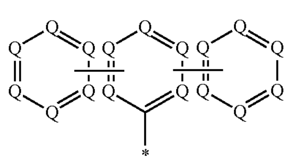

Formula (Ar-5)

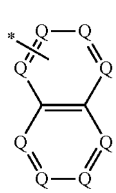

-continued

Formula (Ar-6)

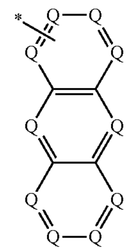

Formula (Ar-7)

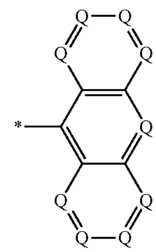

Formula (Ar-8)

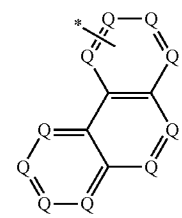

Formula (Ar-9)

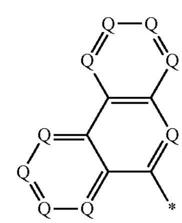

Formula (Ar-10)

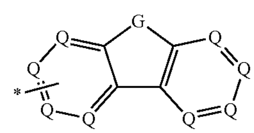

Formula (Ar-11)

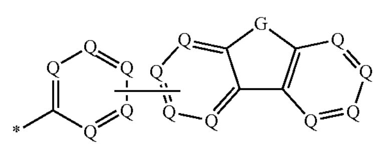

Formula (Ar-12)

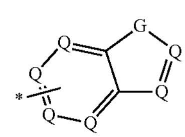

Formula (Ar-13)

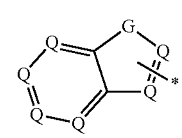

Formula (Ar-14)

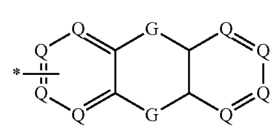

-continued

Formula (Ar-15)

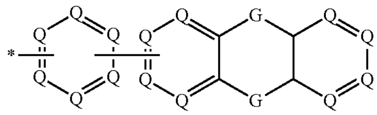

Formula (Ar-16)

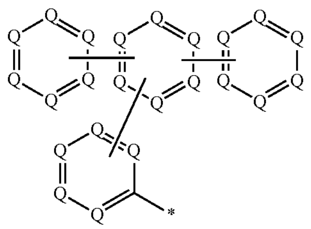

Formula (Ar-17)

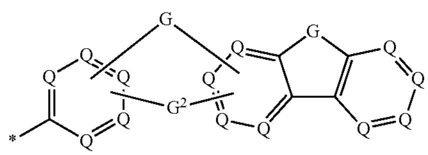

Formula (Ar-18)

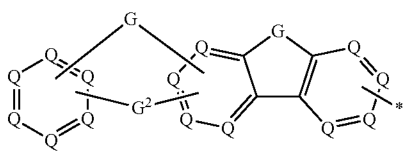

Formula (Ar-19)

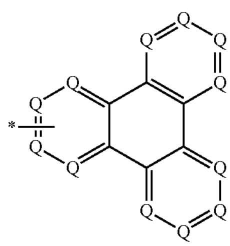

Formula (Ar-20)

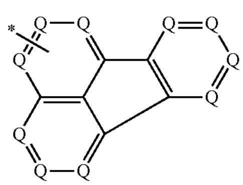

Formula (Ar-21)

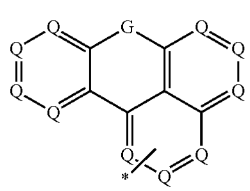

where the symbols correspond to the symbols of the formula (1), * represents the bond to the nitrogen atom, and in addition:

Q is the same or different at each instance and is CR or N, where not more than 3 Q symbols per cycle are N;

$G^2$ at each instance is a single bond, NR, $(CR)_2$, O, S or C═O.

In a further preferred embodiment, the Ar group at each instance is selected from the groups having the structures of formulae (Ar-1) to (Ar-21), where the general formulae are replaced by the respective particularly preferred embodiments of the following formulae (Ar-1-1) to (Ar-16-6) (for example, formula (Ar-1) is replaced by one of the formulae (Ar-1-1) to (Ar-1-9)):

Formula (Ar-1-1)

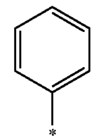

Formula (Ar-1-2)

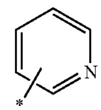

Formula (Ar-1-3)

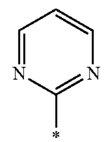

Formula (Ar-1-4)

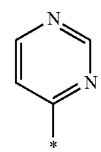

Formula (Ar-1-4)

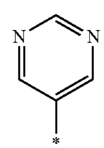

Formula (Ar-1-5)

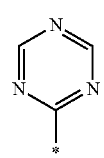

Formula (Ar-2-1)

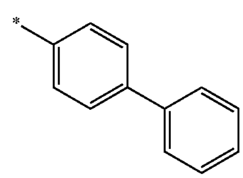

Formula (Ar-2-2)

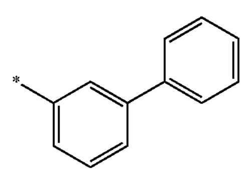

Formula (Ar-2-3)

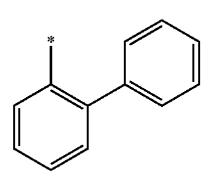

-continued
Formula (Ar-3-1)
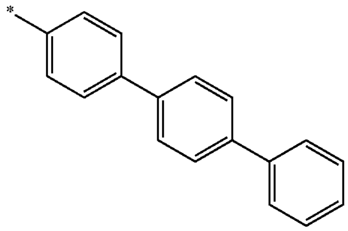
Formula (Ar-3-2)
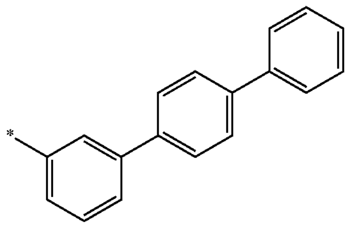
Formula (Ar-3-3)
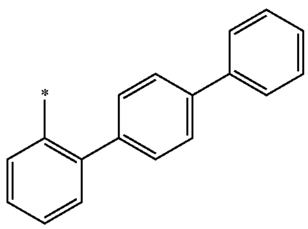
Formula (Ar-3-4)
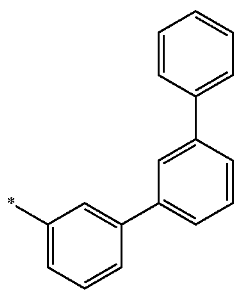
Formula (Ar-3-5)
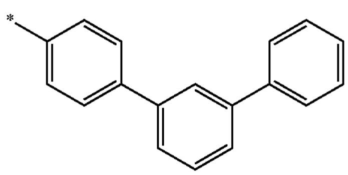
Formula (Ar-3-6)
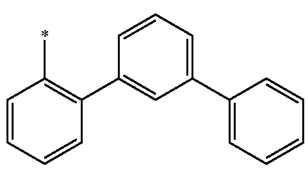
Formula (Ar-3-7)
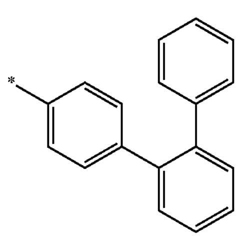
-continued
Formula (Ar-3-8)
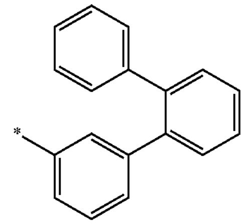
Formula (Ar-3-9)
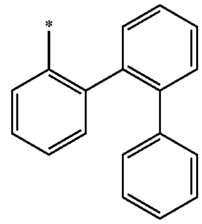
Formula (Ar-4-1)
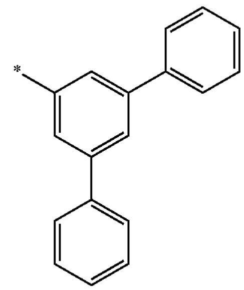
Formula (Ar-4-2
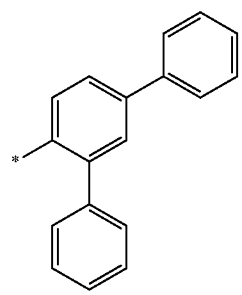
Formula (Ar-4-3)
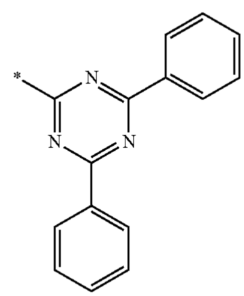
Formula (Ar-4-4)
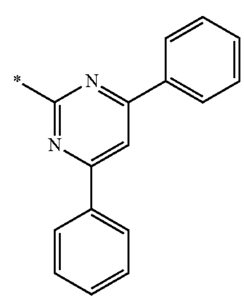

-continued
Formula (Ar-5-1)
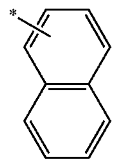
Formula (Ar-5-2)
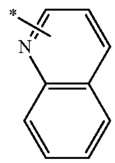
Formula (Ar-5-3)
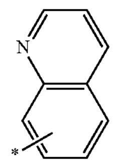
Formula (Ar-5-4)
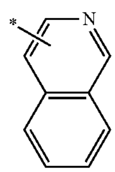
Formula (Ar-5-5)
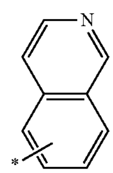
Formula (Ar-5-6)
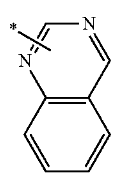
Formula (Ar-5-7)
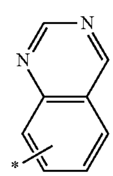
Formula (Ar-5-8)
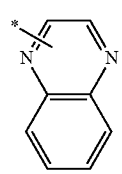
Formula (Ar-5-9)
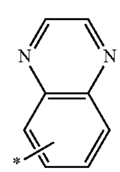
-continued
Formula (Ar-8-1)
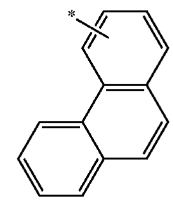
Formula (Ar-10-1)
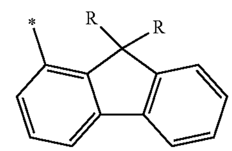
Formula (Ar-10-2)
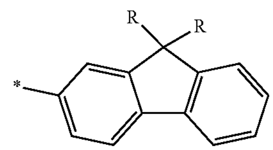
Formula (Ar-10-3)
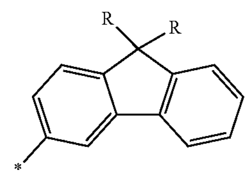
Formula (Ar-10-4)
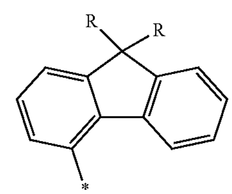
Formula (Ar-10-5)
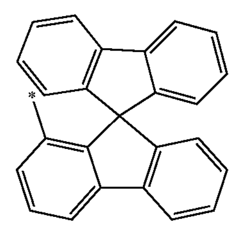
Formula (Ar-10-6)
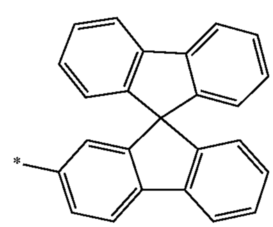
Formula (Ar-10-7)
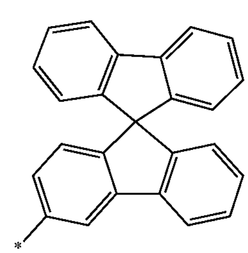

-continued
Formula (Ar-10-8)
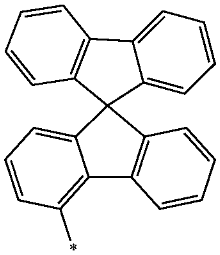
Formula (Ar-10-9)
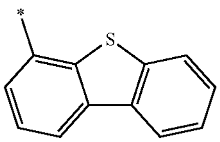
Formula (Ar-10-10)
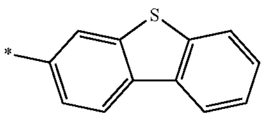
Formula (Ar-10-11)
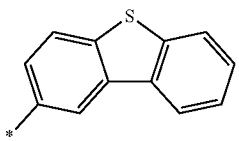
Formula (Ar-10-12)
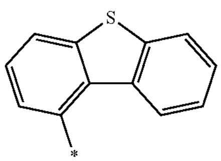
Formula (Ar-10-13)
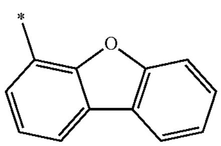
Formula (Ar-10-14)
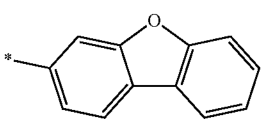
Formula (Ar-10-15)
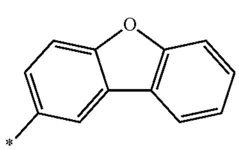
Formula (Ar-10-16)
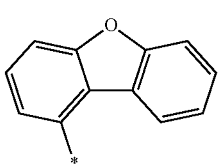
Formula (Ar-10-17)
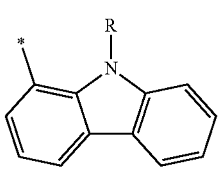
-continued
Formula (Ar-10-18)
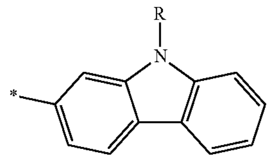
Formula (Ar-10-19)
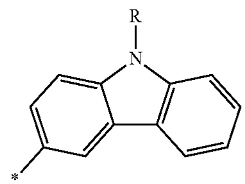
Formula (10-20)
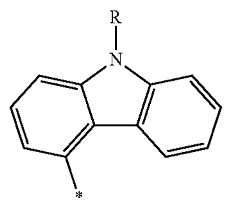
Formula (Ar-11-1)
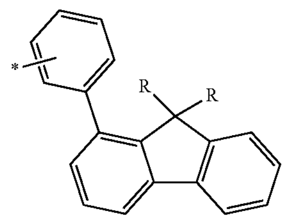
Formula (Ar-11-2)
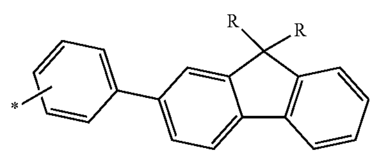
Formula (Ar-11-3)
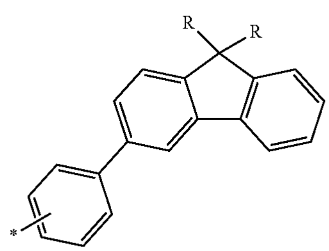
Formula (Ar-11-4)
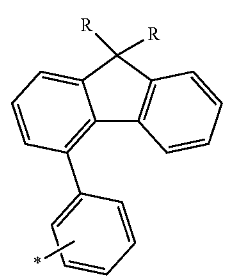

-continued
Formula (Ar-11-5)
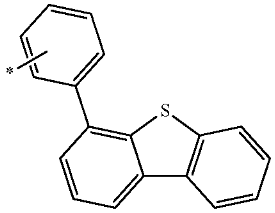
Formula (Ar-11-6)
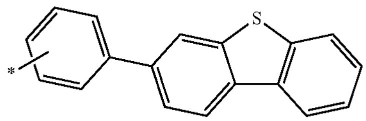
Formula (Ar-11-7)
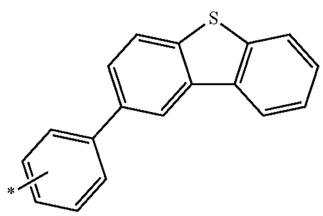
Formula (Ar-11-8)
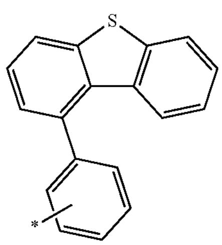
Formula (Ar-11-9)
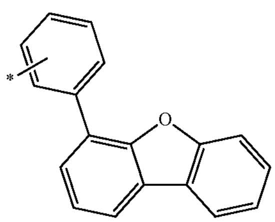
Formula (Ar-11-10)
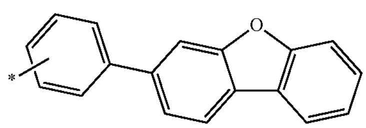
Formula (Ar-11-11)
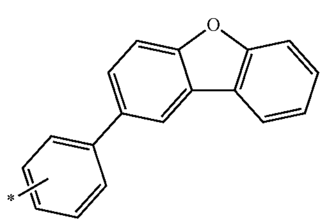
Formula (Ar-11-12)
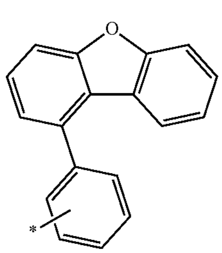
-continued
Formula (Ar-11-13)
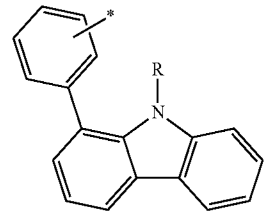
Formula (Ar-11-14)
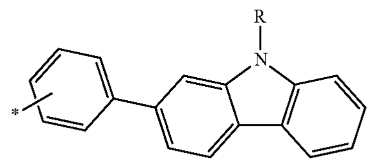
Formula (Ar-11-15)
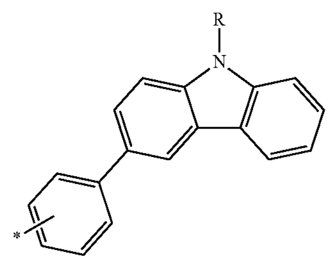
Formula (Ar-11-16)
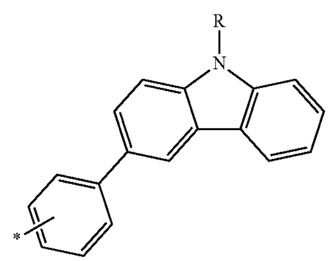
Formula (Ar-12-1)
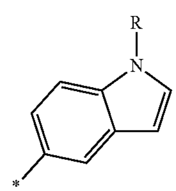
Formula (Ar-13-1)
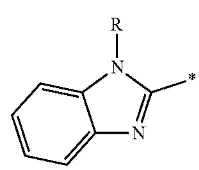
Formula (Ar-14-1)
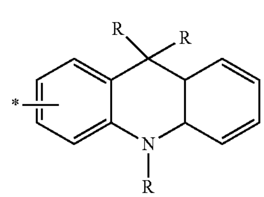
Formula (Ar-14-2)
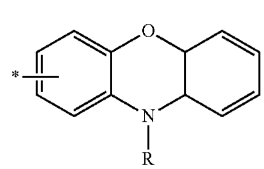

-continued
Formula (Ar-14-3)
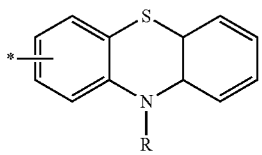
Formula (Ar-14-4)
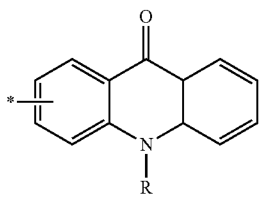
Formula (Ar-15-1)
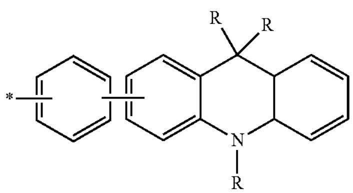
Formula (Ar-15-2)
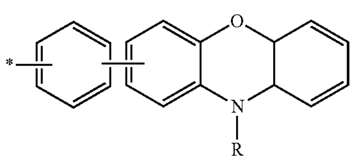
Formula (Ar-15-3)
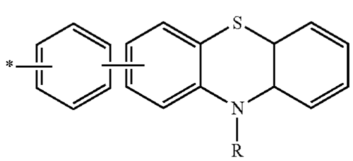
Formula (Ar-15-4)
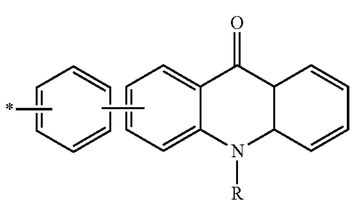
Formula (Ar-16-1)
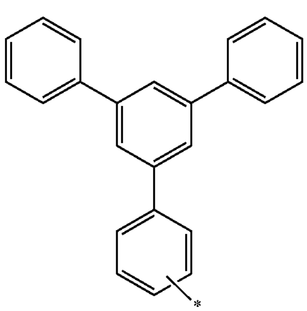
-continued
Formula (Ar-16-2)
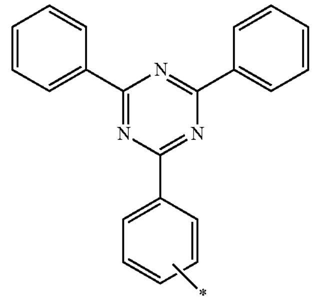
Formula (Ar-16-3)
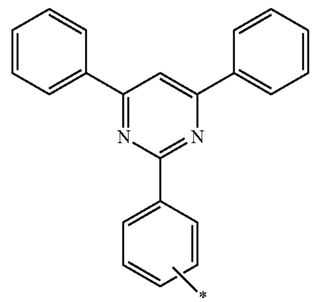
Formula (Ar-16-4)
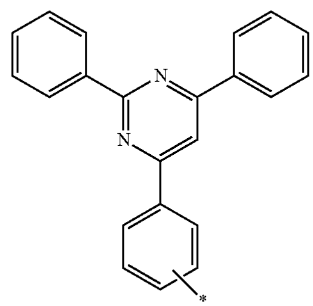
Formula (Ar-16-5)
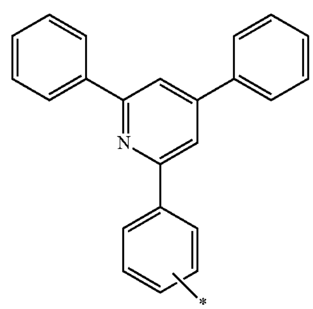
Formula (Ar-16-6)
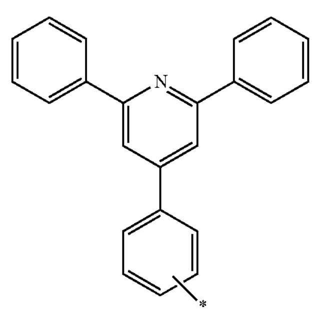

where the symbols correspond to the symbols in formula (Ar-1) to (Ar-21), The formulae may be substituted by R at the unoccupied positions and have corresponding bonds to the E group, if present.
In a further embodiment of the invention, the compound is a compound of the formulae (4-1) to (4-12):
Formula (4-1)
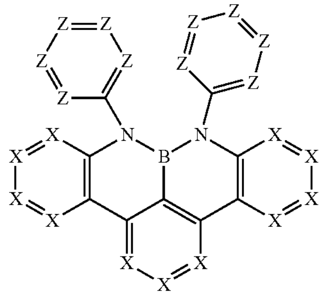
Formula (4-2)
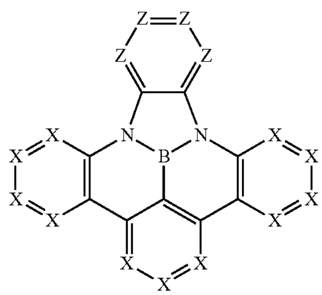
Formula (4-3)
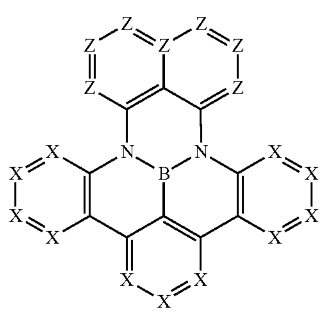
Formula (4-4)
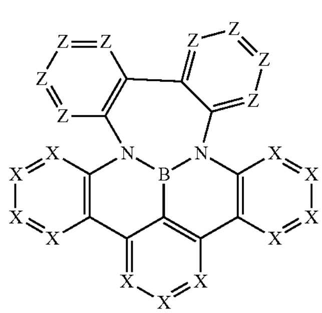
-continued
Formula (4-5)
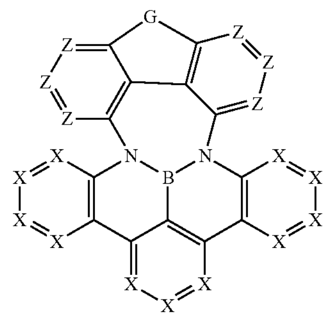
Formula (4-6)
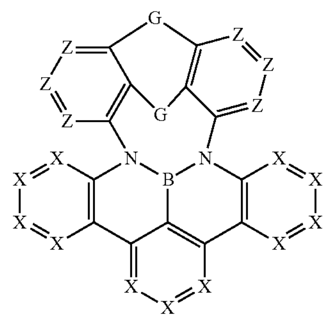
Formula (4-7)
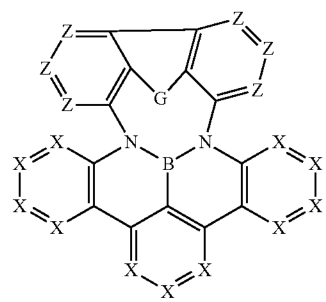
Formula (4-8)
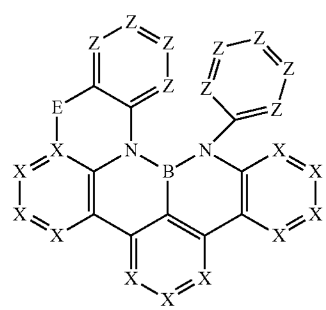
Formula (4-9)
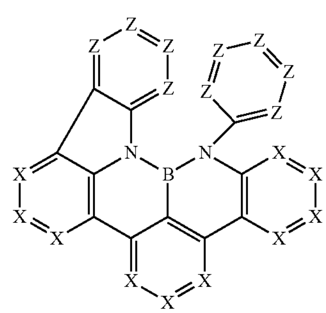

-continued

Formula (4-10)

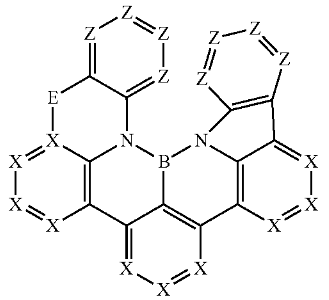

Formula (4-11)

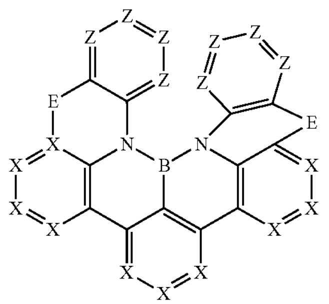

Formula (4-12)

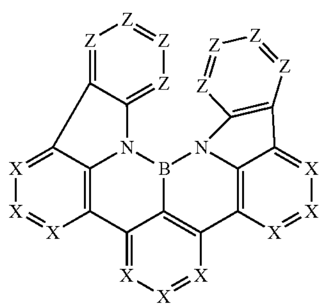

where the symbols correspond to the symbols of the formula (1), and in addition, G is the same or different at each instance and is selected from NR, $CR_2$, O, S and C═O;

X is the same or different at each instance and is CR, N, or exactly two adjacent X groups together are a group selected from NR, O and S, forming a five-membered ring; at the same time, not more than 3 X, preferably not more than 2 X, in one cycle are N;

Z is the same or different at each instance and is CR, N, or exactly two adjacent Z groups together are a group selected from NR, O and S, forming a five-membered ring; at the same time, not more than 3 Z, preferably not more than 2 Z, in one cycle are N.

In a preferred embodiment of the invention, X and Z are as follows:

X is the same or different at each instance and is CR, N, or exactly two adjacent X groups together are a group selected from NR, O and S, forming a five-membered ring; at the same time, not more than 3 X, preferably not more than 2 X, in one cycle are N;

Z is the same or different at each instance and is CR or N, where not more than 3 Z, preferably not more than 2 Z, in one cycle are N.

In a further preferred embodiment of the invention, X and Z are as follows:

X is the same or different at each instance and is CR;

Z is the same or different at each instance and is CR or N, where not more than 3 Z, preferably not more than 2 Z, in one cycle are N.

Particular preference is given to compounds of the formulae (4-1) and (4-8) to (4-12).

In a preferred embodiment, the R groups, when they are not H or D, are bonded in the para position to the nitrogen or to the boron, more preferably in the para position to the nitrogen.

In a further preferred embodiment, the compound is a compound of the formula (5)

Formula (5)

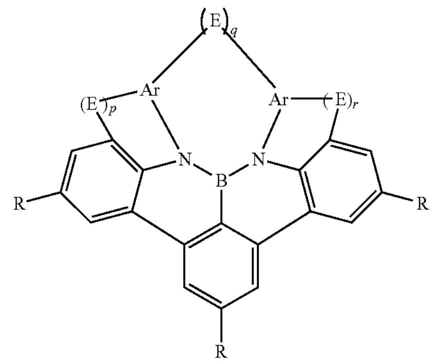

where the symbols and indices correspond to the formula (3-1).

In a preferred embodiment of the invention, q=0, and an Ar group is bonded to each N. More preferably, at the same time, it is also the case that p and r=0.

In a further preferred embodiment, at least one of the indices p, q and/orr=1, and the other indices p, q and r are 0. Particularly preferred embodiments are the following embodiments:

p=r=1 and q=0; or p=1 and q=r=0; or p=r=0 and q=1.

More preferably, the substituents R bonded to Ar, $Ar^1$, $Ar^2$ or $Ar^3$ are the same or different at each instance and are selected from the group consisting of H, D, F, CN, $N(Ar^4)_2$, a straight-chain alkyl group having 1 to 8 carbon atoms, preferably having 1, 2, 3 or 4 carbon atoms, or a branched or cyclic alkyl group having 3 to 8 carbon atoms, preferably having 3, 4, 5 or 6 carbon atoms, or an alkenyl group having 2 to 8 carbon atoms, preferably having 2, 3 or 4 carbon atoms, each of which may be substituted by one or more $R^1$ radicals, but is preferably unsubstituted, or an aromatic or heteroaromatic ring system having 6 to 24 aromatic ring atoms, preferably having 6 to 18 aromatic ring atoms, more preferably having 6 to 13 aromatic ring atoms, each of which may be substituted by one or more $R^1$ radicals, but is preferably unsubstituted; at the same time, it is optionally possible for two substituents R bonded to adjacent carbon atoms to form a monocyclic or polycyclic aliphatic ring system which may be substituted by one or more $R^1$ radicals, but is preferably unsubstituted.

In a further embodiment of the invention, R is the same or different at each instance in the case of an aromatic or heteroaromatic ring system the same or different at each instance and is selected from the structures of the formulae (Ar-1) to (Ar-21), wherein the formulae are substituted not by R but by $R^1$ in each case and * correspondingly denotes the bond to the base skeleton or to E or G.

In a further preferred embodiment, the R group is the same or different at each instance in the case of an aromatic or heteroaromatic ring system at each instance and is selected from the groups having the structures of formulae (Ar-1) to (Ar-21), where the general formulae are replaced by the respective particularly preferred embodiments of the following formulae (Ar-1-1) to (Ar-16-6) (for example, formula (Ar-1) is replaced by one of the formulae (Ar-1-1) to (Ar-1-9)). As stated above, all R are replaced here by $R^1$.

More preferably, the substituents $R^1$ are the same or different at each instance and are selected from the group consisting of H, D, F, CN, $N(R^2)_2$, a straight-chain alkyl group having 1 to 8 carbon atoms, preferably having 1, 2, 3 or 4 carbon atoms, or a branched or cyclic alkyl group having 3 to 8 carbon atoms, preferably having 3, 4, 5 or 6 carbon atoms, or an alkenyl group having 2 to 8 carbon atoms, preferably having 2, 3 or 4 carbon atoms, each of which may be substituted by one or more $R^2$ radicals, but is preferably unsubstituted, or an aromatic or heteroaromatic ring system having 6 to 24 aromatic ring atoms, preferably having 6 to 18 aromatic ring atoms, more preferably having 6 to 13 aromatic ring atoms, each of which may be substituted by one or more $R^2$ radicals, but is preferably unsubstituted; at the same time, it is optionally possible for two substituents $R^1$ bonded to the same carbon atom or to adjacent carbon atoms to form a monocyclic or polycyclic aliphatic ring system which may be substituted by one or more $R^2$ radicals, but is preferably unsubstituted.

In a further embodiment of the invention, $R^1$ is the same or different at each instance in the case of an aromatic or heteroaromatic ring system the same or different at each instance and is selected from the structures of the formulae (Ar-1) to (Ar-21), wherein the formulae are substituted not by R but by $R^2$ in each case and * correspondingly denotes the bond to R, where the bond to R, rather than as specified, may also be via G or $G^2$ when the latter are NR, in which case R is substituted by bonding to R.

In a further preferred embodiment, the $R^1$ group is the same or different at each instance in the case of an aromatic or heteroaromatic ring system at each instance and is selected from the groups having the structures of formulae (Ar-1) to (Ar-21), where the general formulae are replaced by the respective particularly preferred embodiments of the following formulae (Ar-1-1) to (Ar-16-6) (for example, formula (Ar-1) is replaced by one of the formulae (Ar-1-1) to (Ar-1-9)). As stated above, all R are replaced here by $R^2$.

When E or G or $G^2$ is $CR_2$, it is preferable when the R radicals bonded to this carbon atom are the same or different at each instance and are a straight-chain alkyl group having 1 to 8 carbon atoms, preferably having 1, 2, 3 or 4 carbon atoms, or a branched or cyclic alkyl group having 3 to 8 carbon atoms, preferably having 3, 4, 5 or 6 carbon atoms, or an alkenyl group having 2 to 8 carbon atoms, preferably having 2, 3 or 4 carbon atoms, each of which may be substituted by one or more $R^1$ radicals, where one or more nonadjacent $CH_2$ groups may be replaced by O and where one or more hydrogen atoms may be replaced by D or F, or an aromatic or heteroaromatic ring system having 6 to 24 aromatic ring atoms, preferably having 6 to 18 aromatic ring atoms, more preferably having 6 to 13 aromatic ring atoms, each of which may be substituted by one or more $R^1$ radicals; at the same time, it is optionally possible for the two R substituents to form a monocyclic or polycyclic aliphatic, aromatic or heteroaromatic ring system which may be substituted by one or more $R^1$ radicals. Ring formation between the two substituents R forms a spiro system, for example a spirobifluorene or a derivative of a spirobifluorene, when the R groups are phenyl groups.

When E or G or $G^2$ is NR, it is preferable when the R radical bonded to this nitrogen atom is the same or different at each instance and is an aromatic or heteroaromatic ring system which has 5 to 24 aromatic ring atoms and may be substituted in each case by one or more $R^1$ radicals, more preferably an aromatic or heteroaromatic ring system which has 6 to 18 aromatic ring atoms, preferably 6 to 13 aromatic ring atoms, and may be substituted by one or more $R^1$ radicals. Examples of suitable substituents R are selected from the group consisting of phenyl, ortho-, meta- or para-biphenyl, terphenyl, especially branched terphenyl, quaterphenyl, especially branched quaterphenyl, 1-, 2-, 3- or 4-fluorenyl, 1-, 2-, 3- or 4-spirobifluorenyl, pyridyl, pyrimidinyl, 1,3,5-triazinyl, 4,6-diphenyl-1,3,5-triazinyl, 1-, 2-, 3- or 4-dibenzofuranyl, 1-, 2-, 3- or 4-dibenzothienyl and 1-, 2-, 3- or 4-carbazolyl, where the carbazolyl group is substituted on the nitrogen atom by an $R^1$ radical other than H or D. These groups may each be substituted by one or more $R^1$ radicals, but are preferably unsubstituted.

The abovementioned preferences can occur individually or together. It is preferable when the abovementioned preferences occur together.

Examples of suitable compounds of the invention are the structures shown below.

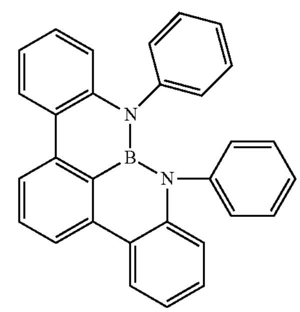

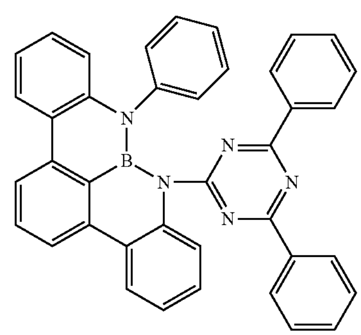

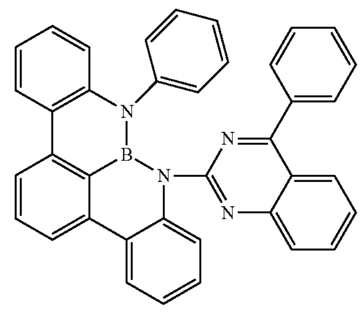

-continued
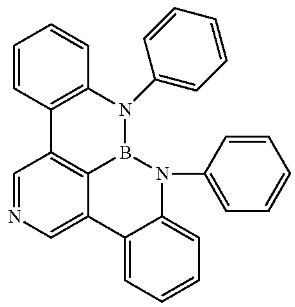
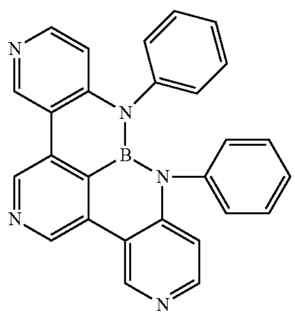
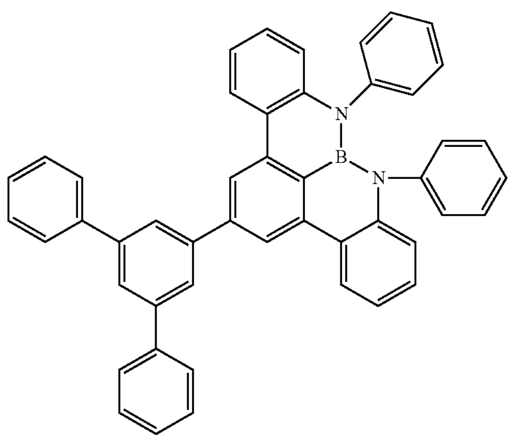
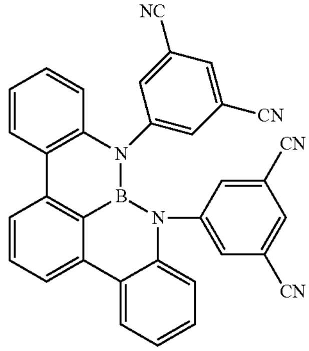
-continued
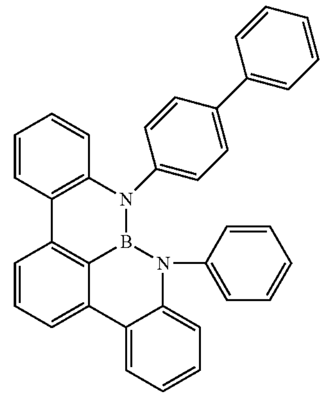
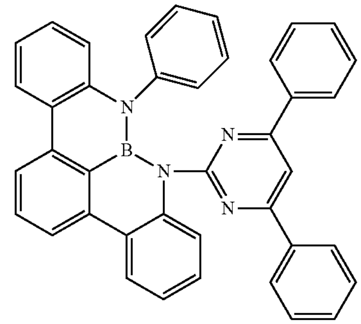
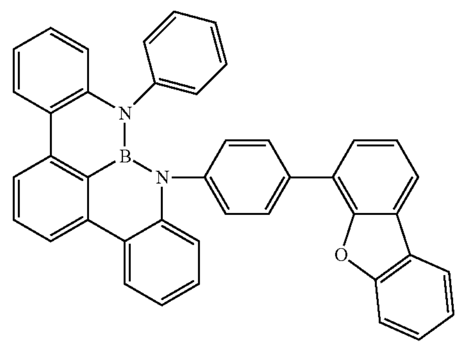
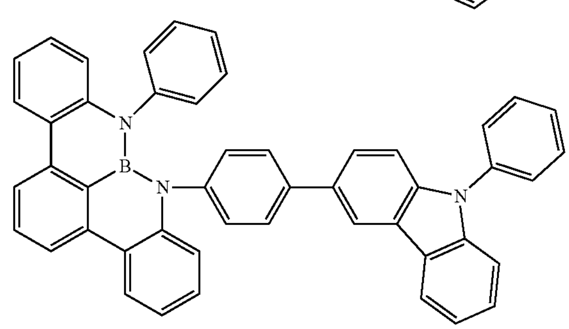
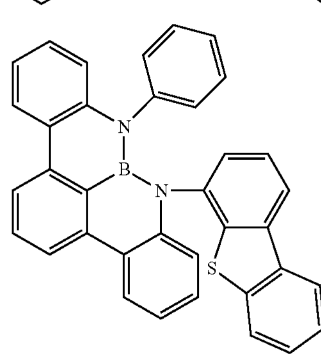

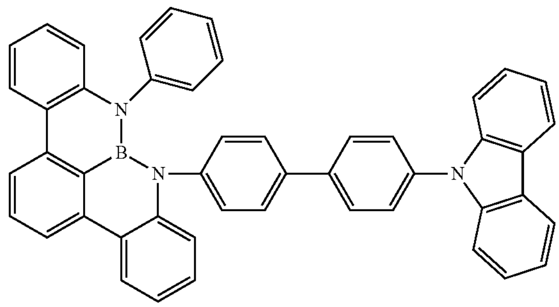
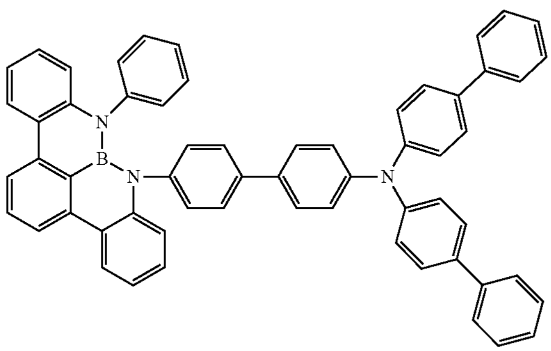
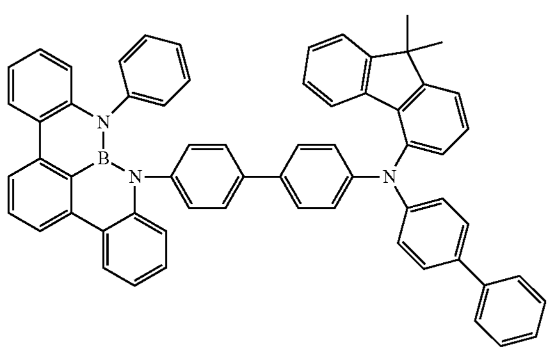
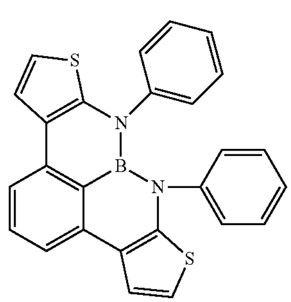
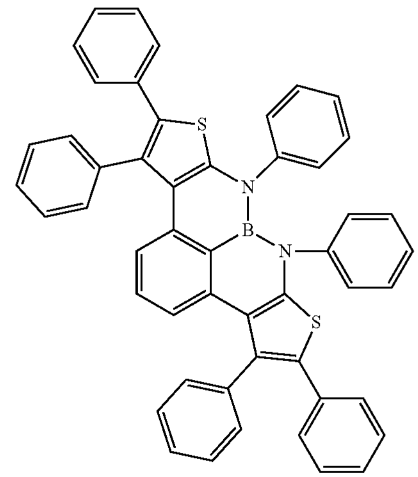
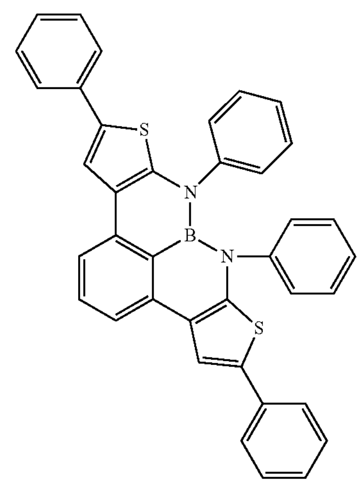
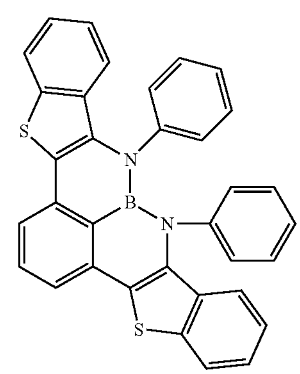

-continued
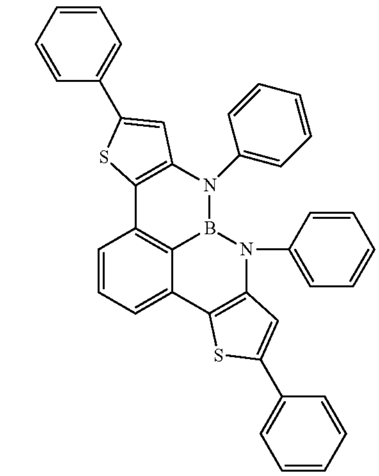
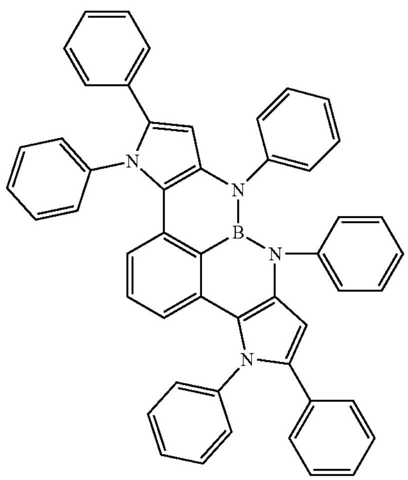
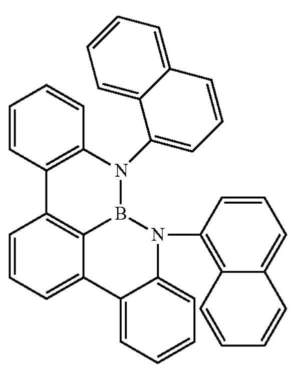
-continued
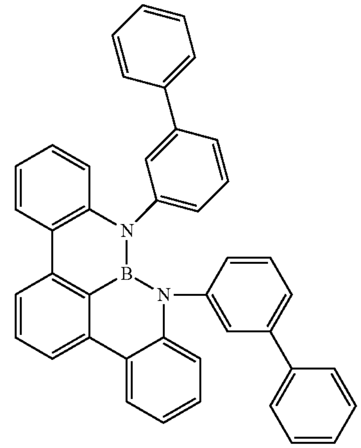
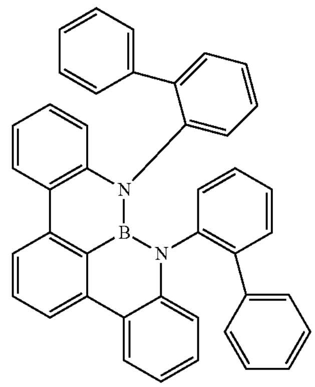
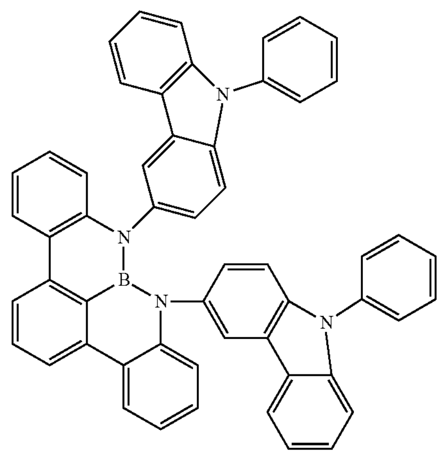
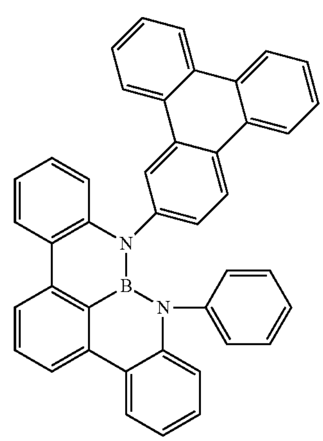

-continued
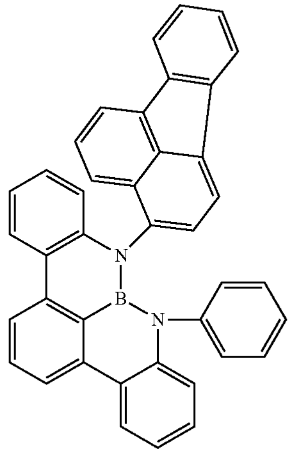
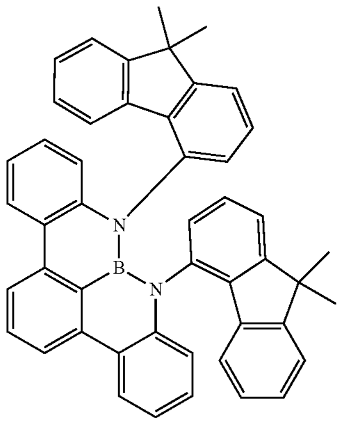
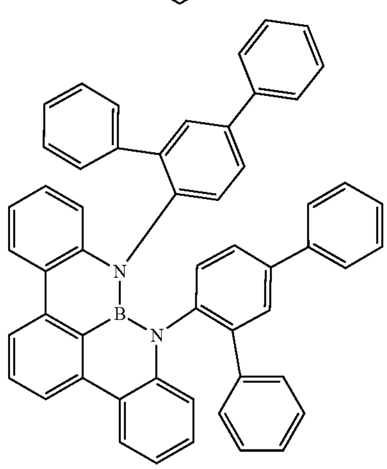
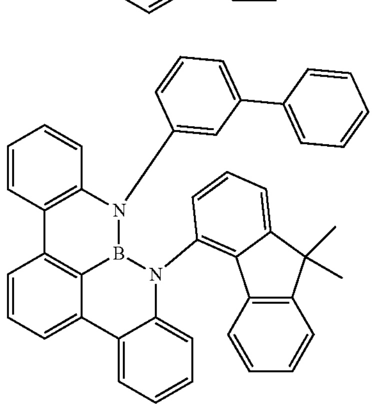
-continued
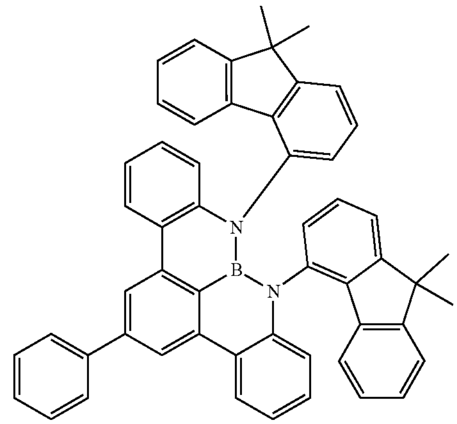
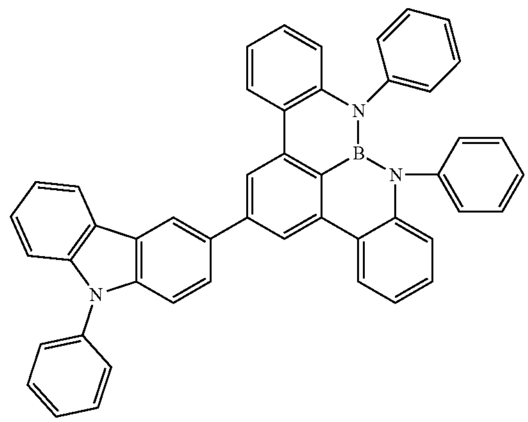
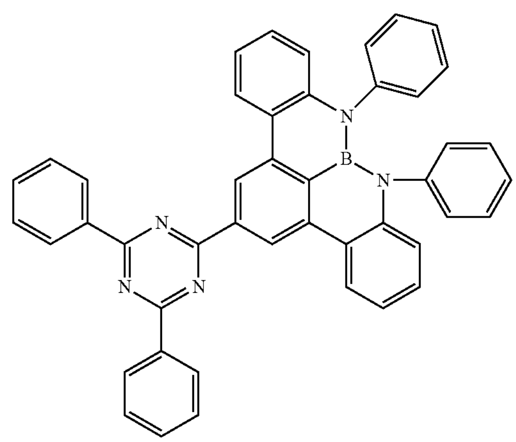
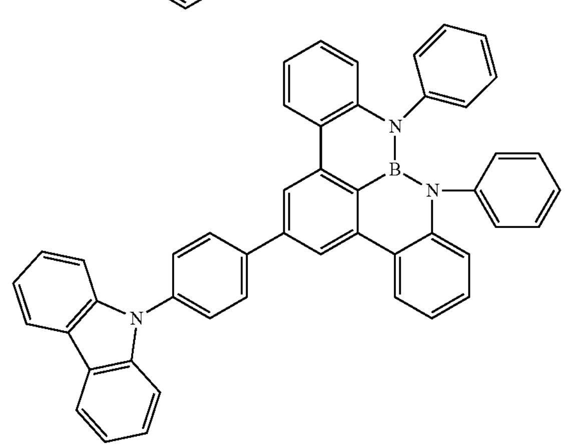

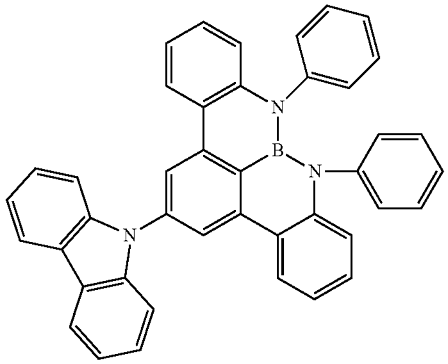
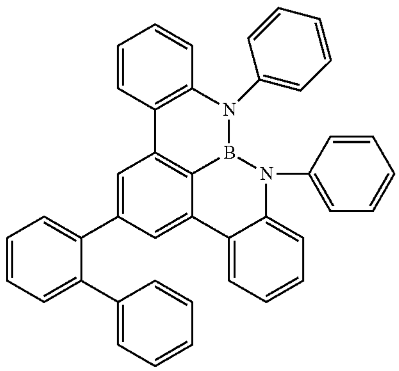
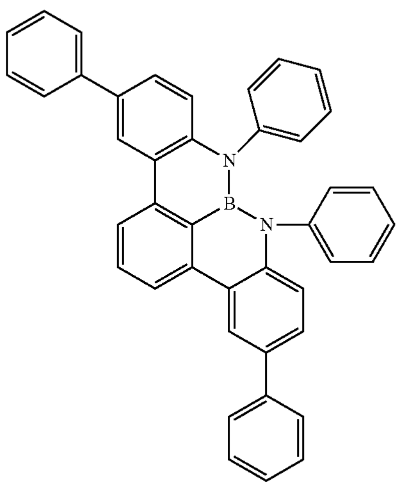
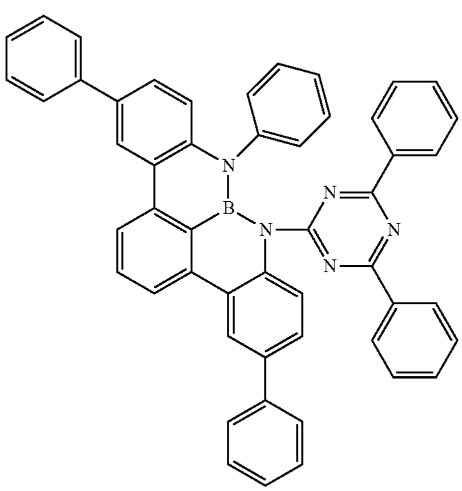
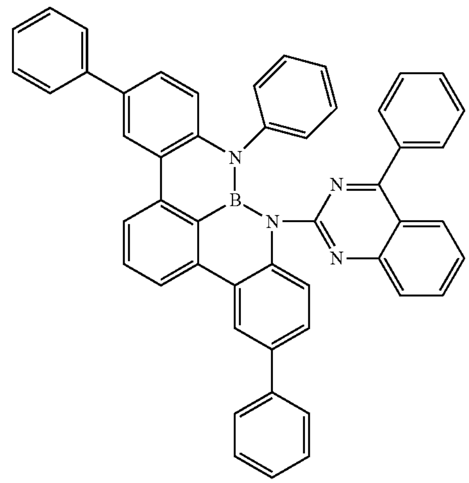
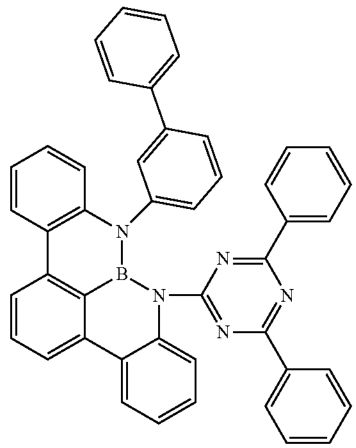
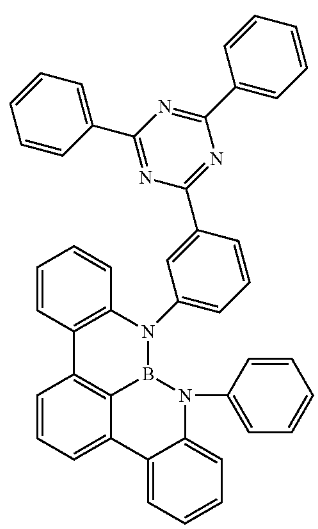

-continued
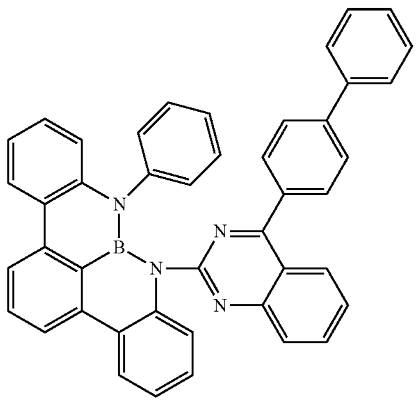
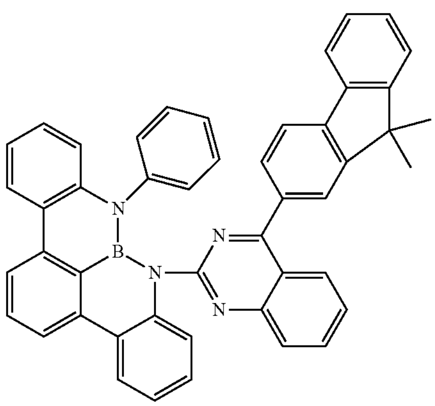
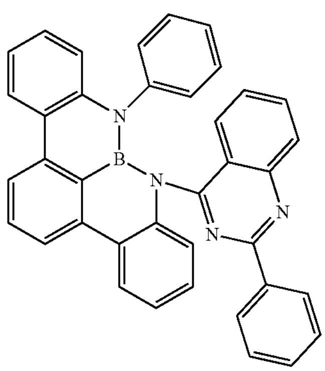
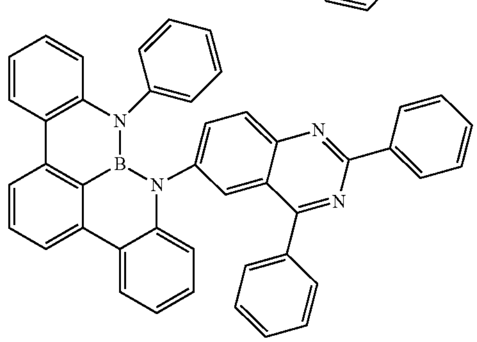
-continued
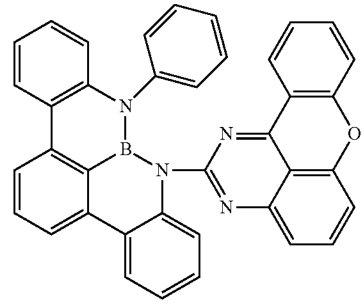
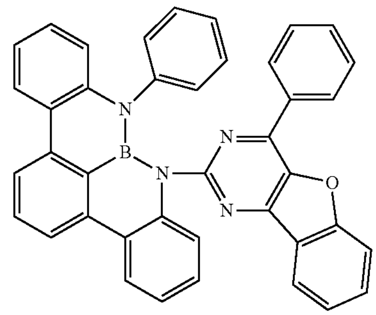
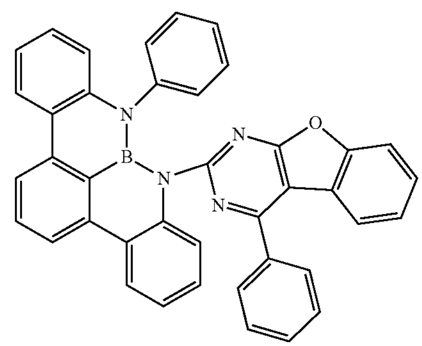
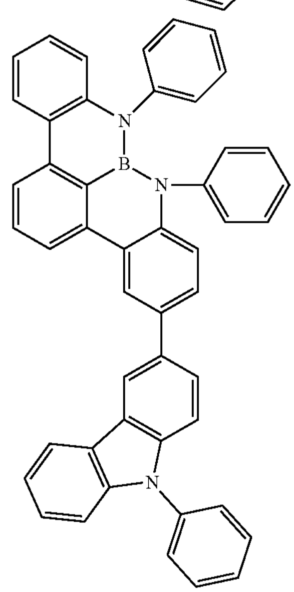

-continued
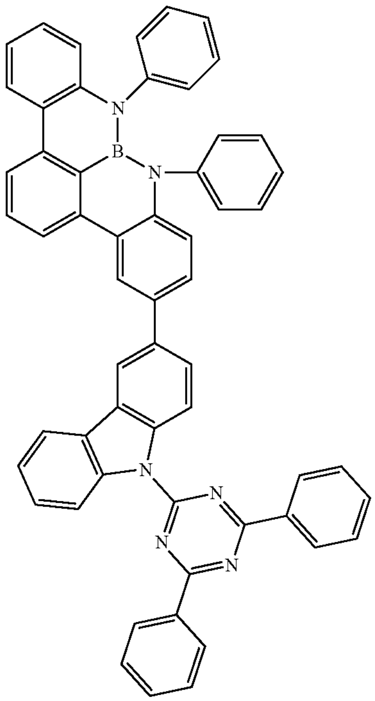
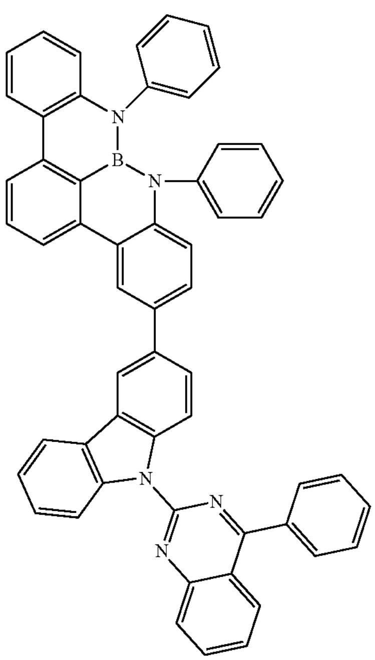
-continued
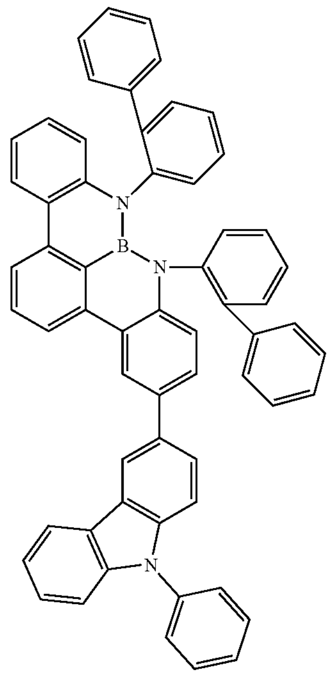
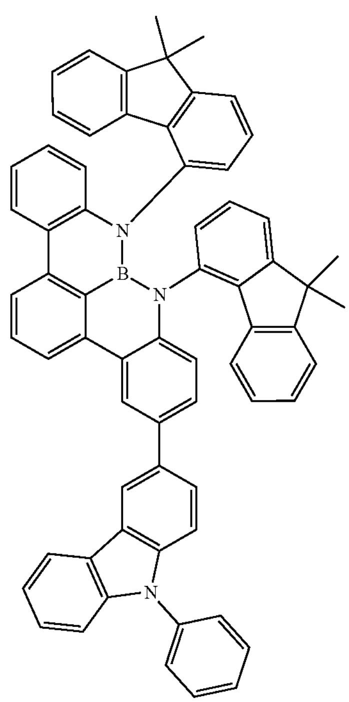

-continued
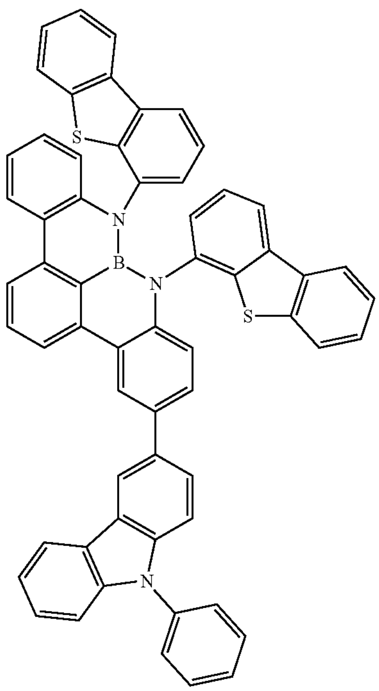
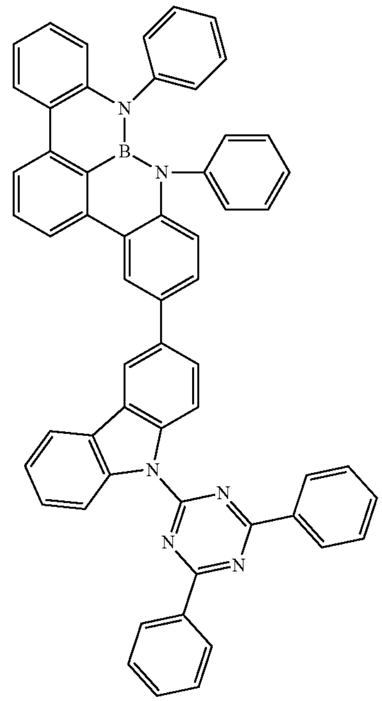
-continued
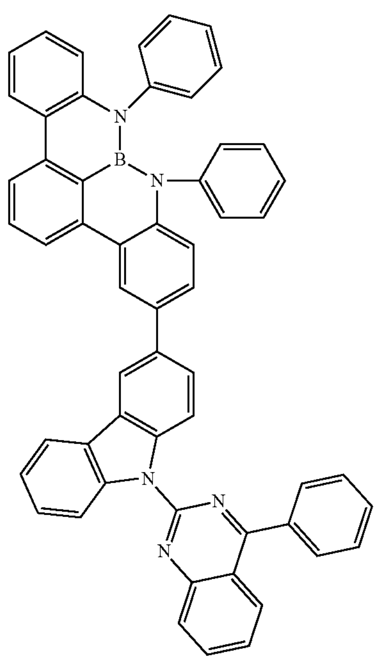
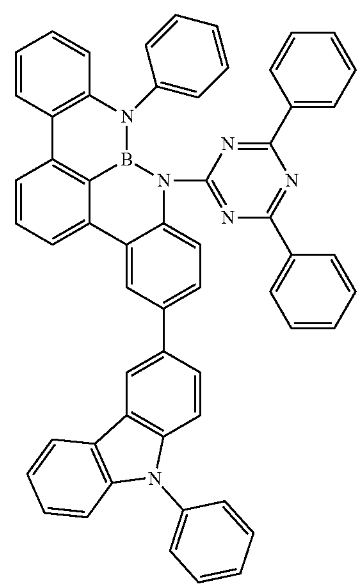

-continued
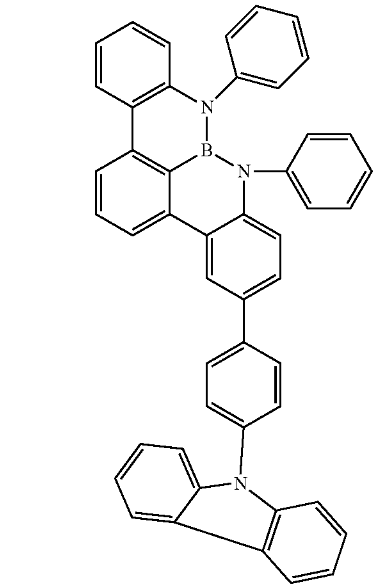
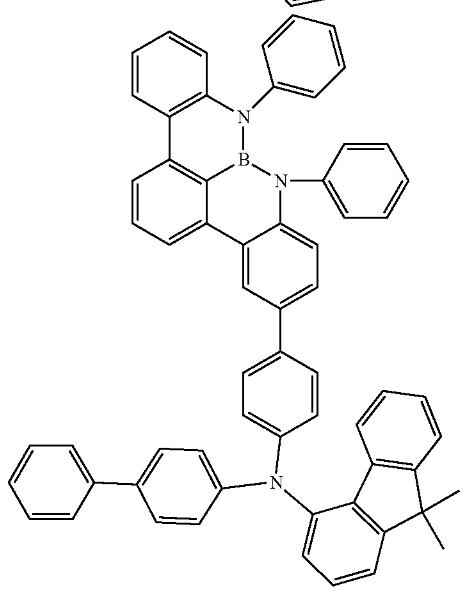
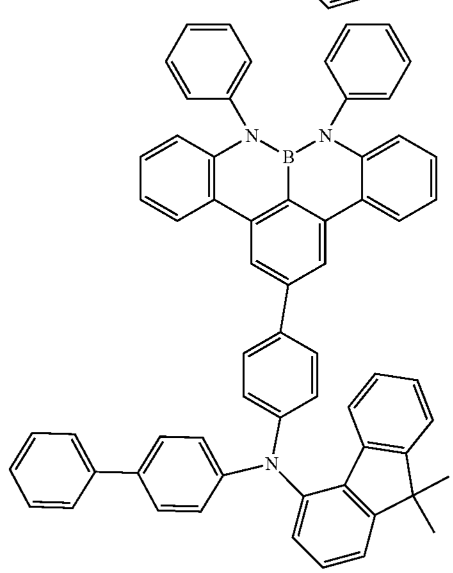
-continued
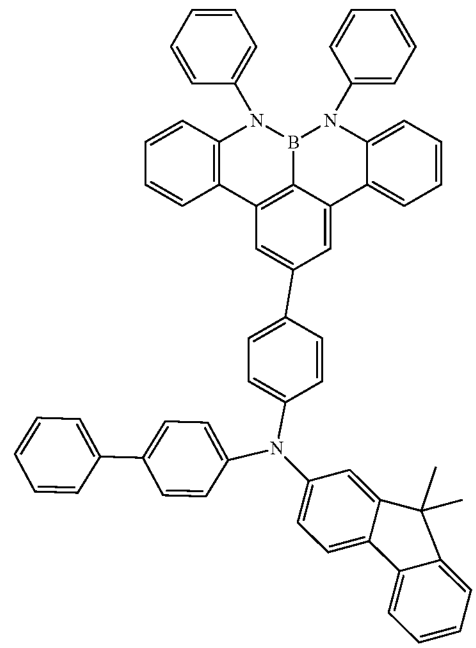
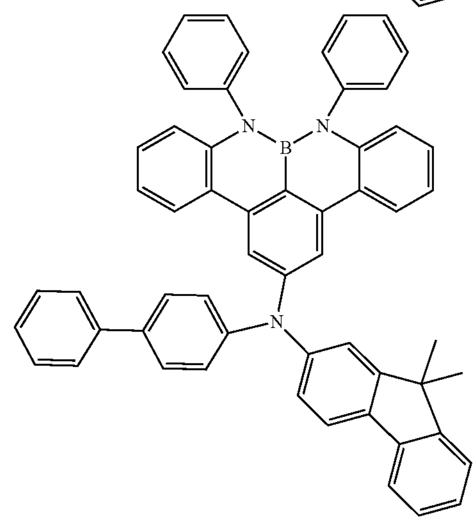
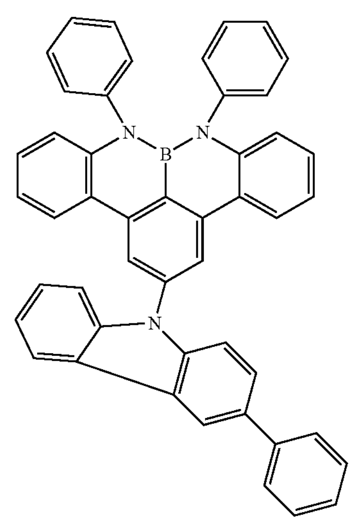

-continued
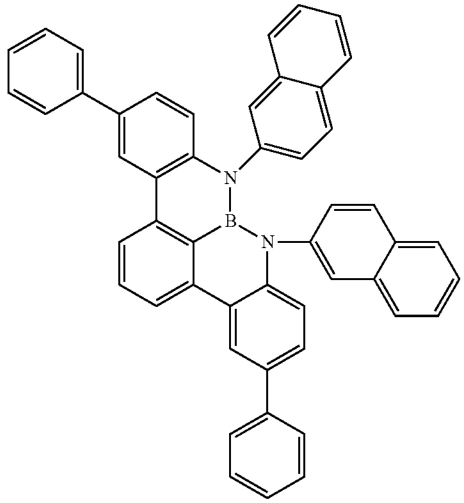
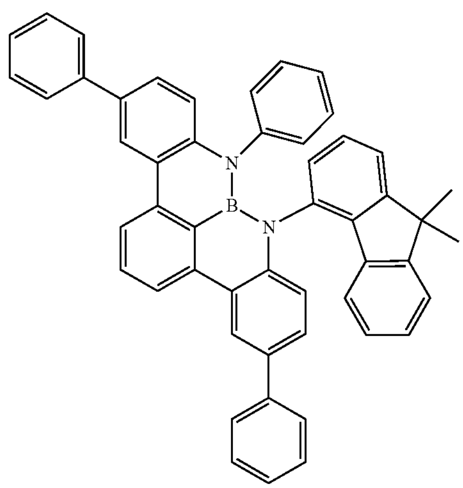
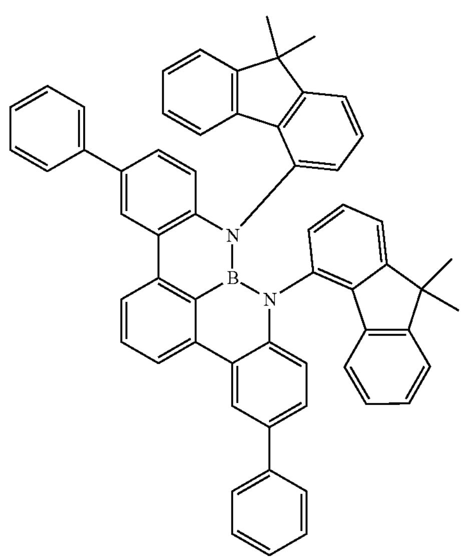
-continued
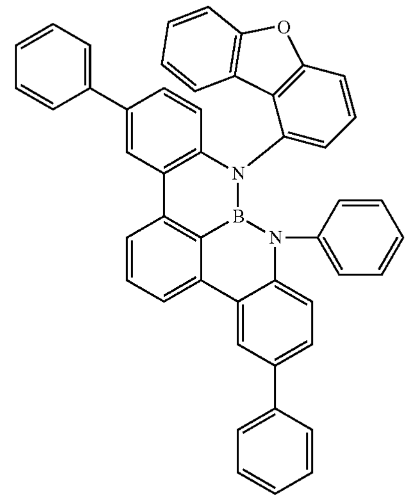
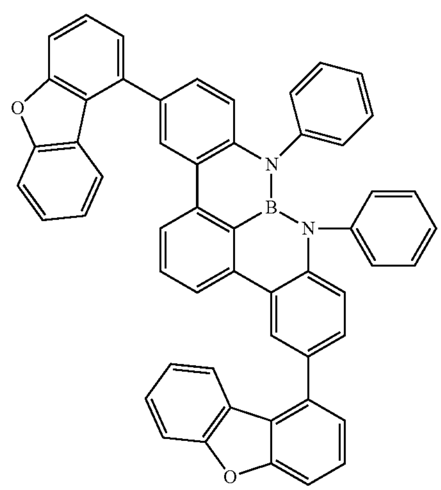
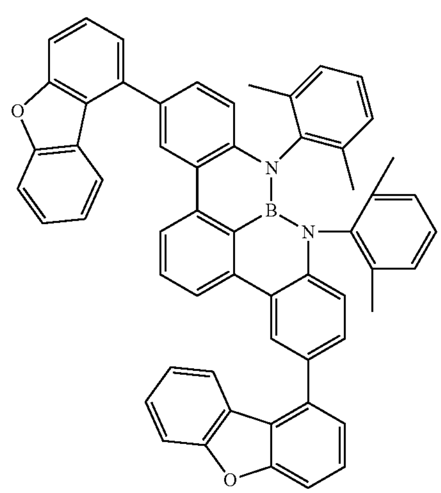

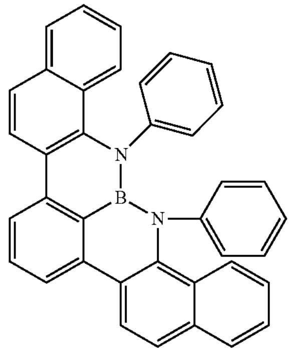
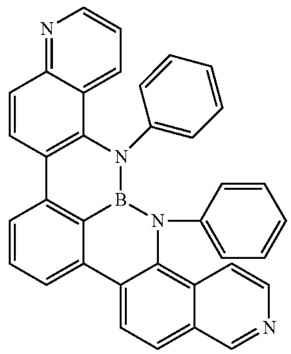
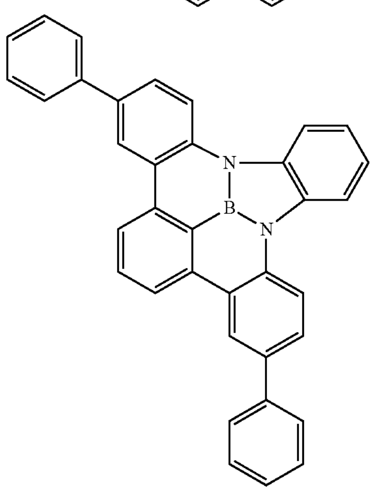
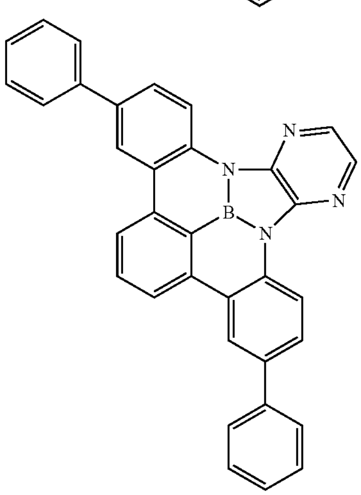
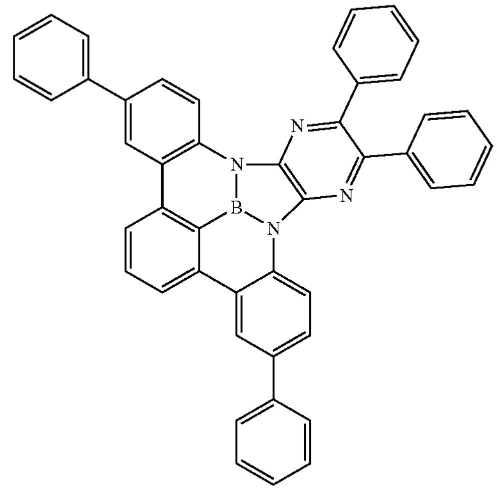
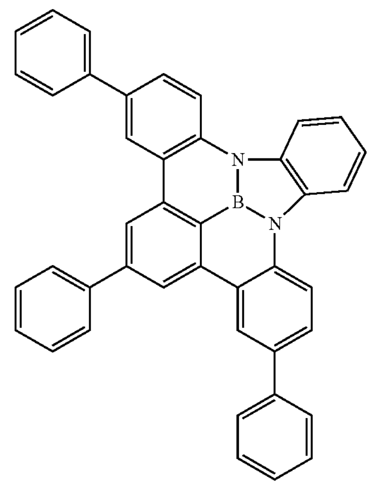
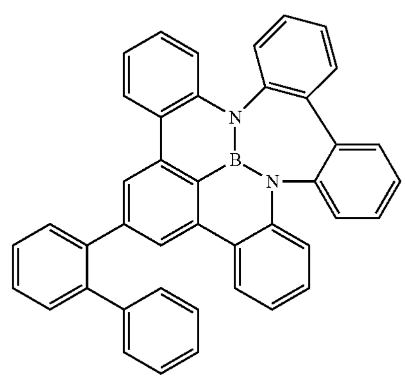
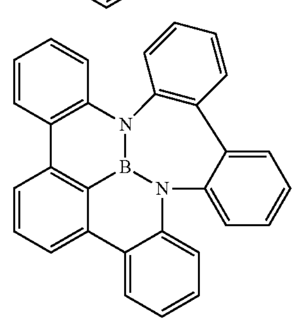

-continued
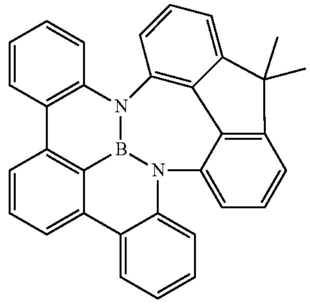
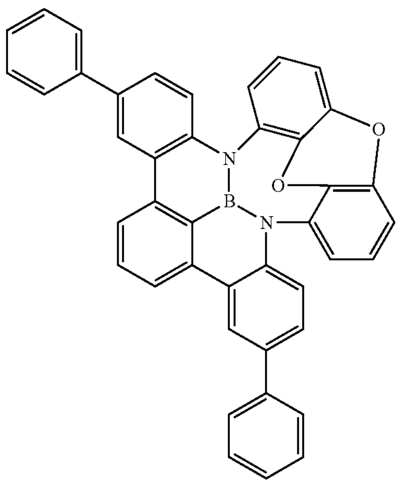
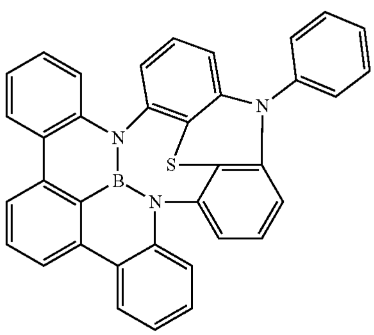
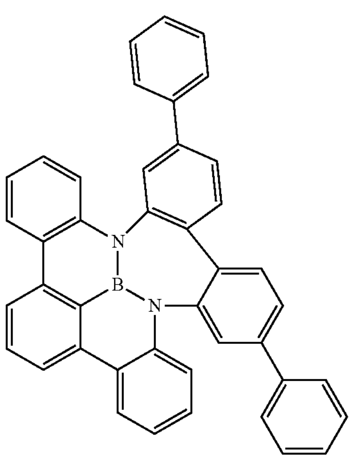
-continued
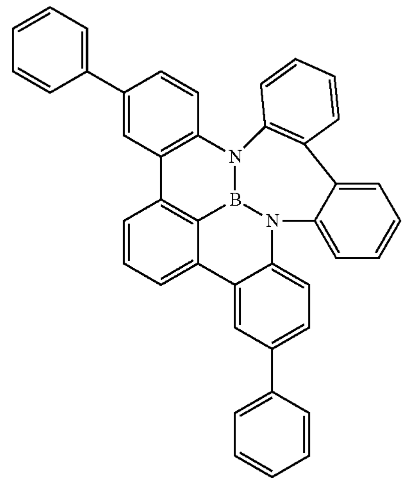
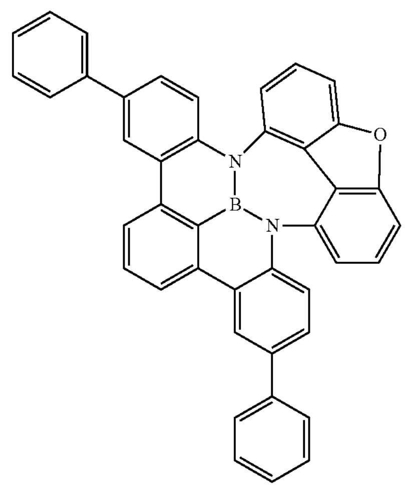
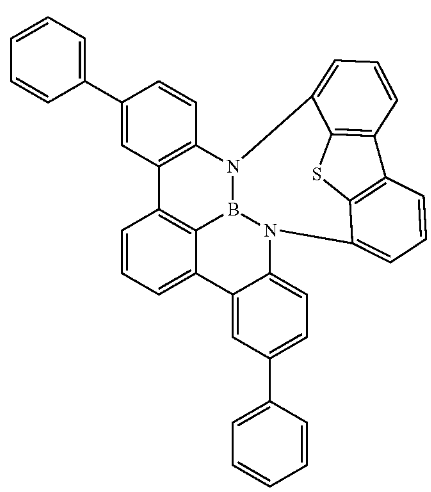

-continued
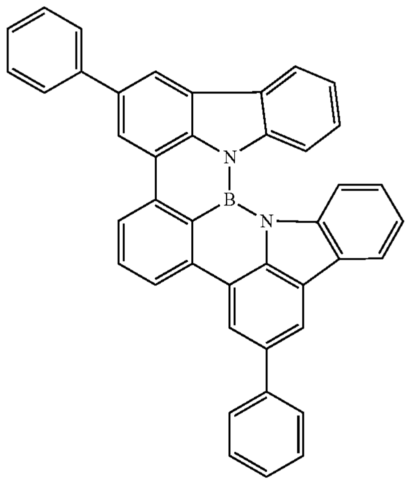
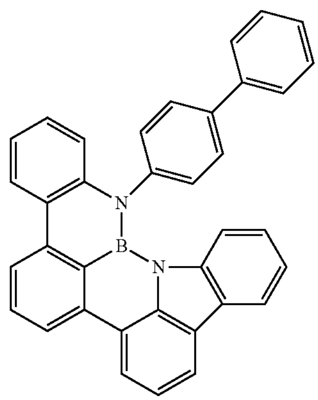
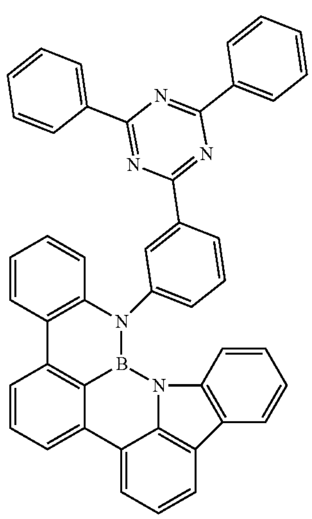
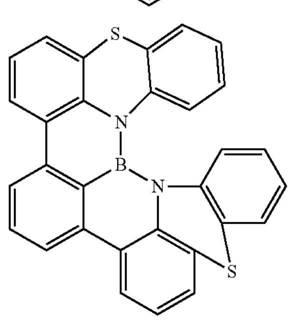
-continued
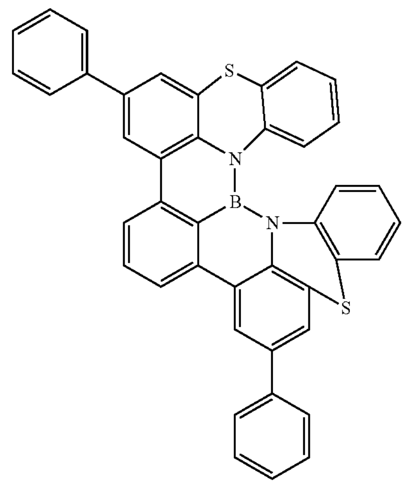
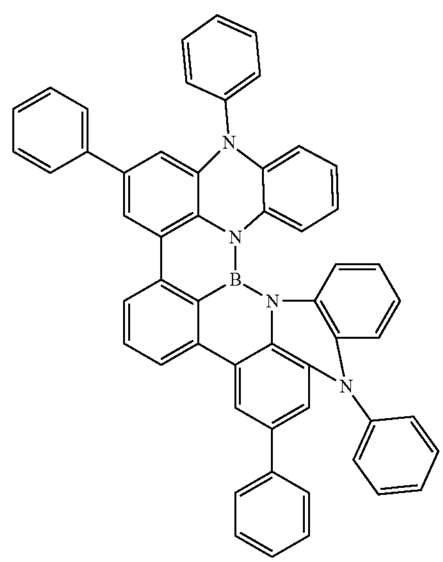
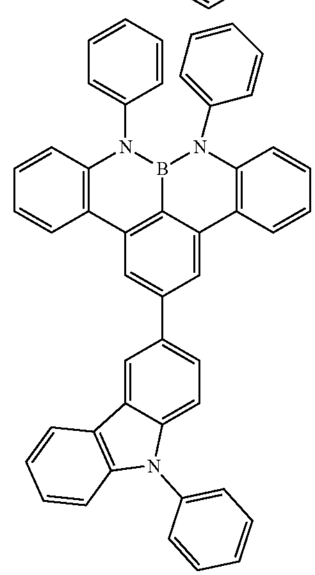

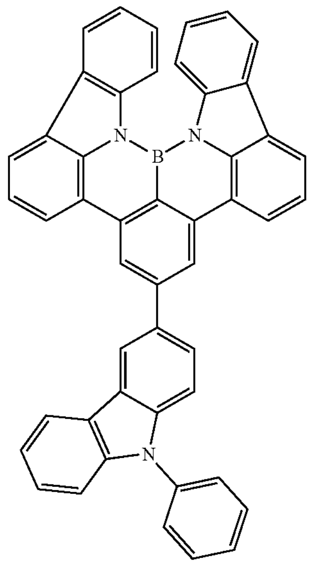
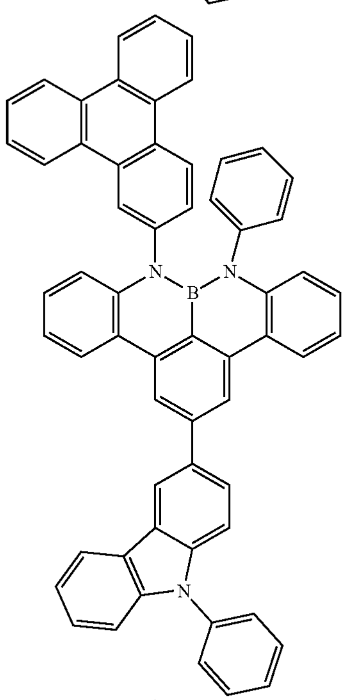
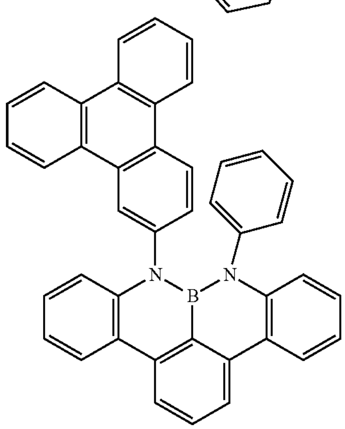
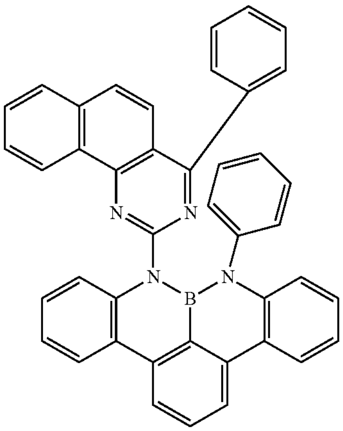
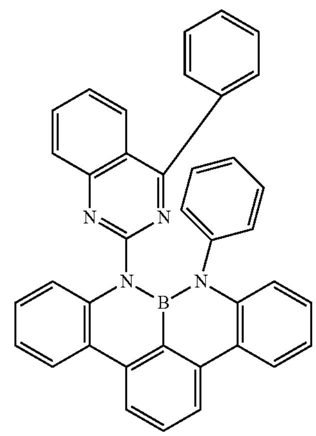 [SMILES: c1ccc(-c2nc(N3B4c5c(cccc5-c5ccccc53)-c3ccccc3N4c3ccccc3)nc3ccccc23)cc1]
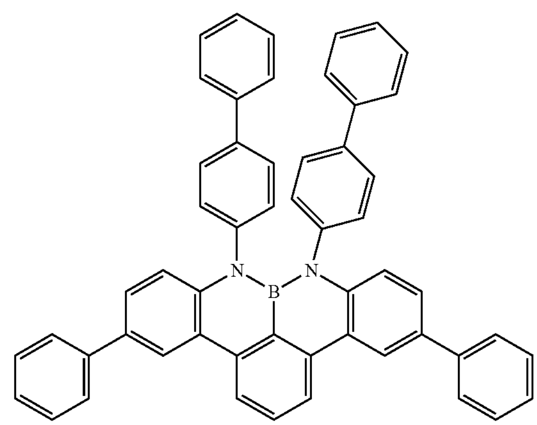
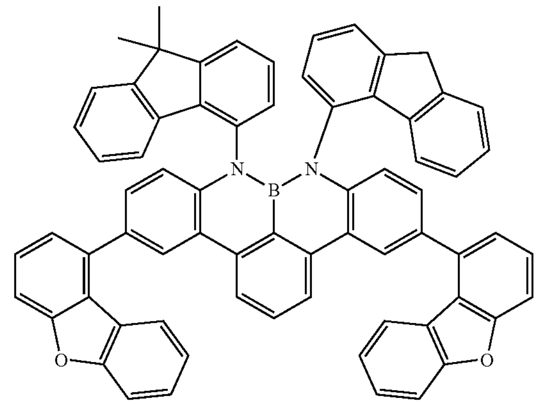

-continued
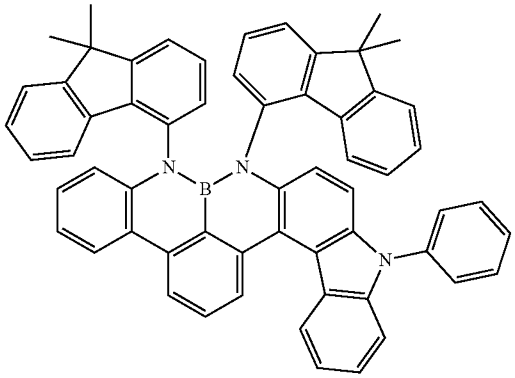
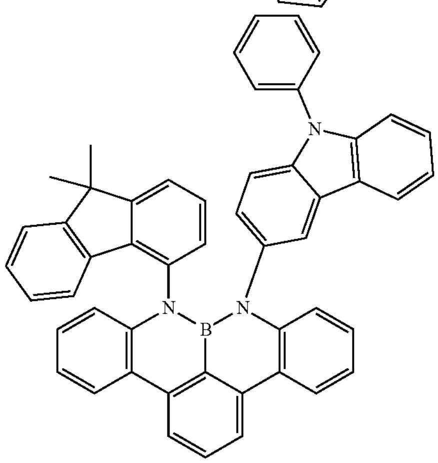
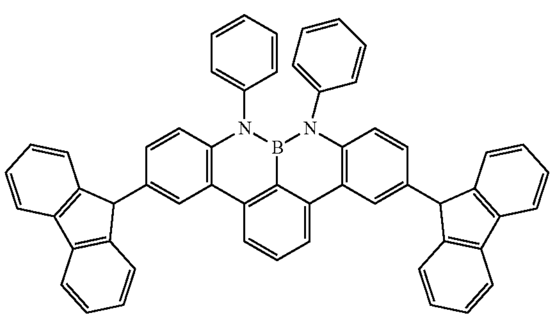
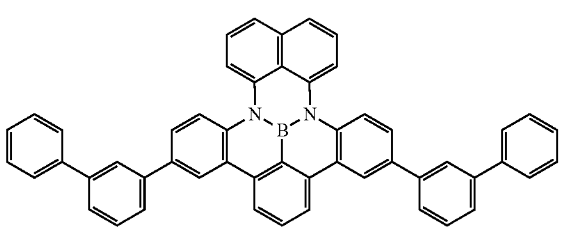
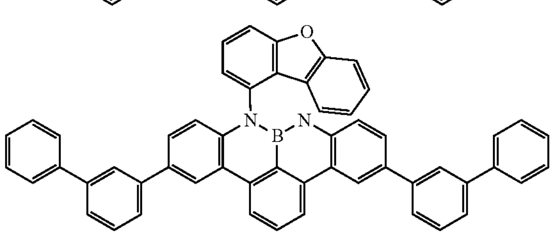
-continued
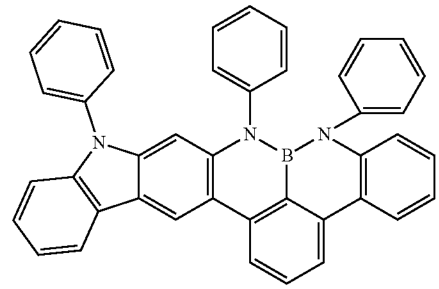
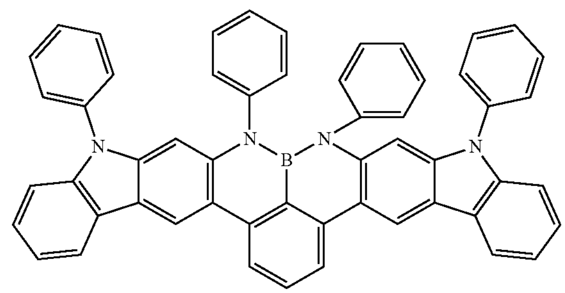
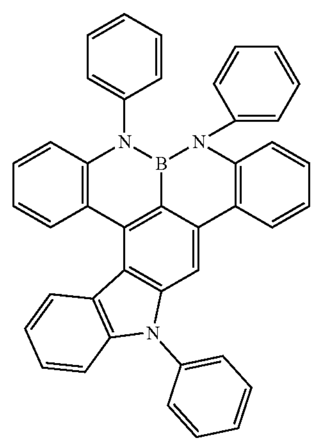
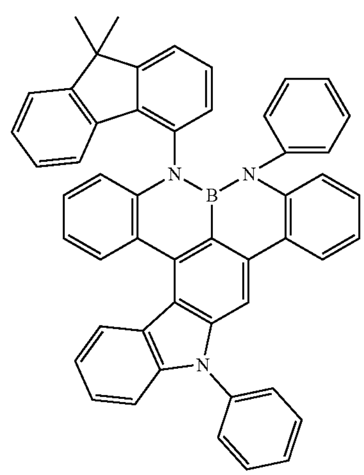

-continued
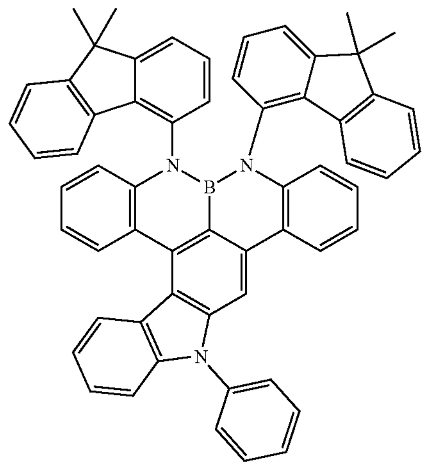
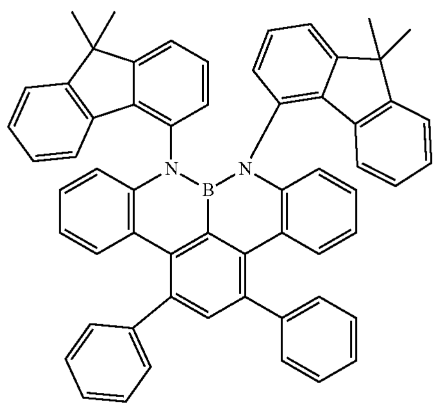
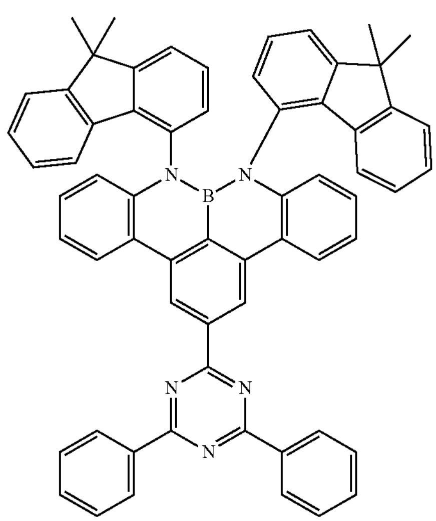
-continued
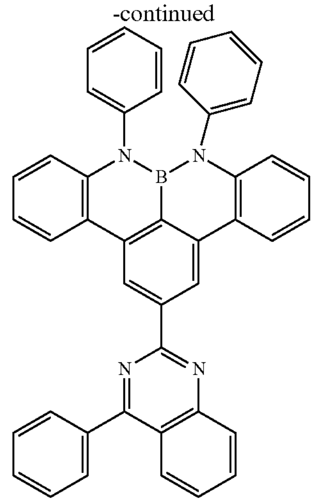
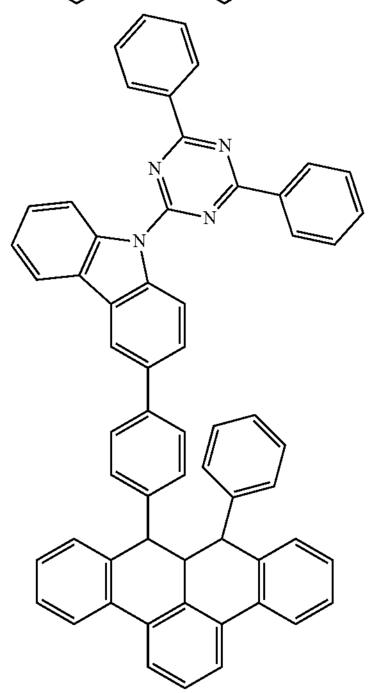
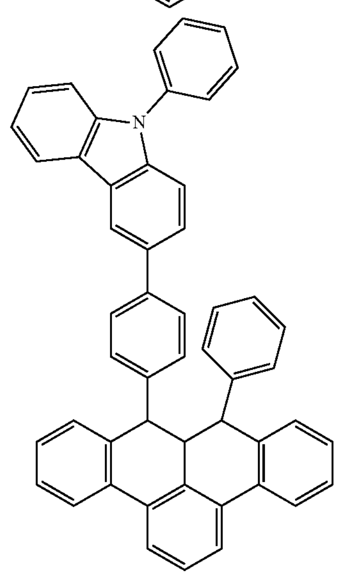

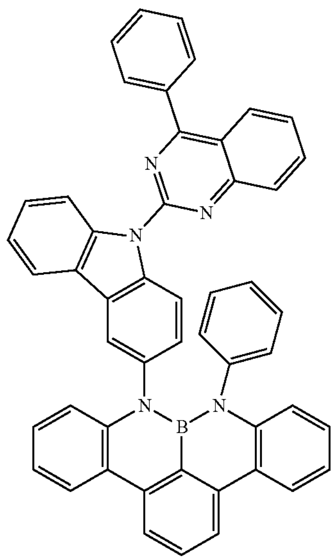
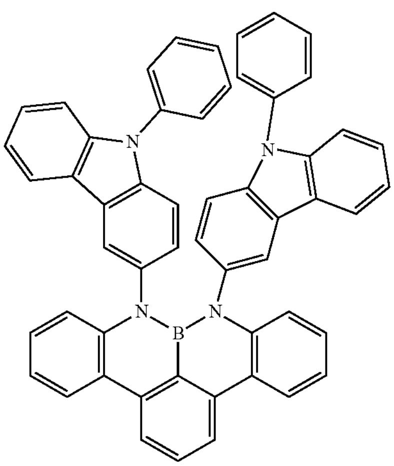
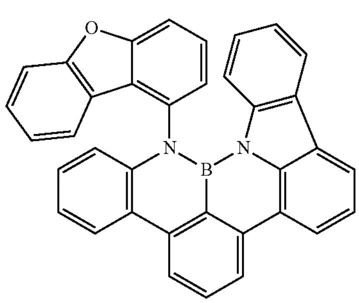
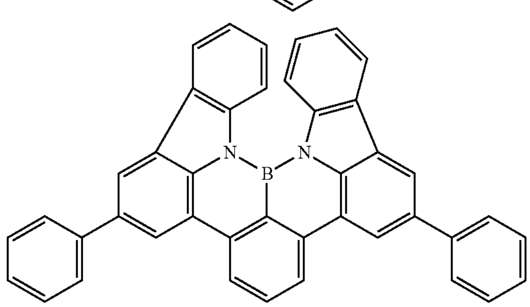
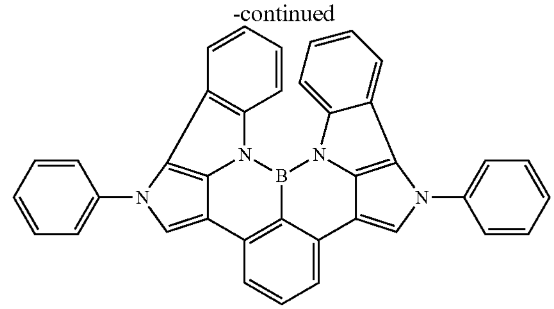
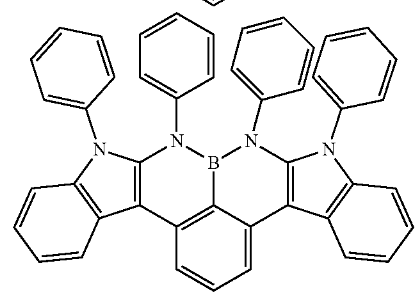
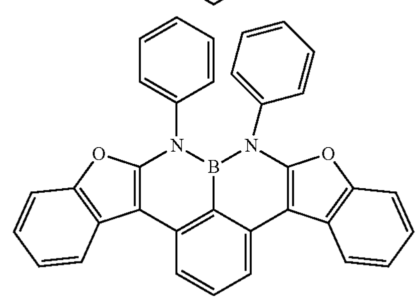
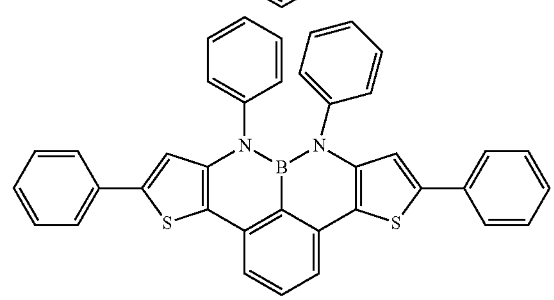
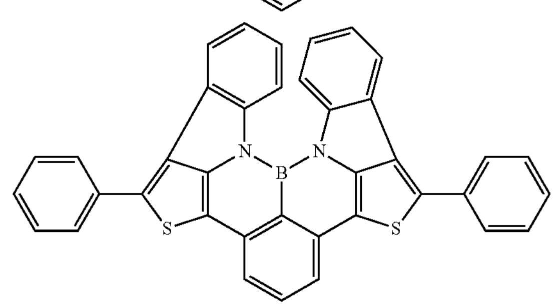
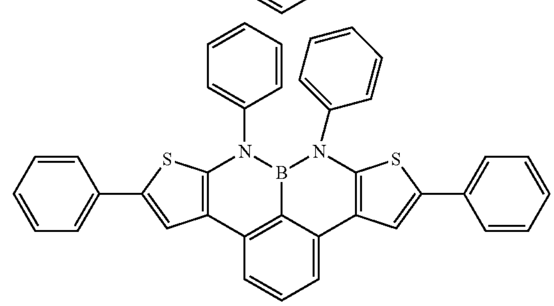

-continued
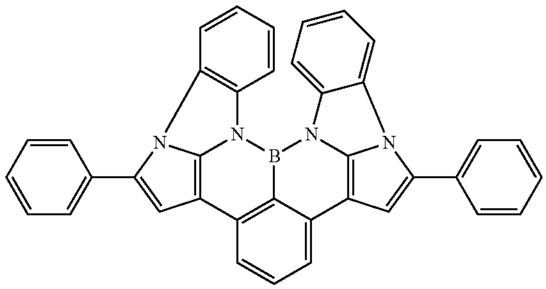
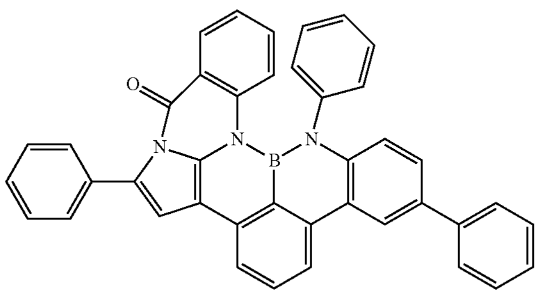
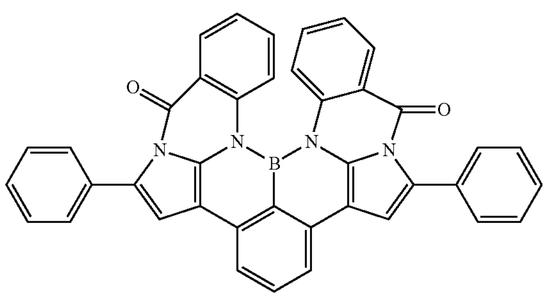
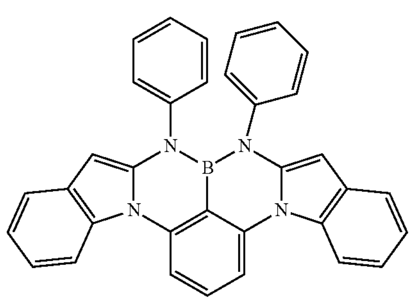
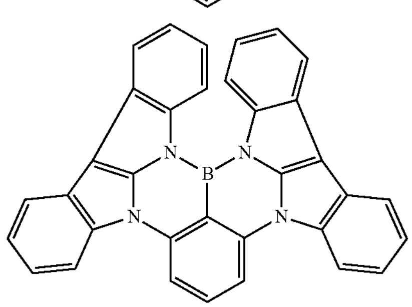
-continued
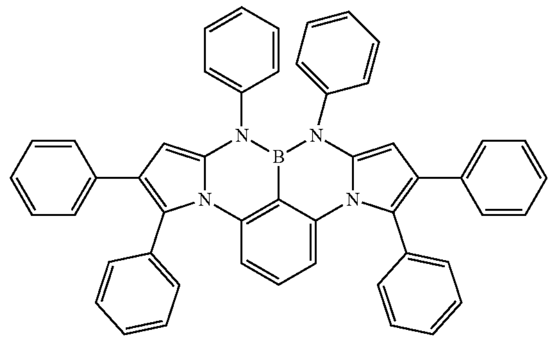
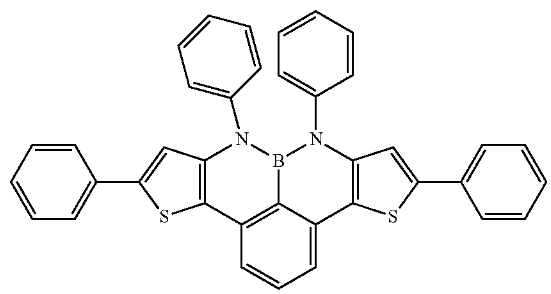
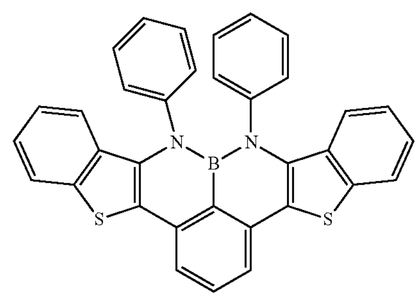
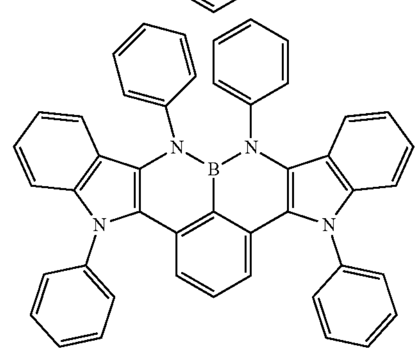
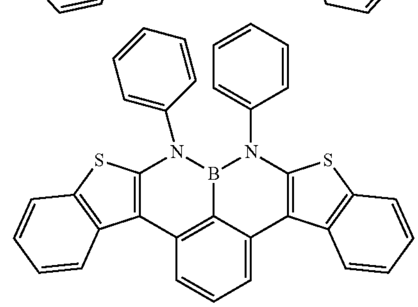

-continued
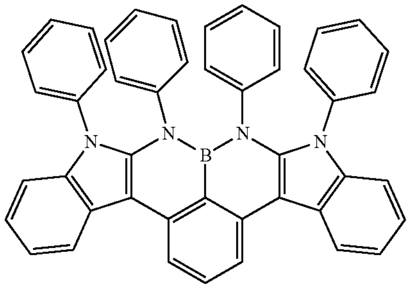
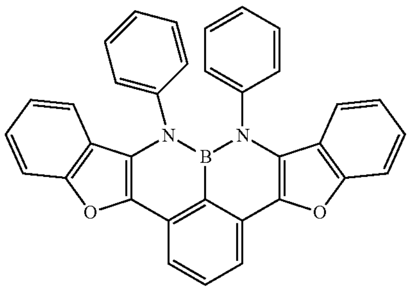
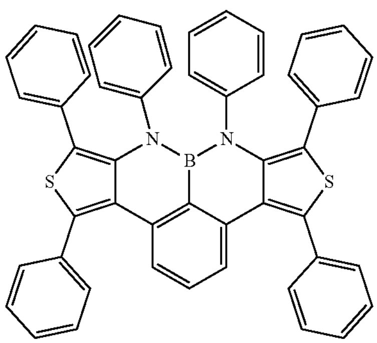
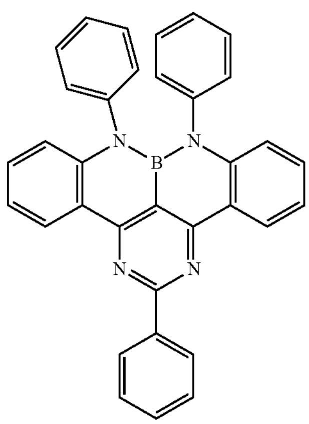
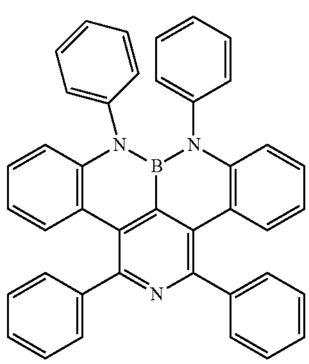
-continued
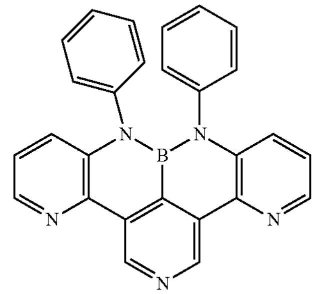
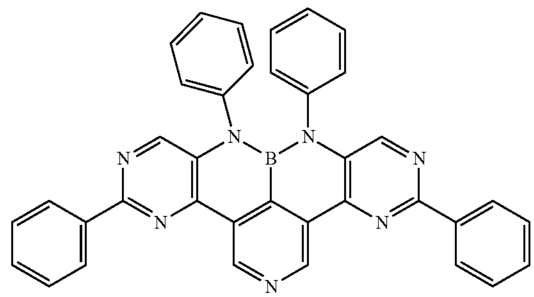
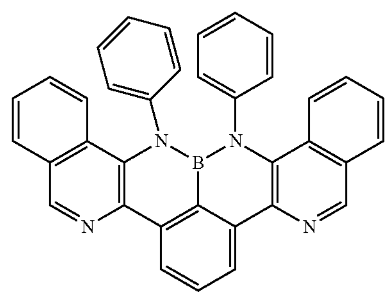
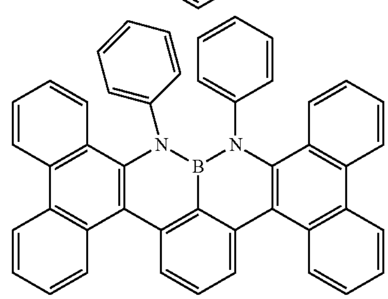
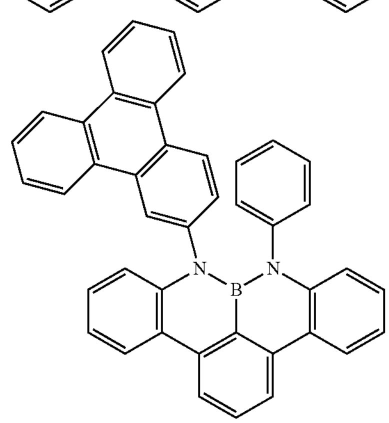

-continued

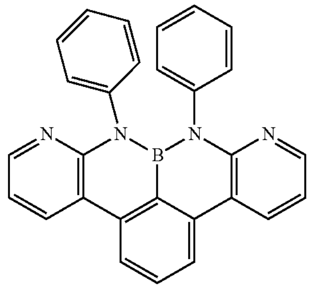

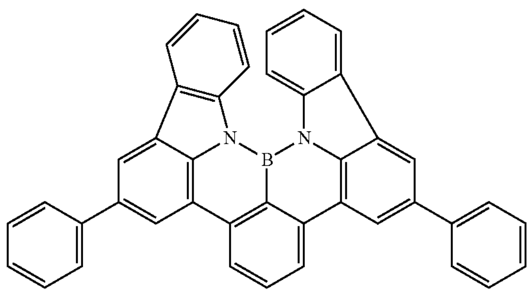

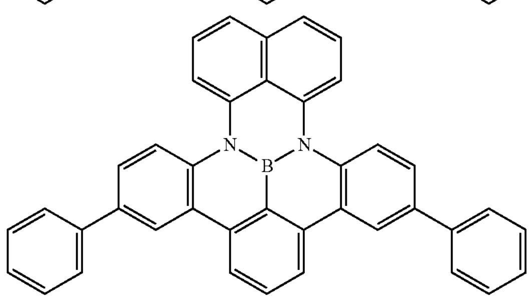

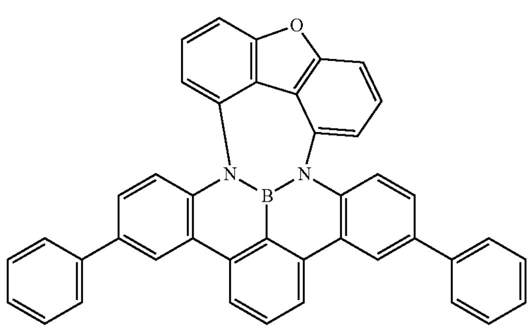

-continued

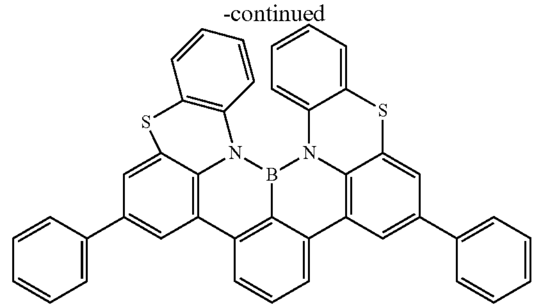

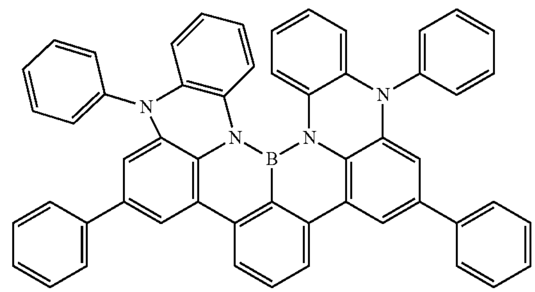

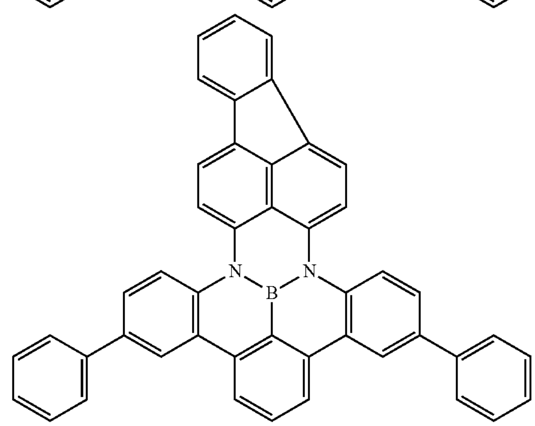

The compounds of the invention can be prepared by synthesis steps known to those skilled in the art, for example bromination, Suzuki coupling, Ullmann coupling, Hartwig-Buchwald coupling, etc. A suitable synthesis method is shown in general terms in schemes 1, 2, 3 and 4 below.

Proceeding from 1,3-halogenated aromatics, e.g. 1,3-dibromobenzene, the aromatic may be silylated (scheme 1). By means of a Suzuki coupling, the aromatic amines can be coupled to the aromatic. The amines may already be mono-substituted. This can be effected symmetrically (scheme 1, bottom) or in two steps (scheme 1, top).

Scheme 1
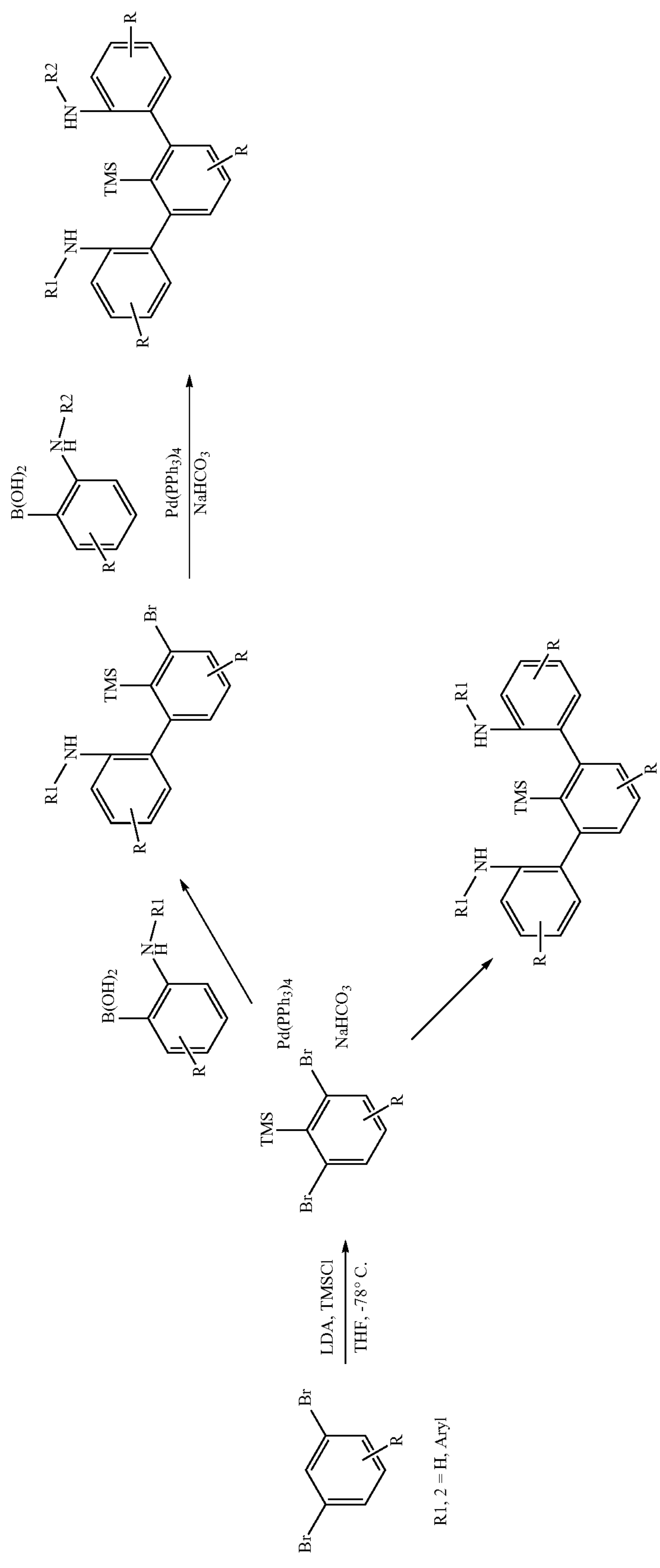
R1, 2 = H, Aryl
J. Am. Chem. Soc. 2016, 138, 11606-11615

The silyl group on the aromatic can be exchanged for the boron by reaction with boron trichloride (scheme 2).

Scheme 2

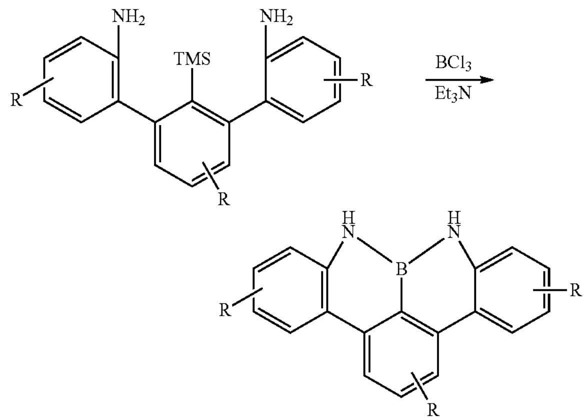

J. Am. Chem. Soc. 2016, 138, 11606-11615

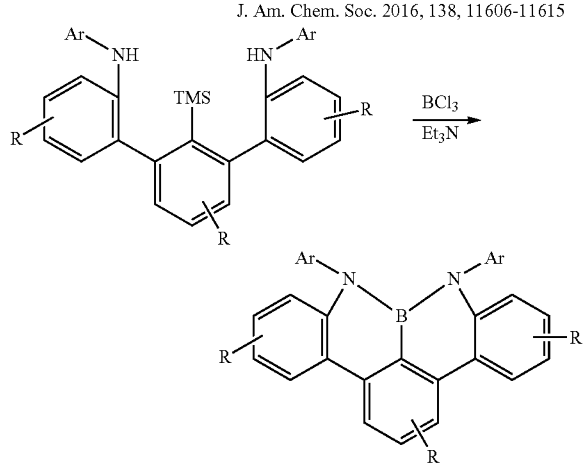

J. Am. Chem. Soc. 2016, 138, 11606-11615

The compound obtained can be functionalized in further steps (schemes 3 and 4). In this way, further radicals can be introduced into the aromatic (scheme 3) or the amines can be further functionalized (scheme 4).

Scheme 3

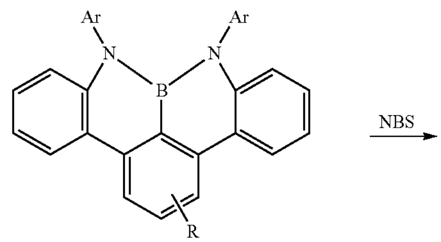

J. Am. Chem. Soc. 2016, 138, 11606-11615

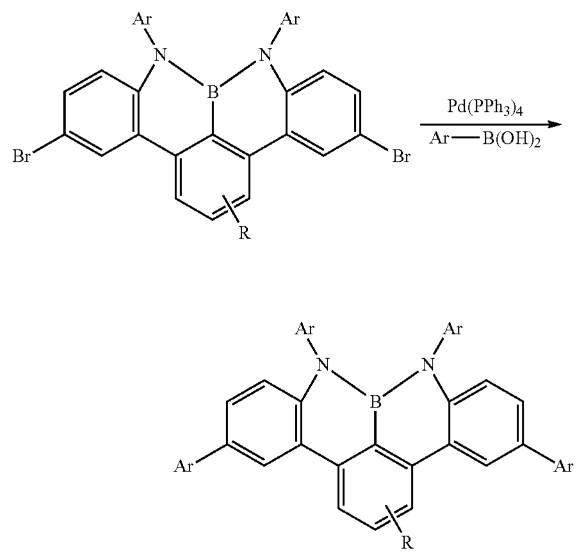

Scheme 4

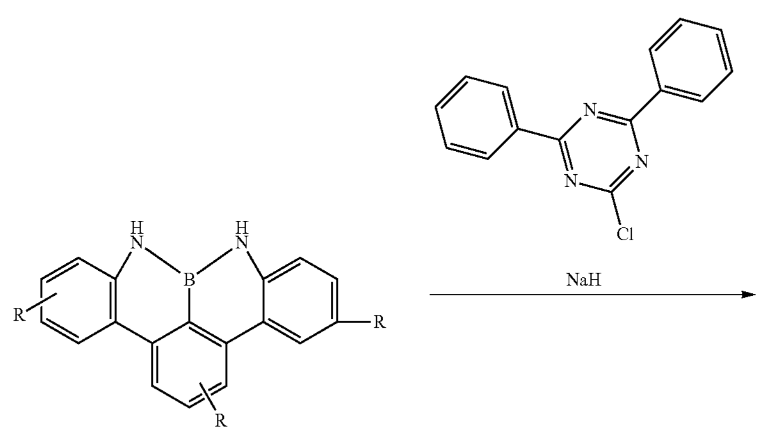

-continued

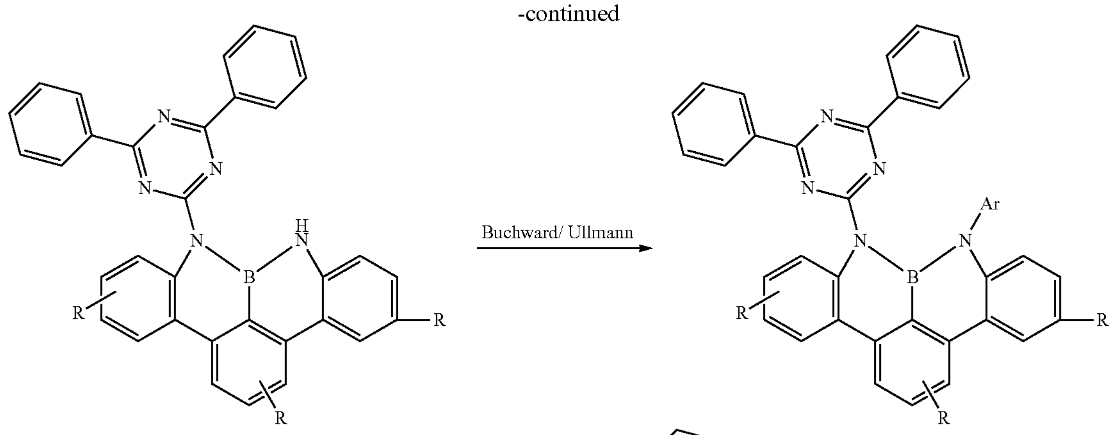

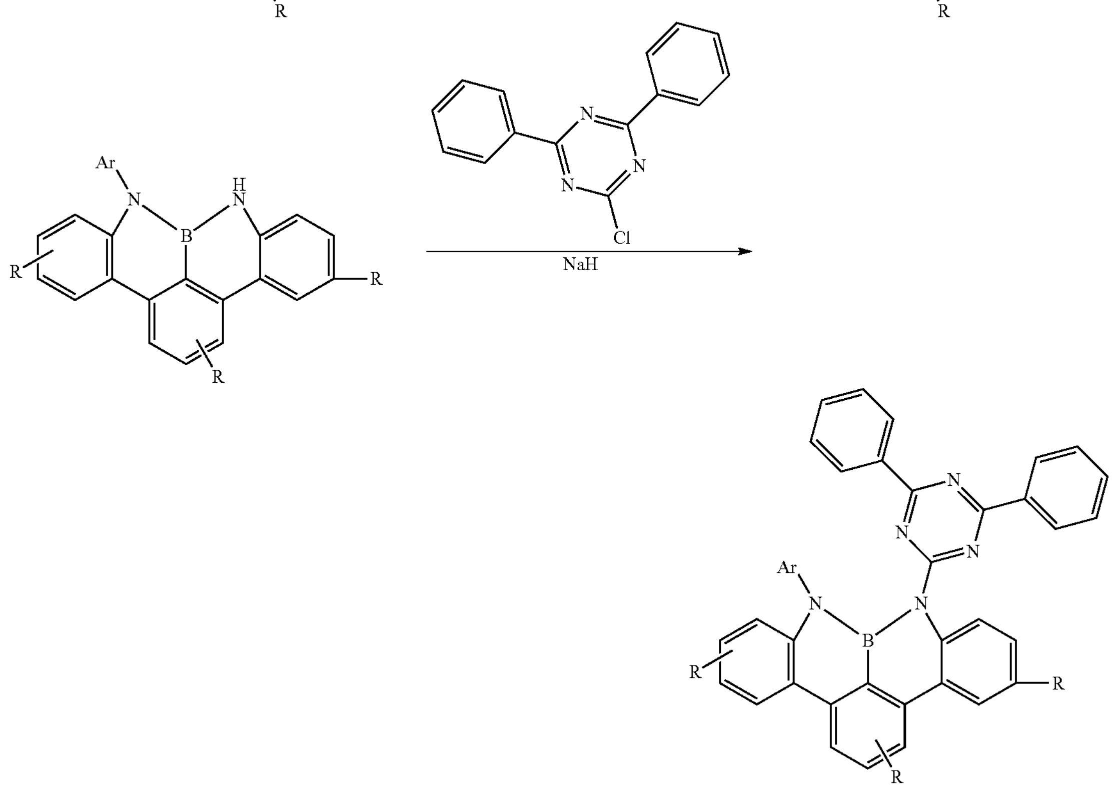

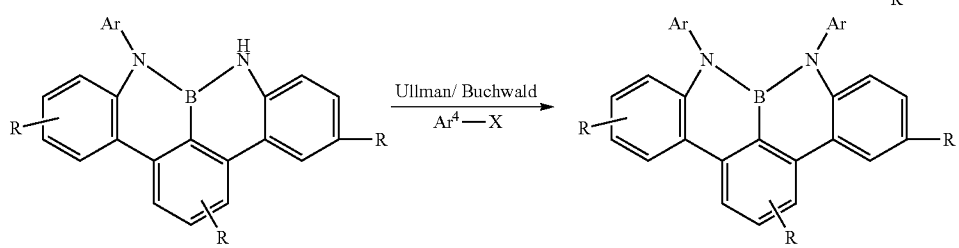

For the processing of the compounds of the invention from a liquid phase, for example by spin-coating or by printing methods, formulations of the compounds of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (–) -fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethyl naphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising a compound of the invention and at least one further compound. The further compound may, for example, be one or more solvents, especially one of the abovementioned solvents or a mixture of these solvents. The further compound may alternatively be at least one further organic or inorganic compound which is likewise used in the electronic device, for example an emitting compound, especially a phosphorescent dopant, and/or a further matrix material. Suitable emitting compounds and further matrix materials are listed at the back in connection with the organic electroluminescent device. This further compound may also be polymeric.

The compounds and mixtures of the invention are suitable for use in an electronic device. An electronic device is understood here to mean a device containing at least one layer containing at least one organic compound. The component may, however, also comprise inorganic materials or else layers formed entirely from inorganic materials.

The present invention therefore further provides for the use of the compounds or mixtures of the invention in an electronic device, especially in an organic electroluminescent device.

The present invention still further provides an electronic device comprising at least one of the above-detailed compounds or mixtures of the invention. In this case, the preferences detailed above for the compound also apply to the electronic devices.

The electronic device is preferably selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), organic dye-sensitized solar cells, organic optical detectors, organic photoreceptors, organic field-quench devices (O-FQDs), light-emitting electrochemical cells (LECs), organic laser diodes (O-lasers) and organic plasmon emitting devices, preferably organic electroluminescent devices (OLEDs, PLEDs), especially phosphorescent OLEDs.

The organic electroluminescent device comprises cathode, anode and at least one emitting layer. Apart from these layers, it may also comprise further layers, for example in each case one or more hole injection layers, hole transport layers, hole blocker layers, electron transport layers, electron injection layers, exciton blocker layers, electron blocker layers and/or charge generation layers. It is likewise possible for interlayers having an exciton-blocking function, for example, to be introduced between two emitting layers. However, it should be pointed out that not necessarily every one of these layers need be present. In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are systems having three emitting layers, where the three layers show blue, green and orange or red emission (for the basic construction, see, for example, WO 2005/011013). Preference is further given to tandem OLEDs. These may be fluorescent or phosphorescent emission layers or else hybrid systems in which fluorescent and phosphorescent emission layers are combined with one another. A white-emitting electroluminescent device can be used, for example, for lighting applications, but also in combination with a color filter for full-color displays.

The compound of the invention according to the above-detailed embodiments may be used in different layers, according to the exact structure. Preference is given to an organic electroluminescent device comprising a compound of formula (1) or as per the preferred embodiments as matrix material for fluorescent or phosphorescent emitters or for emitters that exhibit TADF (thermally activated delayed fluorescence), especially for phosphorescent emitters, and/or in an electron transport layer and/or in an electron-blocking or exciton-blocking layer and/or in a hole transport layer and/or hole injection layer, according to the exact substitution. In this context, the above-detailed preferred embodiments also apply to the use of the materials in organic electronic devices.

In a preferred embodiment of the invention, the compound of formula (1) or according to the preferred embodiments is used as matrix material for a fluorescent or phosphorescent compound or a compound that exhibits TADF, especially for a phosphorescent compound, in an emitting layer. In this case, the organic electroluminescent device may contain an emitting layer, or it may contain a plurality of emitting layers, where at least one emitting layer contains at least one compound of the invention as matrix material.

When the compound of formula (1) or according to the preferred embodiments is used as matrix material for an emitting compound in an emitting layer, it is preferably used in combination with one or more phosphorescent materials (triplet emitters). Phosphorescence in the context of this invention is understood to mean luminescence from an excited state having spin multiplicity >1, especially from an excited triplet state. In the context of this application, all luminescent transition metal complexes and luminescent lanthanide complexes, especially all iridium, platinum and copper complexes, shall be regarded as phosphorescent compounds.

The mixture of the compound of formula (1) or according to the preferred embodiments and the emitting compound contains between 99% and 1% by volume, preferably between 98% and 10% by volume, more preferably between 97% and 60% by volume and especially between 95% and 80% by volume of the compound of formula (1) or according to the preferred embodiments, based on the overall mixture of emitter and matrix material. Correspondingly, the mixture contains between 1% and 99% by volume, preferably between 2% and 90% by volume, more preferably between 3% and 40% by volume and especially between 5% and 20% by volume of the emitter, based on the overall mixture of emitter and matrix material. If the compounds are processed from solution, preference is given to using the corresponding amounts in % by weight rather than the above-specified amounts in % by volume.

Suitable phosphorescent compounds (=triplet emitters) are especially compounds which, when suitably excited, emit light, preferably in the visible region, and also contain at least one atom of atomic number greater than 20, preferably greater than 38 and less than 84, more preferably greater than 56 and less than 80, especially a metal having this atomic number. Preferred phosphorescence emitters used are compounds containing copper, molybdenum, tungsten, rhenium, ruthenium, osmium, rhodium, iridium, palladium, platinum, silver, gold or europium, especially compounds containing iridium or platinum. In the context of the present invention, all luminescent compounds containing the abovementioned metals are regarded as phosphorescent compounds.

Examples of the above-described emitters can be found in applications WO 00/70655, WO 2001/41512, WO 2002/02714, WO 2002/15645, EP 1191613, EP 1191612, EP 1191614, WO 05/033244, WO 05/019373, US 2005/0258742, WO 2009/146770, WO 2010/015307, WO 2010/031485, WO 2010/054731, WO 2010/054728, WO 2010/086089, WO 2010/099852, WO 2010/102709, WO 2011/032626, WO 2011/066898, WO 2011/157339, WO 2012/007086, WO 2014/008982, WO 2014/023377, WO 2014/094962, WO 2014/094961, WO 2014/094960, WO 2015/036074, WO 2015/104045, WO 2015/117718, WO 2016/015815, WO 2016/124304, WO 2017/032439 and the as yet unpublished application EP 16179378.1. In general, all phosphorescent complexes as used for phosphorescent OLEDs according to the prior art and as known to those skilled in the art in the field of organic electroluminescence are suitable, and the person skilled in the art will be able to use further phosphorescent complexes without exercising inventive skill.

A further preferred embodiment of the present invention is the use of the compound of formula (1) or according to the preferred embodiments as matrix material for a phosphorescent emitter in combination with a further matrix material. In a preferred embodiment of the invention, the further matrix material is a hole-transporting compound. In a further preferred embodiment of the invention, the further matrix material is an electron-transporting compound. In yet a further preferred embodiment, the further matrix material is a compound having a large band gap which is not involved to a significant degree, if at all, in the hole and electron transport in the layer.

Suitable matrix materials which can be used in combination with the compounds of formula (1) or according to the preferred embodiments are aromatic ketones, aromatic phosphine oxides or aromatic sulfoxides or sulfones, for example according to WO 2004/013080, WO 2004/093207, WO 2006/005627 or WO 2010/006680, triarylamines, especially monoamines, for example according to WO 2014/015935, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109 and WO 2011/000455, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, lactams, for example according to WO 2011/116865, WO 2011/137951 or WO 2013/064206, or 4-spirocarbazole derivatives, for example according to WO 2014/094963 or WO 2015/192939. It is likewise possible for a further phosphorescent emitter which emits at a shorter wavelength than the actual emitter to be present as co-host in the mixture.

Preferred co-host materials are triarylamine derivatives, especially monoamines, indenocarbazole derivatives, 4-spirocarbazole derivatives, lactams and carbazole derivatives, a preferred embodiment of carbazole derivatives being biscarbazole derivatives, especially 3,3'-bonded biscarbazole derivatives.

In a further embodiment of the invention, the organic electroluminescent device of the invention does not contain any separate hole injection layer and/or hole transport layer and/or hole blocker layer and/or electron transport layer, meaning that the emitting layer directly adjoins the hole injection layer or the anode, and/or the emitting layer directly adjoins the electron transport layer or the electron injection layer or the cathode, as described, for example, in WO 2005/053051. It is additionally possible to use a metal complex identical or similar to the metal complex in the emitting layer as hole transport or hole injection material directly adjoining the emitting layer, as described, for example, in WO 2009/030981.

In addition, it is possible to use the compounds of the invention in a hole transport layer or an electron transport layer. This depends on the respective substitution of the compound.

In the further layers of the organic electroluminescent device of the invention, it is possible to use any materials as typically used according to the prior art. The person skilled in the art is therefore able, without exercising inventive skill, to use any materials known for organic electroluminescent devices in combination with the inventive compounds of formula (1) or according to the preferred embodiments.

Additionally preferred is an organic electroluminescent device, characterized in that one or more layers are applied by a sublimation process. In this case, the materials are applied by vapor deposition in vacuum sublimation systems at an initial pressure of less than $10^{-5}$ mbar, preferably less than $10^{-6}$ mbar. It is also possible that the initial pressure is even lower or higher, for example less than $10^{-7}$ mbar.

Preference is likewise given to an organic electroluminescent device, characterized in that one or more layers are applied by the OVPD (organic vapor phase deposition) method or with the aid of a carrier gas sublimation. In this case, the materials are applied at a pressure between $10^{-5}$ mbar and 1 bar. A special case of this method is the OVJP (organic vapor jet printing) method, in which the materials are applied directly by a nozzle and thus structured.

Preference is additionally given to an organic electroluminescent device, characterized in that one or more layers are produced from solution, for example by spin-coating, or by any printing method, for example inkjet printing, LITI (light-induced thermal imaging, thermal transfer printing), screen printing, flexographic printing, offset printing or nozzle printing. For this purpose, soluble compounds are needed, which are obtained, for example, through suitable substitution.

The compounds of the invention have improved oxidation stability, especially in solution, especially compared to diamines that are customarily used. This is important especially for printing processes. The compounds of the invention also feature high thermal stability, and so they can be evaporated without decomposition under high vacuum. The thermal stability also increases the operative lifetime of the compounds.

In addition, hybrid methods are possible, in which, for example, one or more layers are applied from solution and one or more further layers are applied by vapor deposition.

For example, it is possible to apply the emitting layer from solution and to apply the electron transport layer by vapor deposition.

These methods are known in general terms to those skilled in the art and can be applied by those skilled in the art without exercising inventive skill to organic electroluminescent devices comprising the compounds of the invention.

The compounds of the invention generally have very good properties on use in organic electroluminescent devices. Especially in the case of use of the compounds of the invention in organic electroluminescent devices, the lifetime is better compared to similar compounds according to the prior art. At the same time, the further properties of the organic electroluminescent device, especially the efficiency and voltage, are likewise better or at least comparable.

The invention is now illustrated in detail by the examples which follow, without any intention of restricting it thereby.

EXAMPLES

The syntheses which follow, unless stated otherwise, are conducted under a protective gas atmosphere in dried solvents. The solvents and reagents can be purchased, for example, from Sigma-ALDRICH or ABCR. For the compounds known from the literature, the corresponding CAS numbers are also reported in each case.

SYNTHESIS EXAMPLES a) Phenyl-[2-(4,4,5,5-tetramethyl-[1,3,2]dioxaborolan-2-yl)-phenyl]-amine

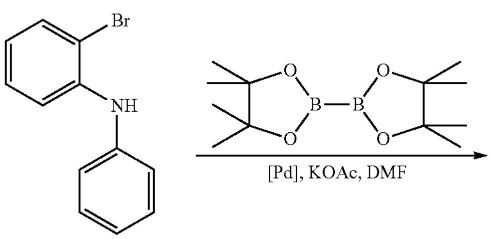

[61613-22-7]

-continued

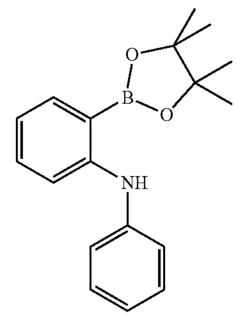

In a 500 ml flask, under protective gas, 7 g (28 mmol, 35%) of 2-bromophenyl(phenyl)amine and 8.6 g (35 mmol, 1.2 eq) of bis(pinacolato)diborane (CAS 73183-34-3) are dissolved in 120 ml of dry DMF and the mixture is degassed for 30 minutes. Subsequently, 8.2 g (84 mmol, 3.0 eq.) of potassium acetate and 690 mg (0.84 mmol, 3 mol %) of [1,1'-bis(diphenylphosphino)ferrocene]dichloropalladium (II) complex with dichloromethane (CAS 95464-05-4) are added, and the mixture is heated to 90° C. overnight. After the reaction has ended, the mixture is diluted with 300 ml of toluene and extracted with water. The solvent is removed on a rotary evaporator and the solids obtained are dried. The product (6.6 g, 22 mmol, 80% of theory) is converted without further purification.

In an analogous manner, it is possible to obtain the following compounds:

| No. | Reactant | Product | Yield |
|---|---|---|---|
| 1a | 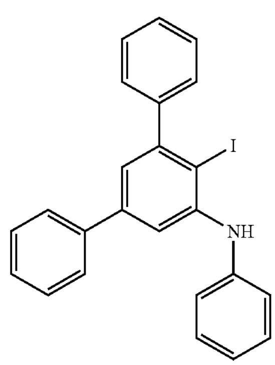  [1832598-71-6] | 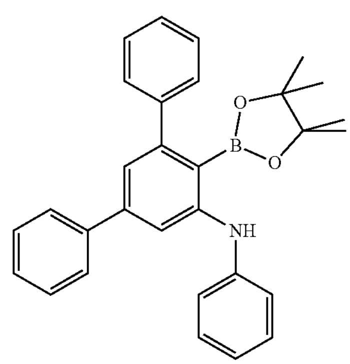 [SMILES: CC1(C)OB(c2c(Nc3ccccc3)cc(-c3ccccc3)cc2-c2ccccc2)OC1(C)C]  | 76% |

-continued
| No. | Reactant | Product | Yield |
|---|---|---|---|
| 2a | 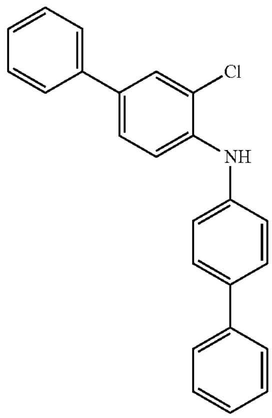 [1861572-31-8] | 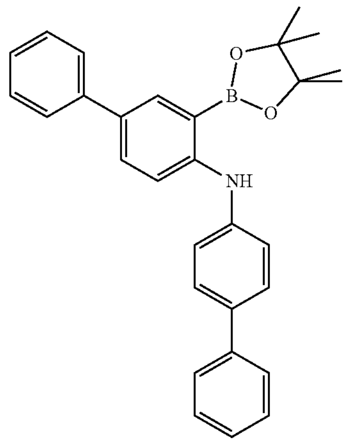 [SMILES: CC1(C)OB(c2cc(-c3ccccc3)ccc2Nc2ccc(-c3ccccc3)cc2)OC1(C)C] | 78% |
| 3a | 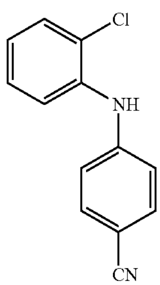 [639517-95-6] | 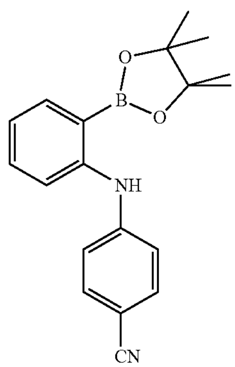 [SMILES: CC1(C)OB(c2ccccc2Nc2ccc(C#N)cc2)OC1(C)C] | 82% |
| 4a | 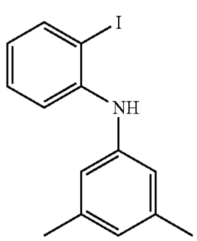 [1234673-04-1] | 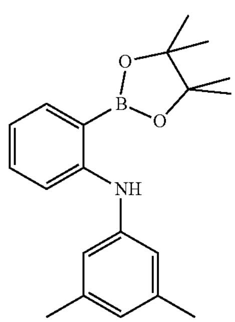 [SMILES: Cc1cc(C)cc(Nc2ccccc2B2OC(C)(C)C(C)(C)O2)c1] | 81% |
| 5a | 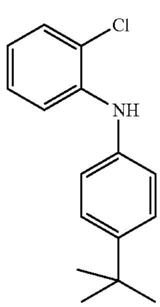 1160823-33-5] | 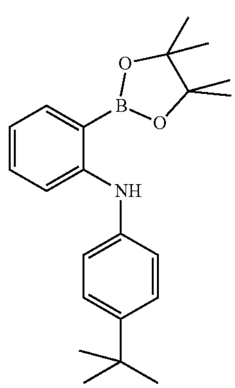 [SMILES: CC(C)(C)c1ccc(Nc2ccccc2B2OC(C)(C)C(C)(C)O2)cc1] | 83% |

-continued
| No. | Reactant | Product | Yield |
|---|---|---|---|
| 6a | 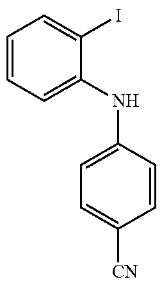 [1038732-64-7] | 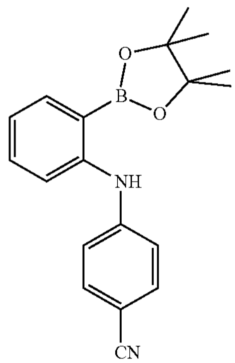 [SMILES: CC1(C)OB(c2ccccc2Nc2ccc(C#N)cc2)OC1(C)C] | 76% |
| 7a | 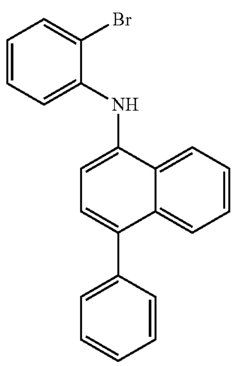 [1618107-04-2] | 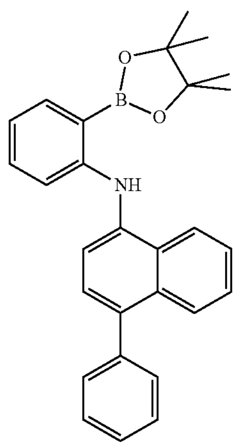 [SMILES: CC1(C)OB(c2ccccc2Nc2ccc(-c3ccccc3)c3ccccc23)OC1(C)C] | 78% |
| 8a | 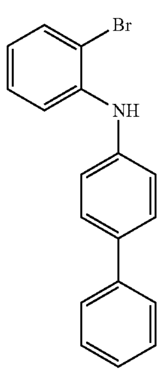 [1989614-53-0] | 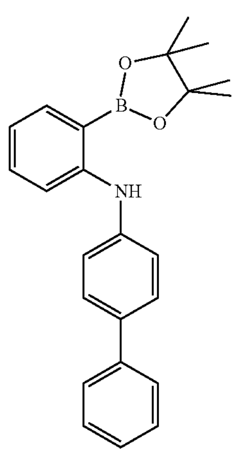 [SMILES: CC1(C)OB(c2ccccc2Nc2ccc(-c3ccccc3)cc2)OC1(C)C] | 88% |

-continued
| No. | Reactant | Product | Yield |
|---|---|---|---|
| 9a | 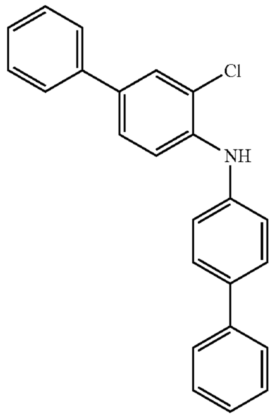 [1861572-31-8] | 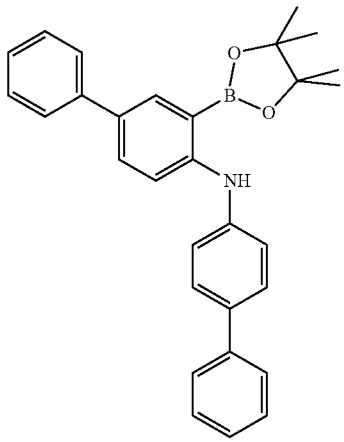 [SMILES: CC1(C)OB(c2cc(-c3ccccc3)ccc2Nc2ccc(-c3ccccc3)cc2)OC1(C)C] | 65% |
| 10a | 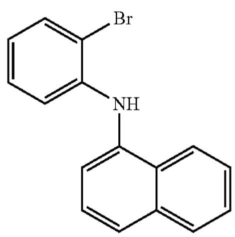 [1160823-41-5] | 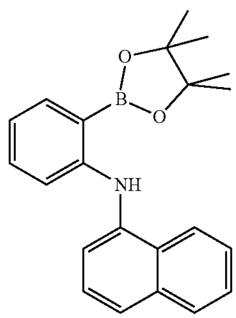 [SMILES: CC1(C)OB(c2ccccc2Nc2cccc3ccccc23)OC1(C)C] | 76% |
| 11a | 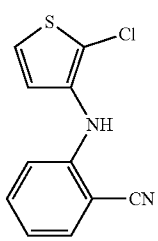 [11861820-99-6] | 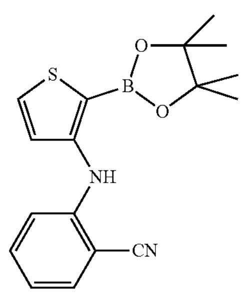 [SMILES: CC1(C)OB(c2sccc2Nc2ccccc2C#N)OC1(C)C] | 75% |
| 12a | 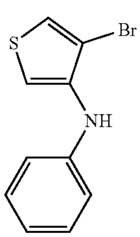 [2178153-36-9] | 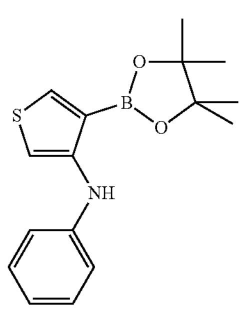 [SMILES: CC1(C)OB(c2cscc2Nc2ccccc2)OC1(C)C] | 62% |

-continued

| No. | Reactant | Product | Yield |
| --- | --- | --- | --- |
| 13a | 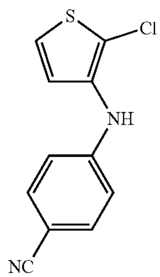 [1856576-50-5] | 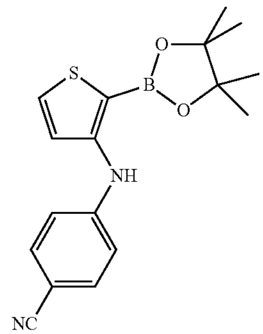 [SMILES: CC1(C)OB(c2sccc2Nc2ccc(C#N)cc2)OC1(C)C] | 66% |
| 14a | 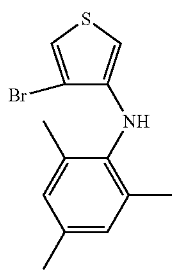 [1186201-15-9] | 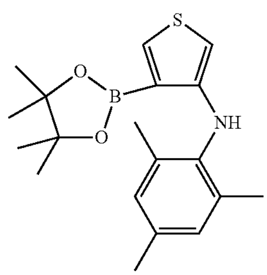 | 58% |

b) N2,N2"-Diphenyl-2'-trimethylsilanyl-[1,1'; 3',1"] terphenyl-2,2"-diamine

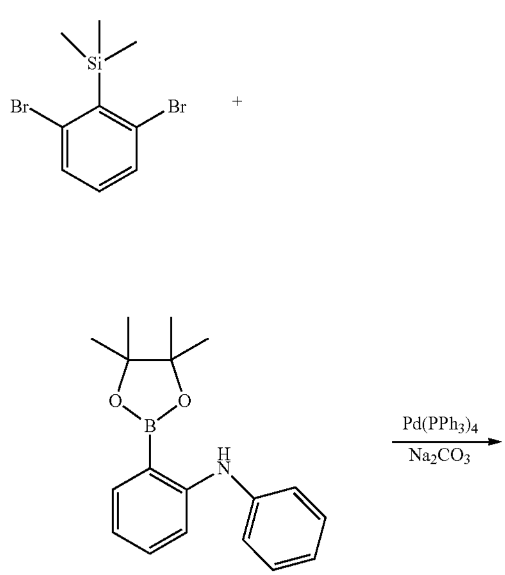

-continued

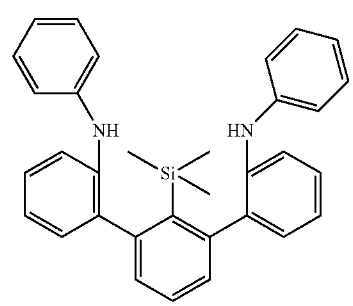

20.5 g (70 mmol) of N-phenyl-2-(4°,4',5',5'-tetramethyl-1',3',2'-dioxaborolan-2-yl)-phenylamine, 21.5 g (70 mmol) of (2,6-dibromophenyl)trimethylsilane and 78.9 ml (158 mmol) of $Na_2CO_3$ (2 M solution) are suspended in 200 ml of dimethoxyethane. 1.3 g (1.1 mmol) of $Pd(PPh_3)_4$ is added to this suspension, and the reaction mixture is heated under reflux for 16 h. After cooling, dichloromethane is added to the mixture, and the organic phase is removed, filtered through silica gel and recrystallized from toluene. The yield is 21.6 g (45 mmol), corresponding to 85% of theory.

In an analogous manner, it is possible to obtain the following compounds:

| No. | Reactant 1 | Reactant 2 | Product | Yield |
|---|---|---|---|---|
| 1b | 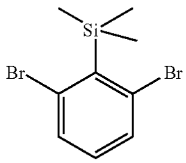 [363598-42-9] | 0.5 eq: 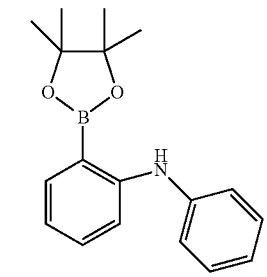 | 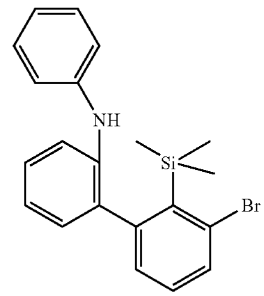 [SMILES: C[Si](C)(C)c1c(Br)cccc1-c1ccccc1Nc1ccccc1] | 61% |
| 2b | 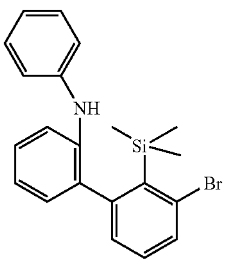 [SMILES: C[Si](C)(C)c1c(Br)cccc1-c1ccccc1Nc1ccccc1] | 0.5 eq: 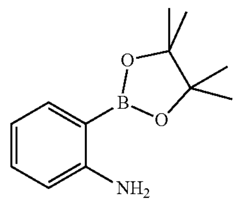 [191171-55-8] | 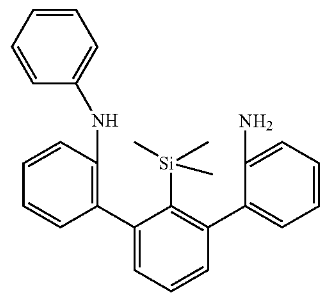 [SMILES: C[Si](C)(C)c1c(-c2ccccc2N)cccc1-c1ccccc1Nc1ccccc1] | 70% |
| 3b | 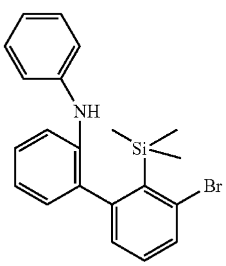 [SMILES: C[Si](C)(C)c1c(Br)cccc1-c1ccccc1Nc1ccccc1] | 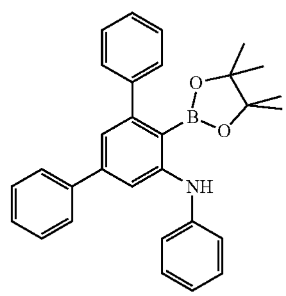 [SMILES: CC1(C)OB(c2c(Nc3ccccc3)cc(-c3ccccc3)cc2-c2ccccc2)OC1(C)C] | 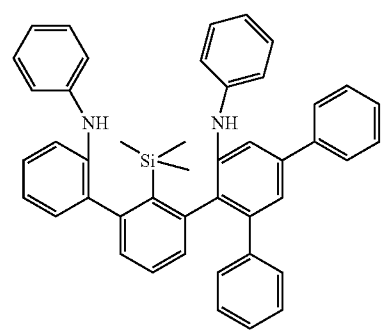 [SMILES: C[Si](C)(C)c1c(-c2ccccc2Nc2ccccc2)cccc1-c1c(Nc2ccccc2)cc(-c2ccccc2)cc1-c1ccccc1] | 80% |
| 4b | 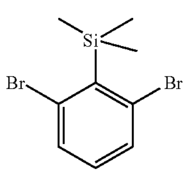 [363598-42-9] | 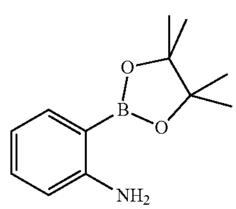 [191171-55-8] | 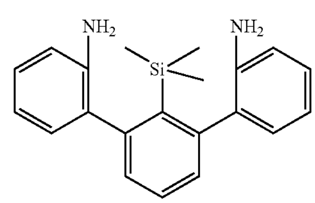 [SMILES: C[Si](C)(C)c1c(-c2ccccc2N)cccc1-c1ccccc1N] | 86% |
| 5b | 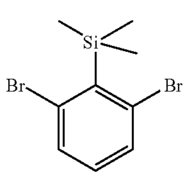 [363598-42-9] | 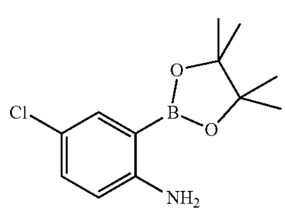 [1073371-77-3] | 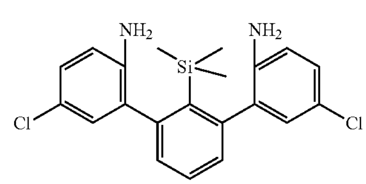 [SMILES: C[Si](C)(C)c1c(-c2cc(Cl)ccc2N)cccc1-c1cc(Cl)ccc1N] | 79% |

-continued
| No. | Reactant 1 | Reactant 2 | Product | Yield |
|---|---|---|---|---|
| 6b | 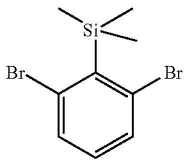 [363598-42-9] | 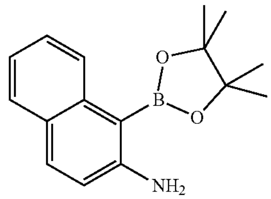 [1928748-31-5] | 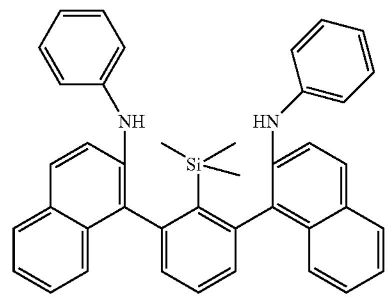 [SMILES: C[Si](C)(C)c1c(-c2c(Nc3ccccc3)ccc3ccccc23)cccc1-c1c(Nc2ccccc2)ccc2ccccc12] | 75% |
| 7b | 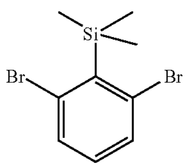 [363598-42-9] | 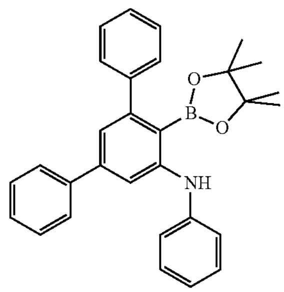 [SMILES: CC1(C)OB(c2c(Nc3ccccc3)cc(-c3ccccc3)cc2-c2ccccc2)OC1(C)C] | 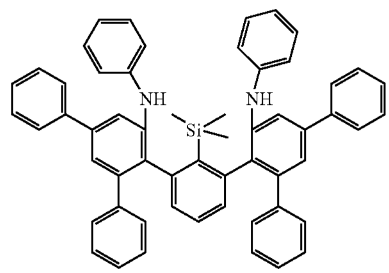 [SMILES: C[Si](C)(C)c1c(-c2c(Nc3ccccc3)cc(-c3ccccc3)cc2-c2ccccc2)cccc1-c1c(Nc2ccccc2)cc(-c2ccccc2)cc1-c1ccccc1] | 70% |
| 8b | 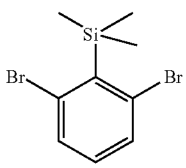 [363598-42-9] | 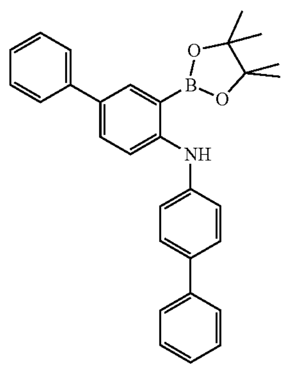 [SMILES: CC1(C)OB(c2cc(-c3ccccc3)ccc2Nc2ccc(-c3ccccc3)cc2)OC1(C)C] | 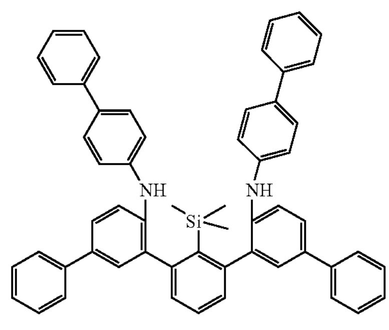 [SMILES: C[Si](C)(C)c1c(-c2cc(-c3ccccc3)ccc2Nc2ccc(-c3ccccc3)cc2)cccc1-c1cc(-c2ccccc2)ccc1Nc1ccc(-c2ccccc2)cc1] | 74% |
| 9b | 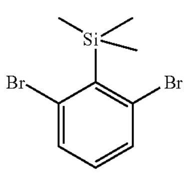 [363598-42-9] | 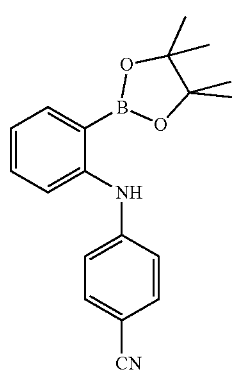 [SMILES: CC1(C)OB(c2ccccc2Nc2ccc(C#N)cc2)OC1(C)C] | 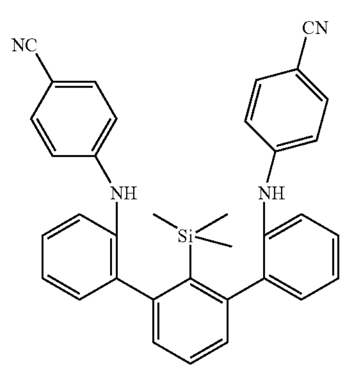 [SMILES: C[Si](C)(C)c1c(-c2ccccc2Nc2ccc(C#N)cc2)cccc1-c1ccccc1Nc1ccc(C#N)cc1] | 72% |

-continued
| No. | Reactant 1 | Reactant 2 | Product | Yield |
|---|---|---|---|---|
| 10b | 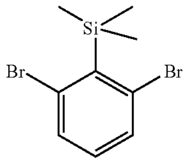 [363598-42-9] | 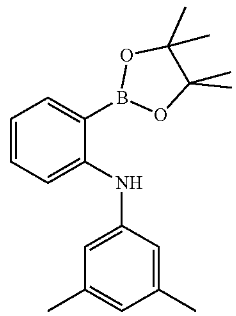 [SMILES: Cc1cc(C)cc(Nc2ccccc2B2OC(C)(C)C(C)(C)O2)c1] | 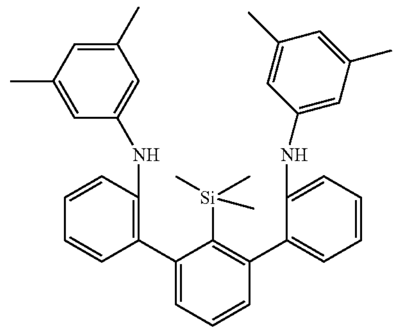 | 76% |
| 11b | 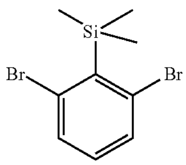 [363598-42-9] | 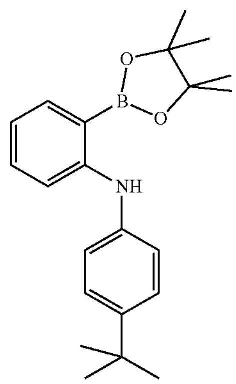 [SMILES: CC(C)(C)c1ccc(Nc2ccccc2B2OC(C)(C)C(C)(C)O2)cc1] | 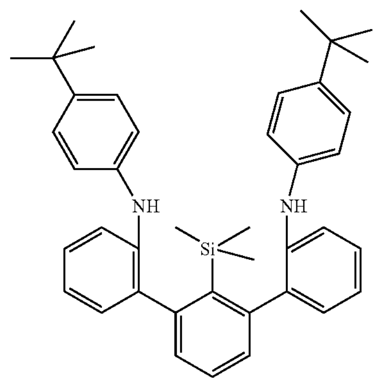 [SMILES: CC(C)(C)c1ccc(Nc2ccccc2-c2cccc(-c3ccccc3Nc3ccc(C(C)(C)C)cc3)c2[Si](C)(C)C)cc1] | 69% |
| 12b | 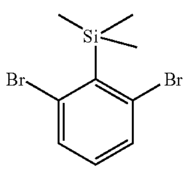 [363598-42-9] | 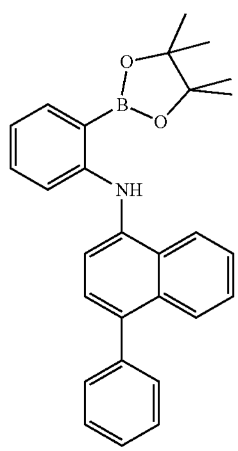 [SMILES: CC1(C)OB(c2ccccc2Nc2ccc(-c3ccccc3)c3ccccc23)OC1(C)C] | 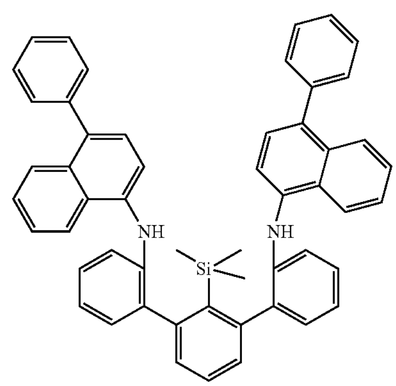 [SMILES: C[Si](C)(C)c1c(-c2ccccc2Nc2ccc(-c3ccccc3)c3ccccc23)cccc1-c1ccccc1Nc1ccc(-c2ccccc2)c2ccccc12] | 65% |
| 13b | 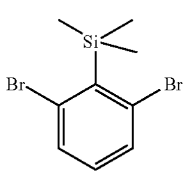 [363598-42-9] | 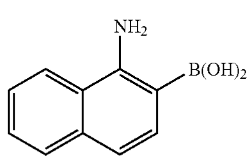 [1621965-01-2] | 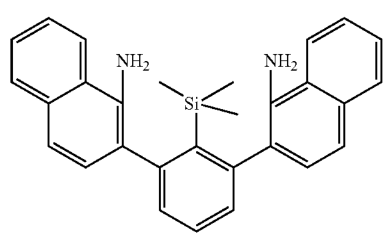 [SMILES: C[Si](C)(C)c1c(-c2ccc3ccccc3c2N)cccc1-c1ccc2ccccc2c1N] | 80% |

-continued
| No. | Reactant 1 | Reactant 2 | Product | Yield |
|---|---|---|---|---|
| 14b | 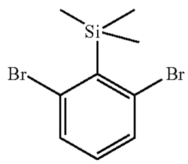 [363598-42-9] | 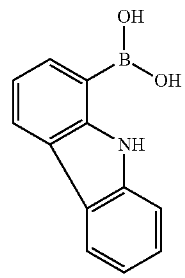 [869642-36-4] | 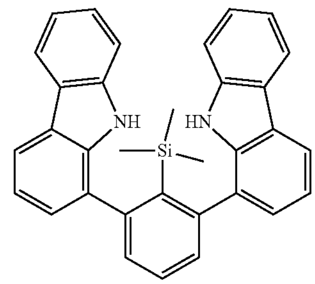 [SMILES: C[Si](C)(C)c1c(-c2cccc3c2[nH]c2ccccc23)cccc1-c1cccc2c1[nH]c1ccccc12] | 61% |
| 15b | 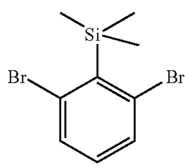 [363598-42-9] | 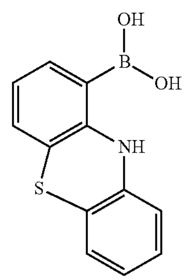 [1219637-89-4] | 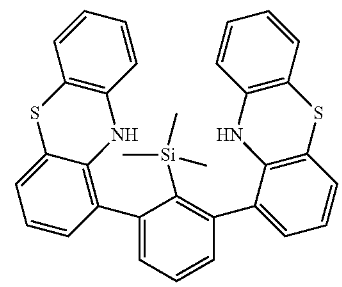 [SMILES: C[Si](C)(C)c1c(-c2cccc3c2Nc2ccccc2S3)cccc1-c1cccc2c1Nc1ccccc1S2] | 64% |
| 16b | 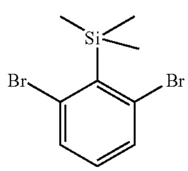 [363598-42-9] | 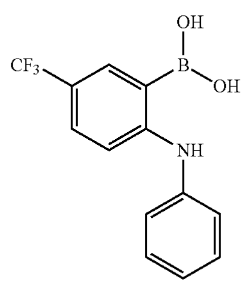 [863727-45-3] | 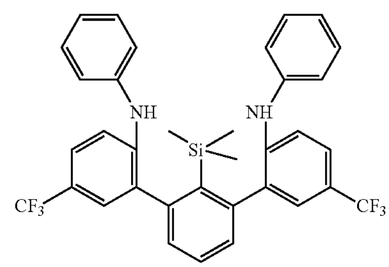 [SMILES: C[Si](C)(C)c1c(-c2cc(C(F)(F)F)ccc2Nc2ccccc2)cccc1-c1cc(C(F)(F)F)ccc1Nc1ccccc1] | 82% |
| 17b | 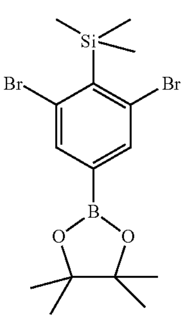 [1190989-35-5] | 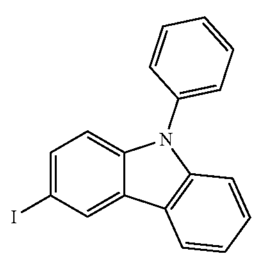 [502161-03-7] | 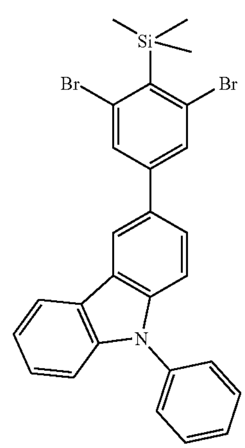 [SMILES: C[Si](C)(C)c1c(Br)cc(-c2ccc3c(c2)c2ccccc2n3-c2ccccc2)cc1Br] | 63% |

-continued
| No. | Reactant 1 | Reactant 2 | Product | Yield |
|---|---|---|---|---|
| 18b | 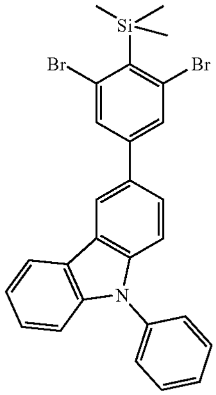 [SMILES: C[Si](C)(C)c1c(Br)cc(-c2ccc3c(c2)c2ccccc2n3-c2ccccc2)cc1Br] | 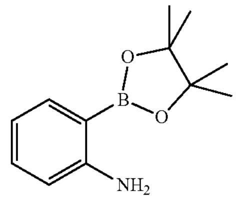 [191171-55-8] | 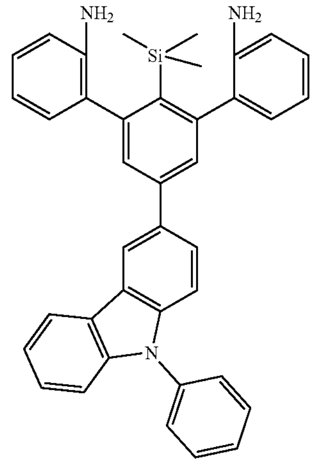 [SMILES: C[Si](C)(C)c1c(-c2ccccc2N)cc(-c2ccc3c(c2)c2ccccc2n3-c2ccccc2)cc1-c1ccccc1N] | 79% |
| 19b | 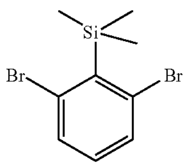 [363598-42-9] | 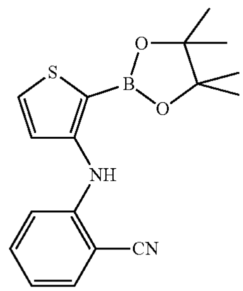 [SMILES: CC1(C)OB(c2sccc2Nc2ccccc2C#N)OC1(C)C] | 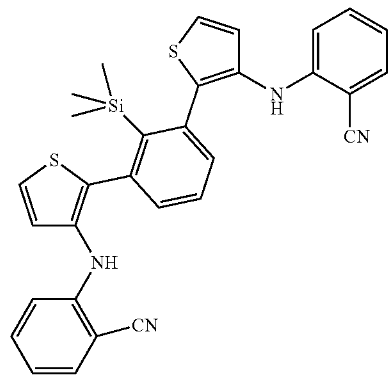 [SMILES: C[Si](C)(C)c1c(-c2sccc2Nc2ccccc2C#N)cccc1-c1sccc1Nc1ccccc1C#N] | 73% |
| 20b | 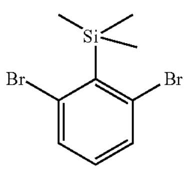 [363598-42-9] | 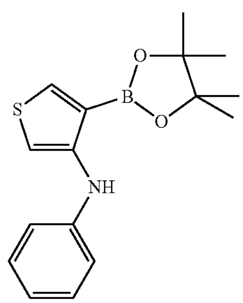 [SMILES: CC1(C)OB(c2cscc2Nc2ccccc2)OC1(C)C] | 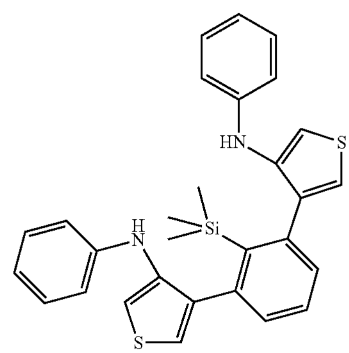 [SMILES: C[Si](C)(C)c1c(-c2cscc2Nc2ccccc2)cccc1-c1cscc1Nc1ccccc1] | 70% |
| 21b | 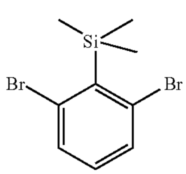 [363598-42-9] | 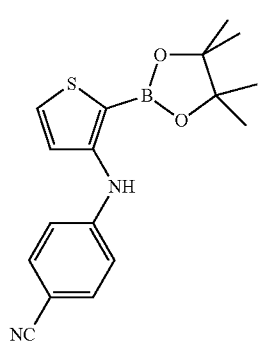 [SMILES: CC1(C)OB(c2sccc2Nc2ccc(C#N)cc2)OC1(C)C] | 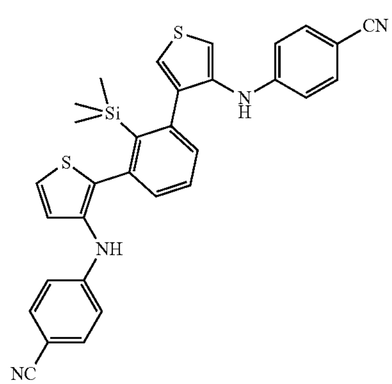 [SMILES: C[Si](C)(C)c1c(-c2cscc2Nc2ccc(C#N)cc2)cccc1-c1sccc1Nc1ccc(C#N)cc1] | 74% |

-continued

| No. | Reactant 1 | Reactant 2 | Product | Yield |
|---|---|---|---|---|
| 22b | 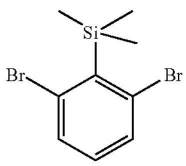 [363598-42-9] | 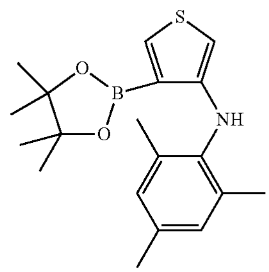 | 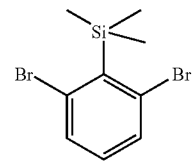 [363598-42-9] | 64% |
| 23b | 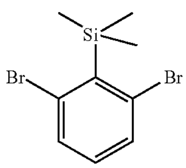 [363598-42-9] | 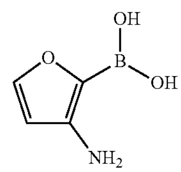 [2070922-04-0] | 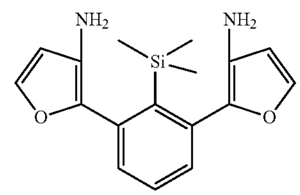 [SMILES: C[Si](C)(C)c1c(-c2occc2N)cccc1-c1occc1N] | 64% |
| 24b | 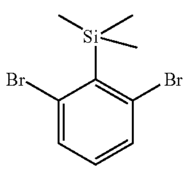 [363598-42-9] | 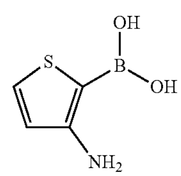 [2070922-05-1] | 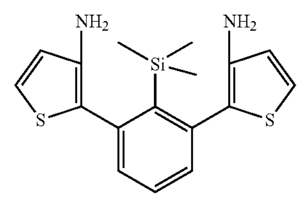 [SMILES: C[Si](C)(C)c1c(-c2sccc2N)cccc1-c1sccc1N] | 67% |

c) 8,9-Diphenyl-8H,9H-8,9-diaza-8a-borabenzo[fg]naphthacene

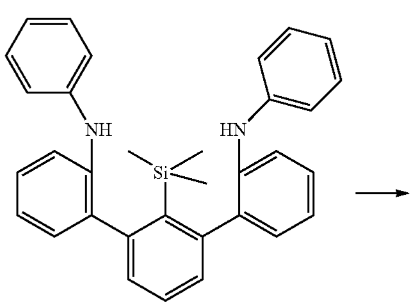

-continued

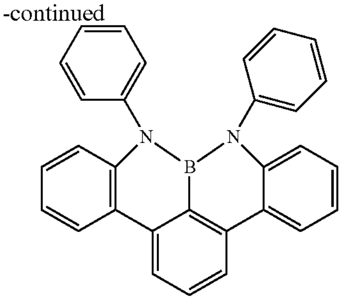

Under protective gas, 9.6 g (20 mmol) of N2,N2"-diphenyl-2'-trimethylsilanyl-[1,1'; 3',1"]terphenyl-2,2"-diamine is dissolved in 400 ml of o-dichlorobenzene. Added to this solution are 6 g (60 mmol) of triethylamine and 300 ml (1.5 mmol) of boron trichloride, 1 M in hexane, and the reaction mixture is heated under reflux (~180° C.) for 12 h. After cooling, the mixture is concentrated, separated by chromatography ($CH_2Cl_2$/heptane, 5:1), recrystallized from a $CH_2Cl_2$/MeOH mixture, and finally sublimed under high vacuum (p=5×$10^{-5}$ mbar). The yield is 7.2 g (17 mmol), corresponding to 87% of theory.

In an analogous manner, it is possible to obtain the following compounds:

| No. | Reactant 4 | Product | Yield |
|---|---|---|---|
| 1c | 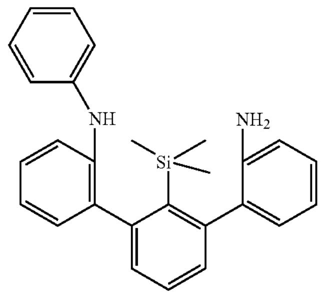 [SMILES: C[Si](C)(C)c1c(-c2ccccc2N)cccc1-c1ccccc1Nc1ccccc1] | 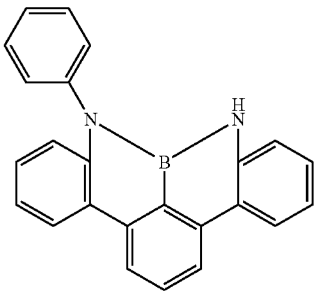 [SMILES: c1ccc(N2B3Nc4ccccc4-c4cccc(c43)-c3ccccc32)cc1] | 74% |
| 2c | 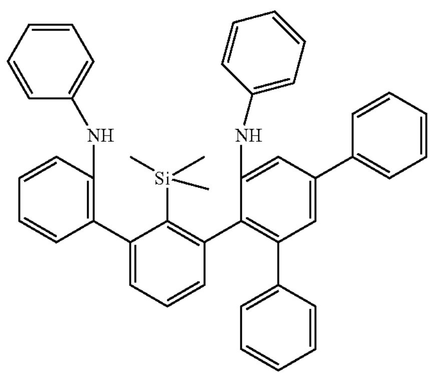 [SMILES: C[Si](C)(C)c1c(-c2ccccc2Nc2ccccc2)cccc1-c1c(Nc2ccccc2)cc(-c2ccccc2)cc1-c1ccccc1] | 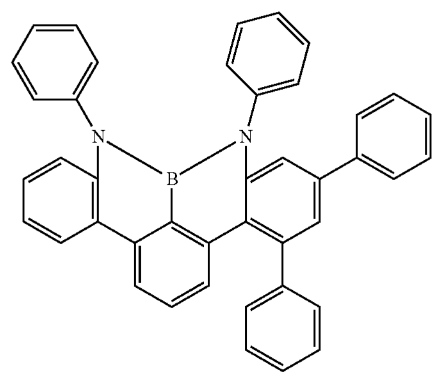 [SMILES: c1ccc(-c2cc(-c3ccccc3)c3c(c2)N(c2ccccc2)B2c4c(cccc4-3)-c3ccccc3N2c2ccccc2)cc1] | 80% |
| 3c | 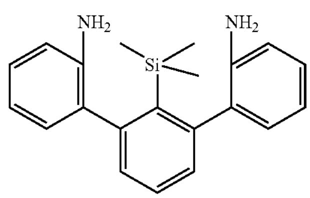 [SMILES: C[Si](C)(C)c1c(-c2ccccc2N)cccc1-c1ccccc1N] | 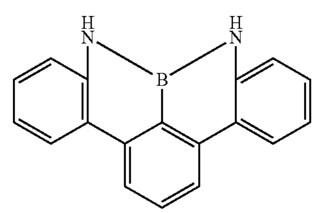 [SMILES: c1ccc2c(c1)NB1Nc3ccccc3-c3cccc-2c31] | 89% |
| 4c | 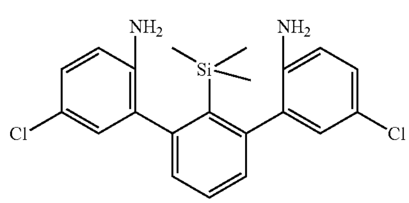 [SMILES: C[Si](C)(C)c1c(-c2cc(Cl)ccc2N)cccc1-c1cc(Cl)ccc1N] | 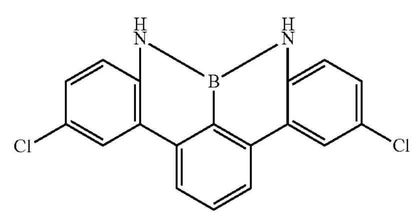 [SMILES: Clc1ccc2c(c1)-c1cccc3c1B(N2)Nc1ccc(Cl)cc1-3] | 69% |
| 5c | 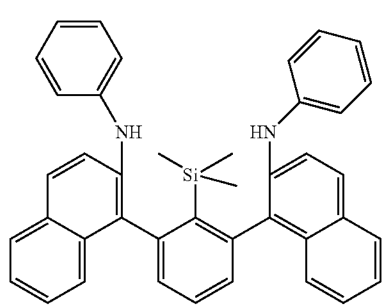 [SMILES: C[Si](C)(C)c1c(-c2c(Nc3ccccc3)ccc3ccccc23)cccc1-c1c(Nc2ccccc2)ccc2ccccc12] | 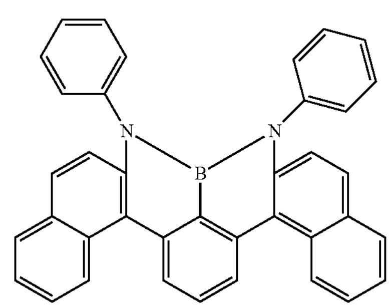 [SMILES: c1ccc(N2B3c4c(cccc4-c4c(ccc5ccccc45)N3c3ccccc3)-c3c2ccc2ccccc32)cc1] | 78% |

-continued
| No. | Reactant 4 | Product | Yield |
|---|---|---|---|
| 6c | 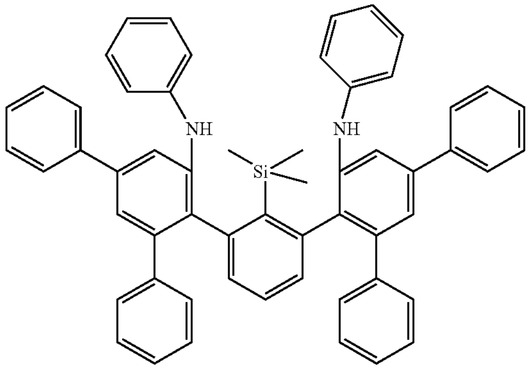 [SMILES: C[Si](C)(C)c1c(-c2c(Nc3ccccc3)cc(-c3ccccc3)cc2-c2ccccc2)cccc1-c1c(Nc2ccccc2)cc(-c2ccccc2)cc1-c1ccccc1] | 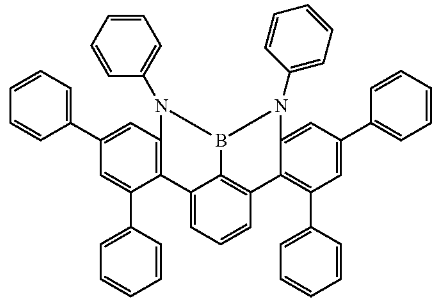 [SMILES: c1ccc(-c2cc(-c3ccccc3)c3c(c2)N(c2ccccc2)B2c4c-3cccc4-c3c(-c4ccccc4)cc(-c4ccccc4)cc3N2c2ccccc2)cc1] | 70% |
| 7c | 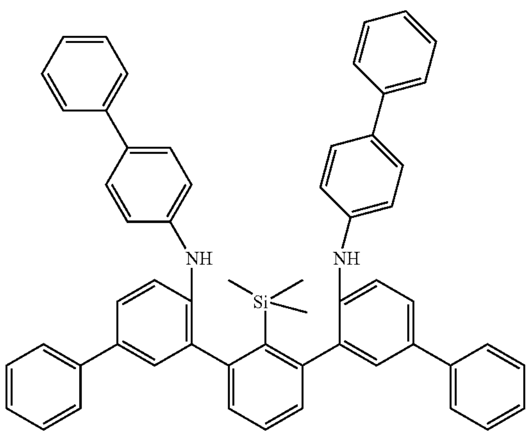 [SMILES: C[Si](C)(C)c1c(-c2cc(-c3ccccc3)ccc2Nc2ccc(-c3ccccc3)cc2)cccc1-c1cc(-c2ccccc2)ccc1Nc1ccc(-c2ccccc2)cc1] | 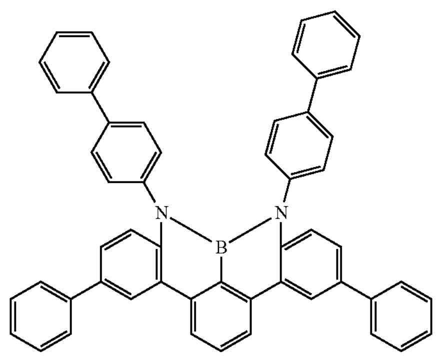 [SMILES: c1ccc(-c2ccc(N3B4c5c(cccc5-c5cc(-c6ccccc6)ccc5N4c4ccc(-c5ccccc5)cc4)-c4cc(-c5ccccc5)ccc43)cc2)cc1] | 74% |
| 8c | 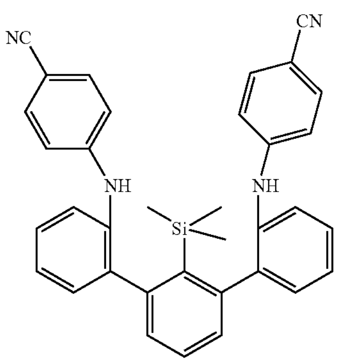 [SMILES: C[Si](C)(C)c1c(-c2ccccc2Nc2ccc(C#N)cc2)cccc1-c1ccccc1Nc1ccc(C#N)cc1] | 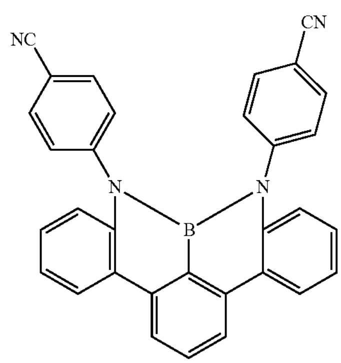 [SMILES: N#Cc1ccc(N2B3c4c(cccc4-c4ccccc4N3c3ccc(C#N)cc3)-c3ccccc32)cc1] | 72% |
| 9c | 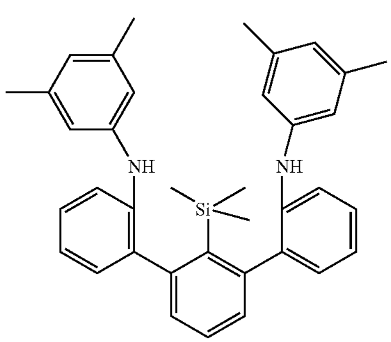 | 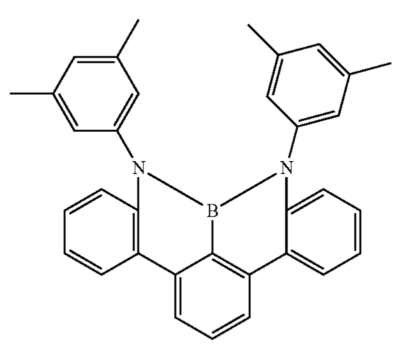 | 76% |

-continued
| No. | Reactant 4 | Product | Yield |
|---|---|---|---|
| 10c | 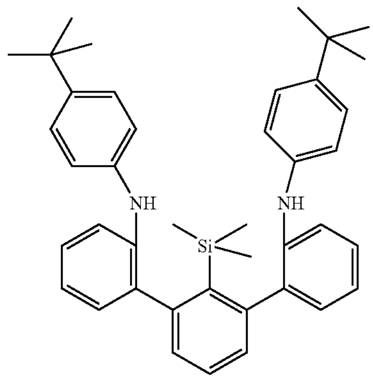 [SMILES: CC(C)(C)c1ccc(Nc2ccccc2-c2cccc(-c3ccccc3Nc3ccc(C(C)(C)C)cc3)c2[Si](C)(C)C)cc1]  | 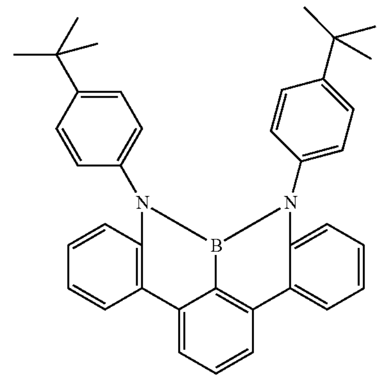 [SMILES: CC(C)(C)c1ccc(N2B3c4c(cccc4-c4ccccc4N3c3ccc(C(C)(C)C)cc3)-c3ccccc32)cc1]  | 69% |
| 11c | 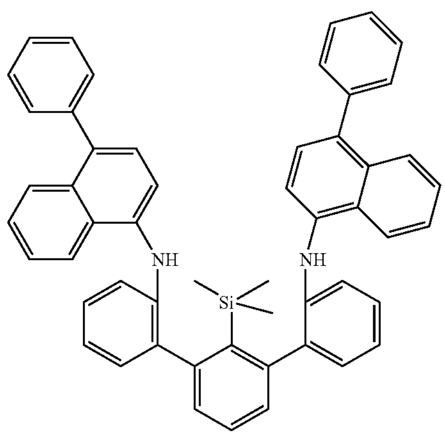 [SMILES: C[Si](C)(C)c1c(-c2ccccc2Nc2ccc(-c3ccccc3)c3ccccc23)cccc1-c1ccccc1Nc1ccc(-c2ccccc2)c2ccccc12]  | 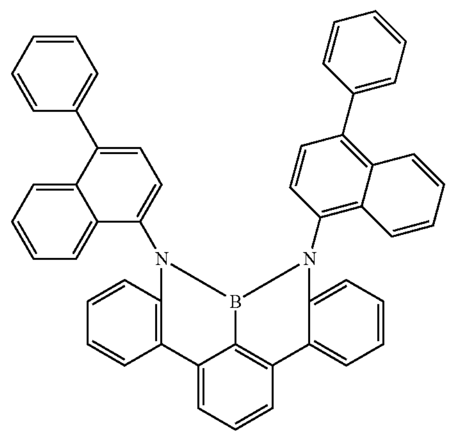 [SMILES: c1ccc(-c2ccc(N3B4c5c(cccc5-c5ccccc5N4c4ccc(-c5ccccc5)c5ccccc45)-c4ccccc43)c3ccccc23)cc1]  | 65% |
| 12c | 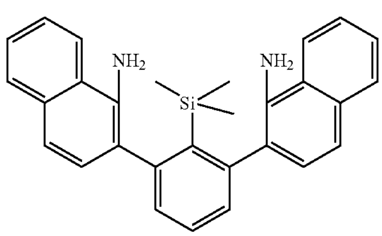 [SMILES: C[Si](C)(C)c1c(-c2ccc3ccccc3c2N)cccc1-c1ccc2ccccc2c1N]  | 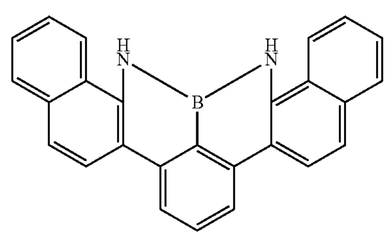 [SMILES: c1cc2c3c(c1)-c1ccc4ccccc4c1NB3Nc1c-2ccc2ccccc12]  | 80% |
| 13c | 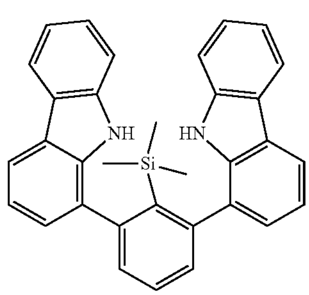 [SMILES: C[Si](C)(C)c1c(-c2cccc3c2[nH]c2ccccc23)cccc1-c1cccc2c1[nH]c1ccccc12]  | 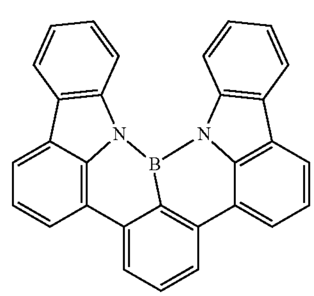 [SMILES: c1cc2c3c(c1)-c1cccc4c5ccccc5n(c14)B3n1c3ccccc3c3cccc-2c31]  | 61% |

-continued
| No. | Reactant 4 | Product | Yield |
| --- | --- | --- | --- |
| 14c | 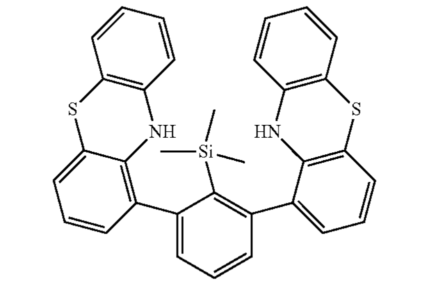 [SMILES: C[Si](C)(C)c1c(-c2cccc3c2Nc2ccccc2S3)cccc1-c1cccc2c1Nc1ccccc1S2] | 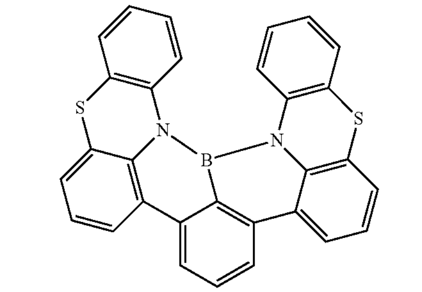 [SMILES: c1ccc2c(c1)Sc1cccc3c1N2B1c2c-3cccc2-c2cccc3c2N1c1ccccc1S3] | 63% |
| 15c | 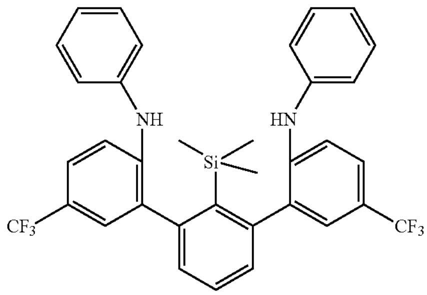 [SMILES: C[Si](C)(C)c1c(-c2cc(C(F)(F)F)ccc2Nc2ccccc2)cccc1-c1cc(C(F)(F)F)ccc1Nc1ccccc1] | 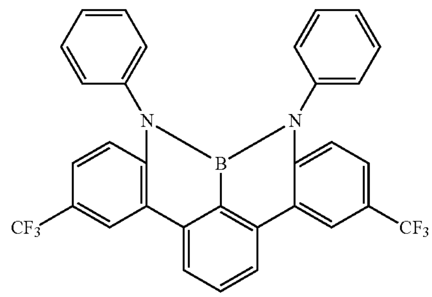 [SMILES: FC(F)(F)c1ccc2c(c1)-c1cccc3c1B(N2c1ccccc1)N(c1ccccc1)c1ccc(C(F)(F)F)cc1-3] | 82% |
| 16c | 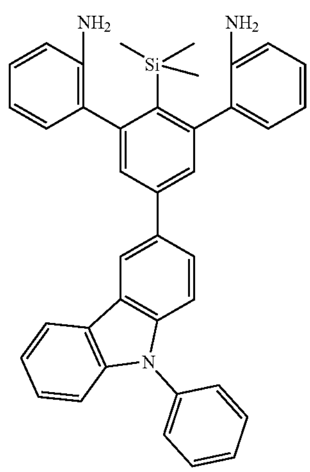 [SMILES: C[Si](C)(C)c1c(-c2ccccc2N)cc(-c2ccc3c(c2)c2ccccc2n3-c2ccccc2)cc1-c1ccccc1N] | 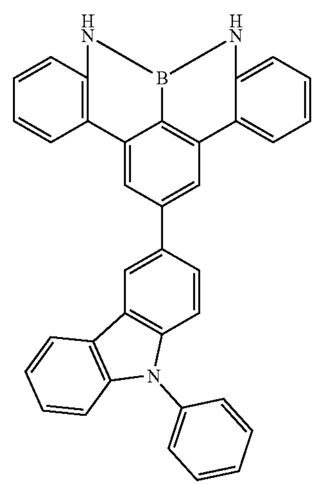 [SMILES: c1ccc(-n2c3ccccc3c3cc(-c4cc5c6c(c4)-c4ccccc4NB6Nc4ccccc4-5)ccc32)cc1] | 79% |
| 17c | 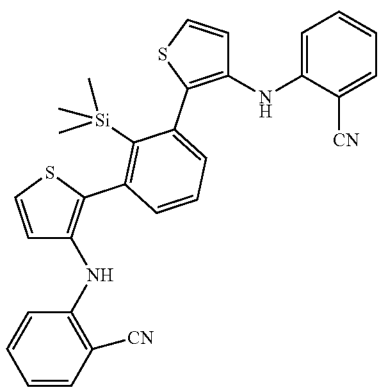 [SMILES: C[Si](C)(C)c1c(-c2sccc2Nc2ccccc2C#N)cccc1-c1sccc1Nc1ccccc1C#N] | 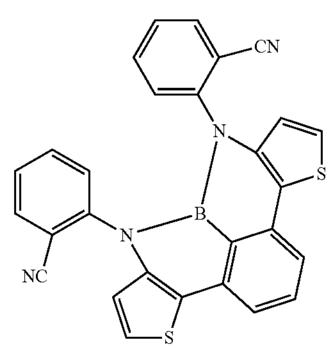 [SMILES: N#Cc1ccccc1N1B2c3c(cccc3-c3sccc3N2c2ccccc2C#N)-c2sccc21] | 70% |

-continued
| No. | Reactant 4 | Product | Yield |
|---|---|---|---|
| 18c | 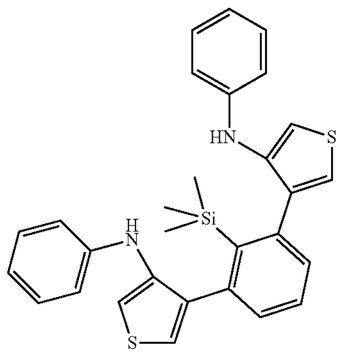 [SMILES: C[Si](C)(C)c1c(-c2cscc2Nc2ccccc2)cccc1-c1cscc1Nc1ccccc1] | 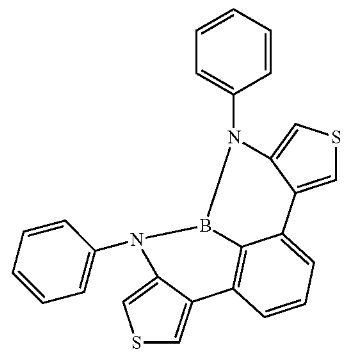 [SMILES: c1ccc(N2B3c4c(cccc4-c4cscc4N3c3ccccc3)-c3cscc32)cc1] | 65% |
| 19c | 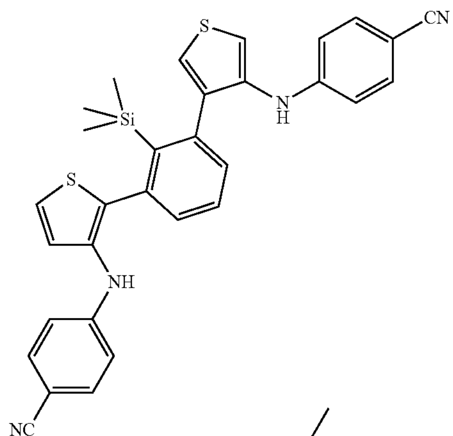 [SMILES: C[Si](C)(C)c1c(-c2cscc2Nc2ccc(C#N)cc2)cccc1-c1sccc1Nc1ccc(C#N)cc1] | 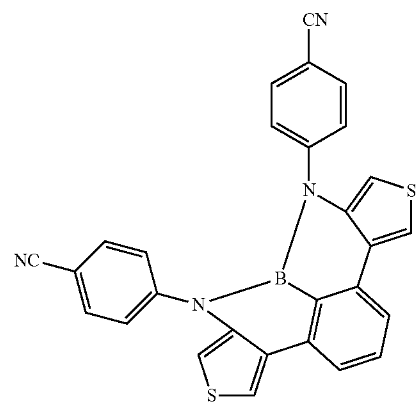 [SMILES: N#Cc1ccc(N2B3c4c(cccc4-c4cscc4N3c3ccc(C#N)cc3)-c3cscc32)cc1] | 73% |
| 20c | 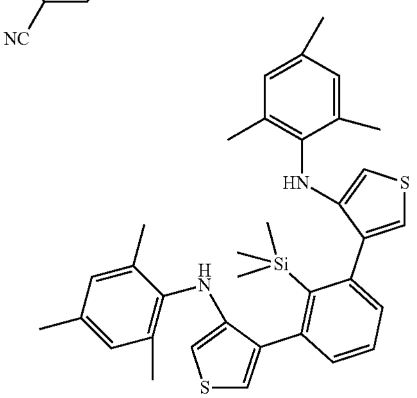 | 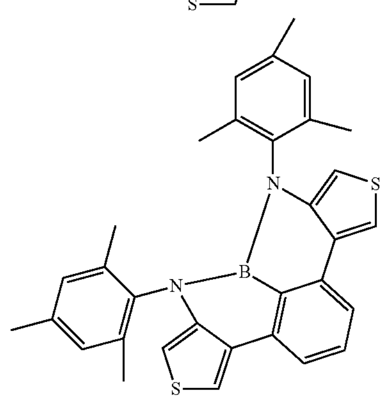 | 59% |
| 21c | 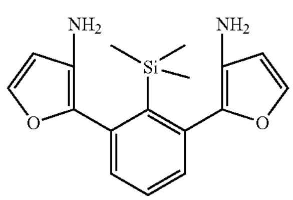 [SMILES: C[Si](C)(C)c1c(-c2occc2N)cccc1-c1occc1N] | 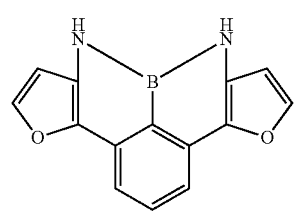 [SMILES: c1cc2c3c(c1)-c1occc1NB3Nc1ccoc1-2] | 52% |
| 22c | 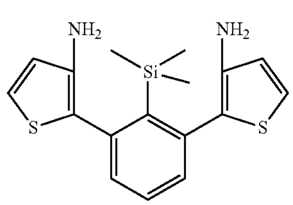 | 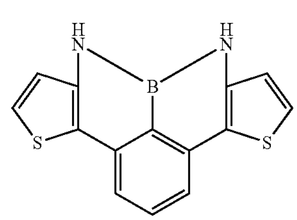 | 58% |

d) 5,12-Dibromo-8,9-bis-(4-tert-butyl-phenyl)-8H, 9H-8,9-diaza-8a-borabenzo[fg]naphthacene

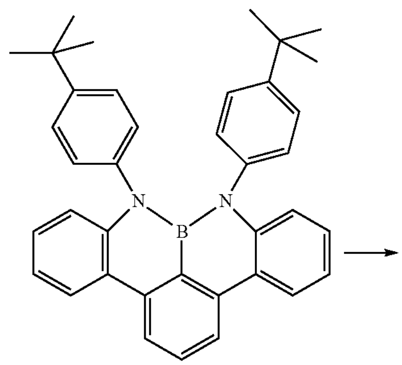

-continued

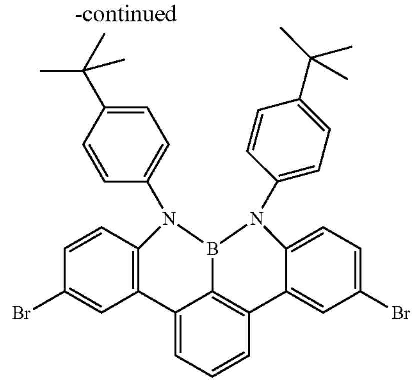

100 g (190.0 mmol) of 8,9-bis(4-tert-butylphenyl)-8H, 9H-8,9-diaza-8a-borabenzo[fg]naphthacene are dissolved in 500 ml of $CH_2Cl_2$ and 150 ml of acetic acid. 34 g (190 mmol) of NBS are added to this suspension in portions and the mixture is stirred in the dark for 9 h. Thereafter, water/ice is added and the solids are removed and washed with ethanol. The residue is recrystallized from toluene. The yield is 98 g (142 mmol), corresponding to 76% of theory.

In an analogous manner, it is possible to obtain the following compounds:

| No. | Reactant 4 | Product | Yield |
|---|---|---|---|
| 1d | 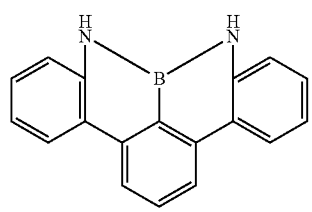 [SMILES: c1ccc2c(c1)NB1Nc3ccccc3-c3cccc-2c31] | 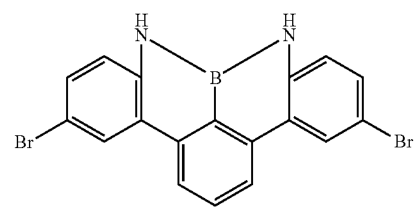 [SMILES: Brc1ccc2c(c1)-c1cccc3c1B(N2)Nc1ccc(Br)cc1-3] | 75% |
| 2d | 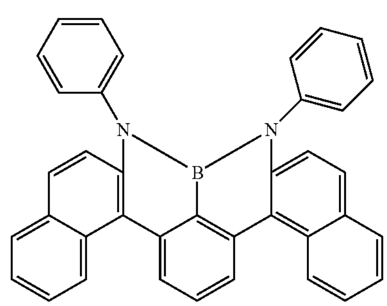 [SMILES: c1ccc(N2B3c4c(cccc4-c4c(ccc5ccccc45)N3c3ccccc3)-c3c2ccc2ccccc32)cc1] | 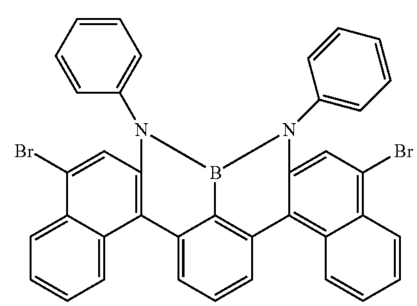 [SMILES: Brc1cc2c(c3ccccc13)-c1cccc3c1B(N2c1ccccc1)N(c1ccccc1)c1cc(Br)c2ccccc2c1-3] | 81% |
| 3d | 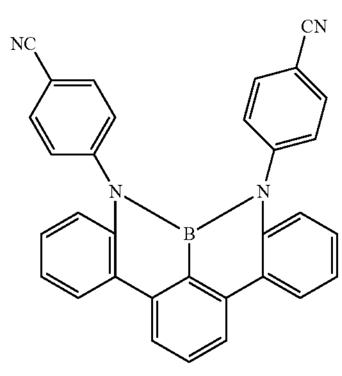 [SMILES: N#Cc1ccc(N2B3c4c(cccc4-c4ccccc4N3c3ccc(C#N)cc3)-c3ccccc32)cc1] | 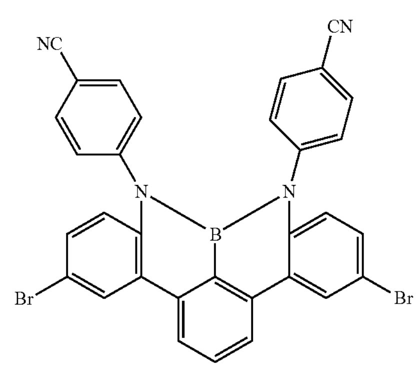 [SMILES: N#Cc1ccc(N2B3c4c(cccc4-c4cc(Br)ccc4N3c3ccc(C#N)cc3)-c3cc(Br)ccc32)cc1] | 83% |

-continued
| No. | Reactant 4 | Product | Yield |
|---|---|---|---|
| 4d | 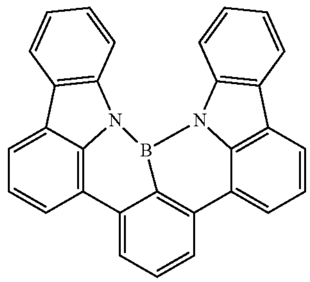 [SMILES: c1cc2c3c(c1)-c1cccc4c5ccccc5n(c14)B3n1c3ccccc3c3cccc-2c31] | 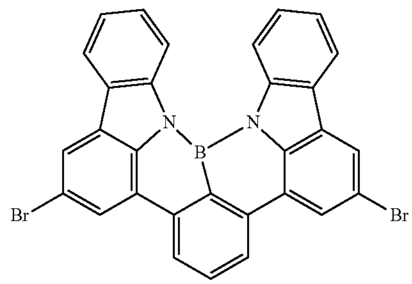 [SMILES: Brc1cc2c3c(c1)c1ccccc1n3B1c3c-2cccc3-c2cc(Br)cc3c4ccccc4n1c23] | 62% |
| 5d | 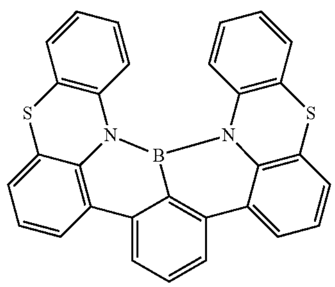 [SMILES: c1ccc2c(c1)Sc1cccc3c1N2B1c2c-3cccc2-c2cccc3c2N1c1ccccc1S3] | 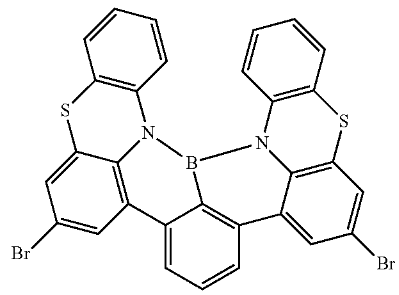 [SMILES: Brc1cc2c3c(c1)-c1cccc4c1B(N3c1ccccc1S2)N1c2ccccc2Sc2cc(Br)cc-4c21] | 65% |
| 6d | 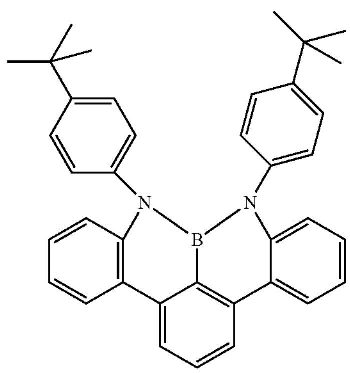 2 eq | 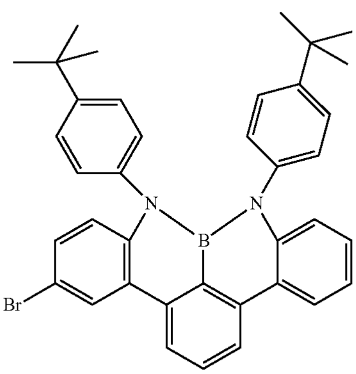 [SMILES: CC(C)(C)c1ccc(N2B3c4c(cccc4-c4cc(Br)ccc4N3c3ccc(C(C)(C)C)cc3)-c3ccccc32)cc1] | 56% |
| 7d | 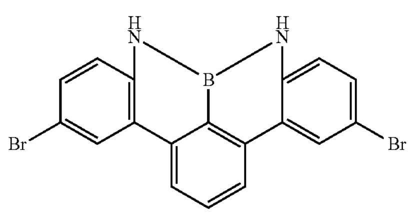 2 eq | 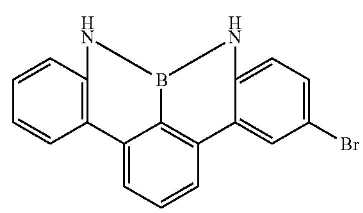 [SMILES: Brc1ccc2c(c1)-c1cccc3c1B(Nc1ccccc1-3)N2] | 53% |
The following compounds can be obtained analogously to method b:

| No. | Reactant 1 | Reactant 2 | Product | Yield |
|---|---|---|---|---|
| 19b | 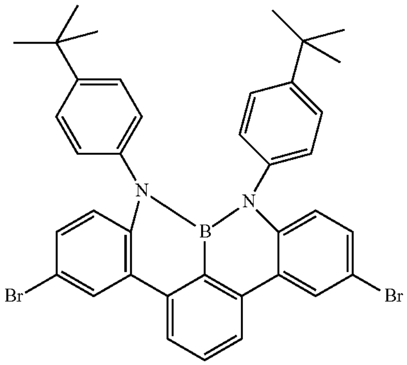 [SMILES: CC(C)(C)c1ccc(N2B3c4c(cccc4-c4cc(Br)ccc4N3c3ccc(C(C)(C)C)cc3)-c3cc(Br)ccc32)cc1] | 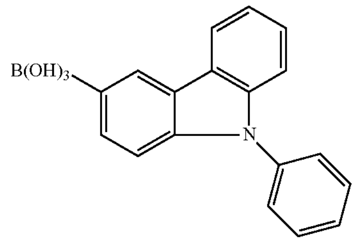 | 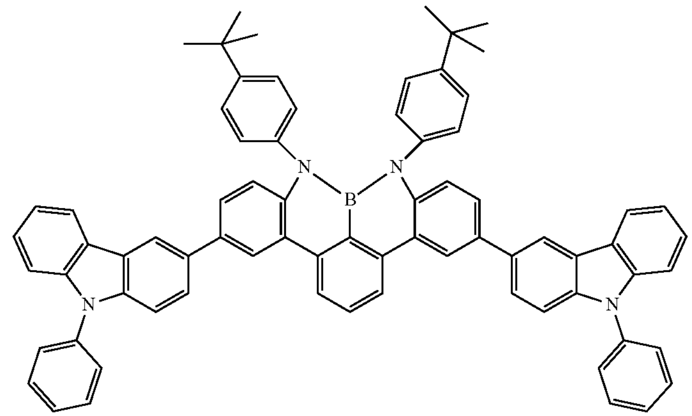 [SMILES: CC(C)(C)c1ccc(N2B3c4c(cccc4-c4cc(-c5ccc6c(c5)c5ccccc5n6-c5ccccc5)ccc4N3c3ccc(C(C)(C)C)cc3)-c3cc(-c4ccc5c(c4)c4ccccc4n5-c4ccccc4)ccc32)cc1] | 61% |
| 20b | 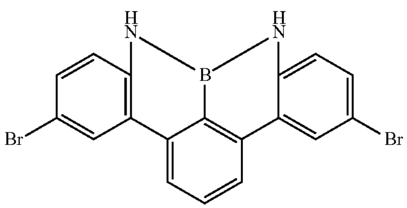 | 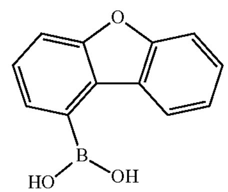 [162607-19-4] | 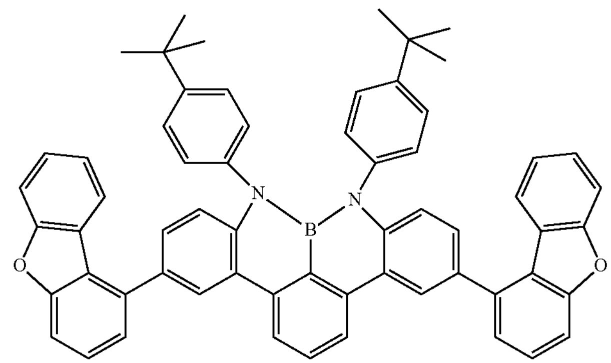 [SMILES: CC(C)(C)c1ccc(N2B3c4c(cccc4-c4cc(-c5cccc6oc7ccccc7c56)ccc4N3c3ccc(C(C)(C)C)cc3)-c3cc(-c4cccc5oc6ccccc6c45)ccc32)cc1] | 70% |

-continued
| No. | Reactant 1 | Reactant 2 | Product | Yield |
| --- | --- | --- | --- | --- |
| 21b | 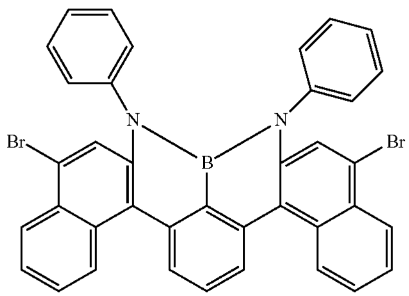 | 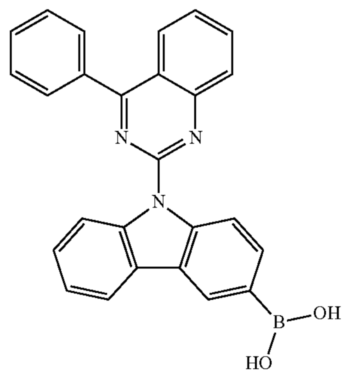 [1642121-58-1] | 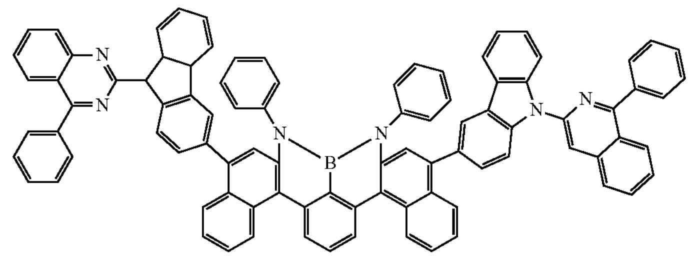 [SMILES: C1=CC2c3cc(-c4cc5c(c6ccccc46)-c4cccc6c4B(N5c4ccccc4)N(c4ccccc4)c4cc(-c5ccc7c(c5)c5ccccc5n7-c5cc7ccccc7c(-c7ccccc7)n5)c5ccccc5c4-6)ccc3C(c3nc(-c4ccccc4)c4ccccc4n3)C2C=C1] | 76% |
| 22b | 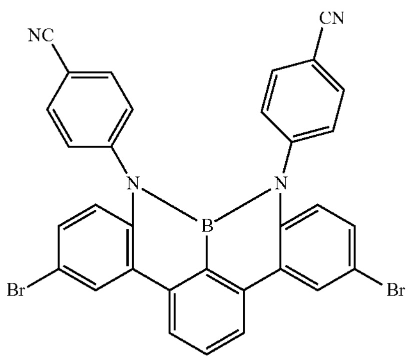 [SMILES: N#Cc1ccc(N2B3c4c(cccc4-c4cc(Br)ccc4N3c3ccc(C#N)cc3)-c3cc(Br)ccc32)cc1] | 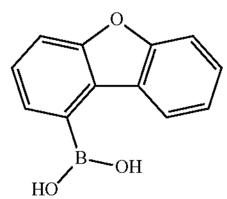 [162607-19-4] | 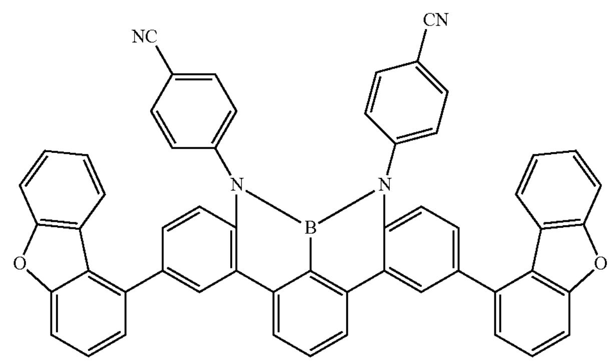 [SMILES: N#Cc1ccc(N2B3c4c(cccc4-c4cc(-c5cccc6oc7ccccc7c56)ccc4N3c3ccc(C#N)cc3)-c3cc(-c4cccc5oc6ccccc6c45)ccc32)cc1] | 70% |
| 23b | 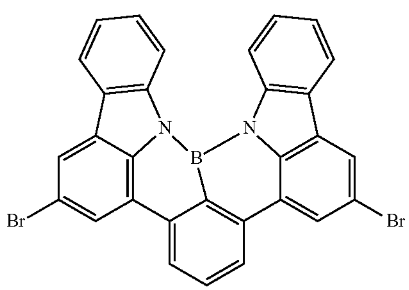 [SMILES: Brc1cc2c3c(c1)c1ccccc1n3B1c3c-2cccc3-c2cc(Br)cc3c4ccccc4n1c23] | 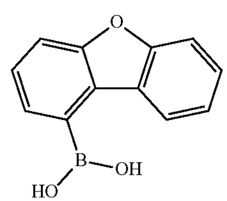 [162607-19-4] | 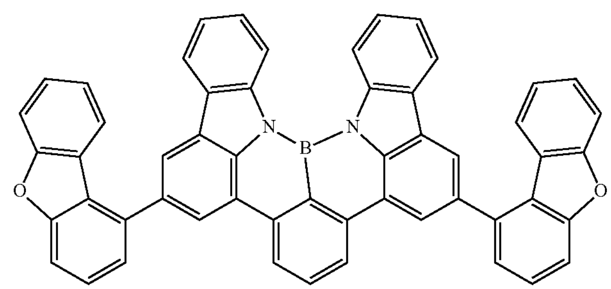 [SMILES: c1cc2c3c(c1)-c1cc(-c4cccc5oc6ccccc6c45)cc4c5ccccc5n(c14)B3n1c3ccccc3c3cc(-c4cccc5oc6ccccc6c45)cc-2c31] | 71% |

-continued
| No. | Reactant 1 | Reactant 2 | Product | Yield |
| --- | --- | --- | --- | --- |
| 24b | 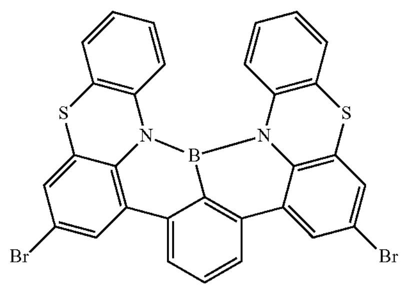 [SMILES: Brc1cc2c3c(c1)-c1cccc4c1B(N3c1ccccc1S2)N1c2ccccc2Sc2cc(Br)cc-4c21] | 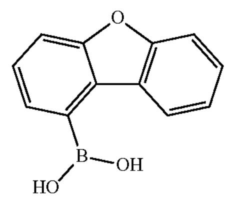 [162607-19-4] | 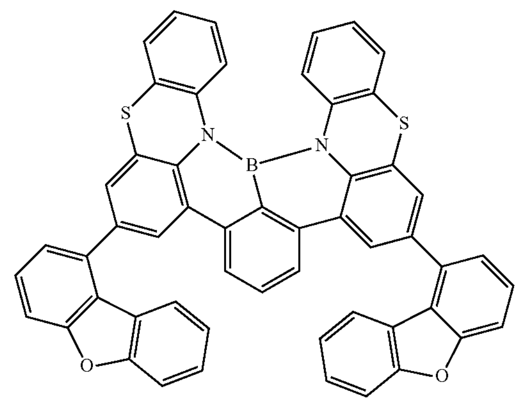 [SMILES: c1ccc2c(c1)Sc1cc(-c3cccc4oc5ccccc5c34)cc3c1N2B1c2c-3cccc2-c2cc(-c3cccc4oc5ccccc5c34)cc3c2N1c1ccccc1S3] | 78% |
| 25b | 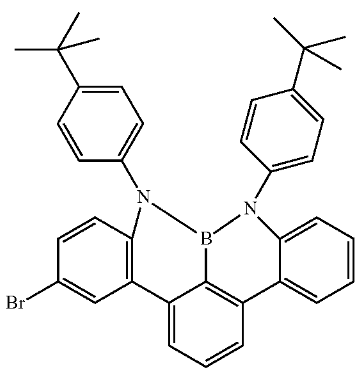 [SMILES: CC(C)(C)c1ccc(N2B3c4c(cccc4-c4cc(Br)ccc4N3c3ccc(C(C)(C)C)cc3)-c3ccccc32)cc1] | 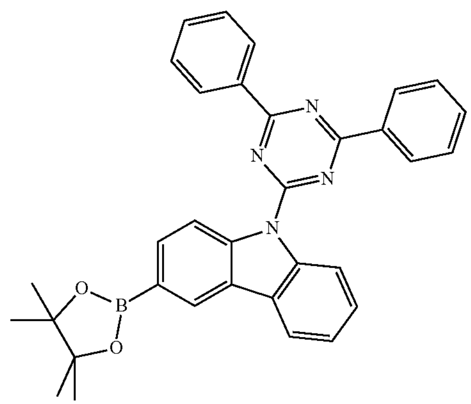 [1361064-01-8] | 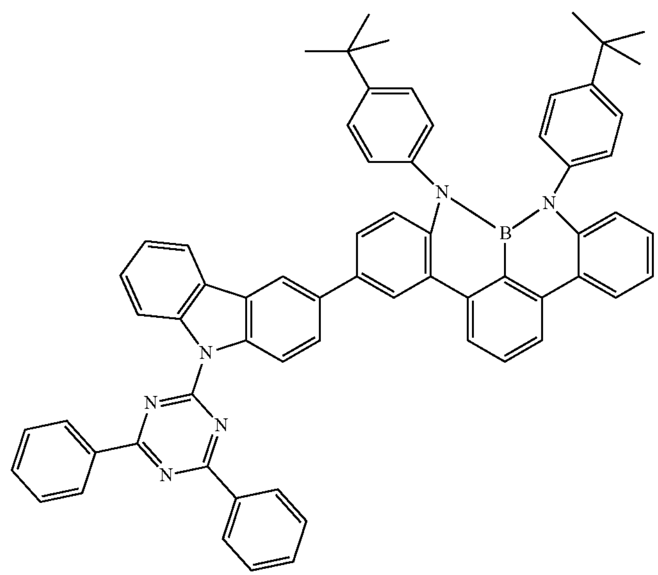 [SMILES: CC(C)(C)c1ccc(N2B3c4c(cccc4-c4cc(-c5ccc6c(c5)c5ccccc5n6-c5nc(-c6ccccc6)nc(-c6ccccc6)n5)ccc4N3c3ccc(C(C)(C)C)cc3)-c3ccccc32)cc1] | 65% |

-continued
| No. | Reactant 1 | Reactant 2 | Product | Yield |
| --- | --- | --- | --- | --- |
| 26b | 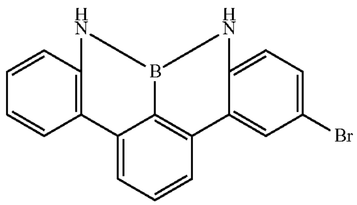 [SMILES: Brc1ccc2c(c1)-c1cccc3c1B(Nc1ccccc1-3)N2] | 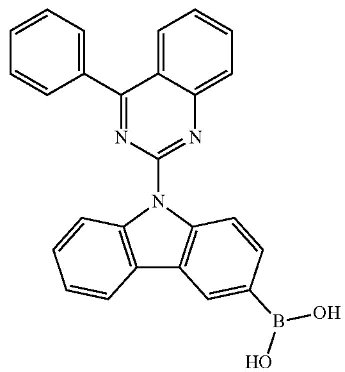 [1542121-58-1] | 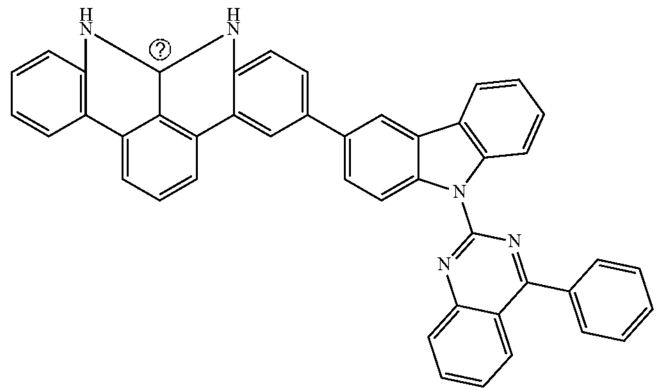 [SMILES: c1ccc(-c2nc(-n3c4ccccc4c4cc(-c5ccc6c(c5)-c5cccc7c5C(Nc5ccccc5-7)N6)ccc43)nc3ccccc23)cc1] | 66% |
| 27b | 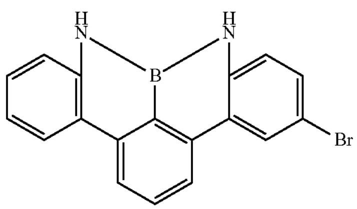 [SMILES: Brc1ccc2c(c1)-c1cccc3c1B(Nc1ccccc1-3)N2] | 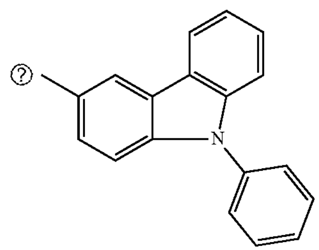 [SMILES: Cc1ccc2c(c1)c1ccccc1n2-c1ccccc1] | 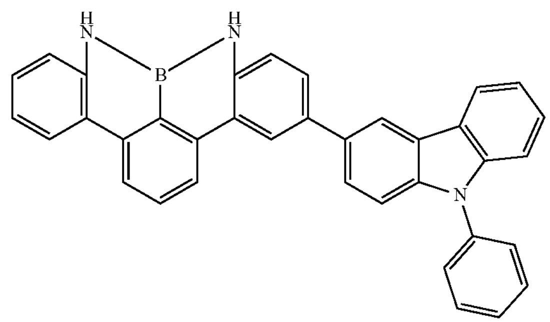 [SMILES: c1ccc(-n2c3ccccc3c3cc(-c4ccc5c(c4)-c4cccc6c4B(Nc4ccccc4-6)N5)ccc32)cc1] | 74% |

-continued
| No. | Reactant 1 | Reactant 2 | Product | Yield |
|---|---|---|---|---|
| 28b | 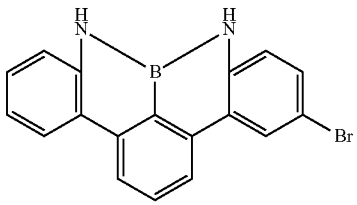 [SMILES: Brc1ccc2c(c1)-c1cccc3c1B(Nc1ccccc1-3)N2] | 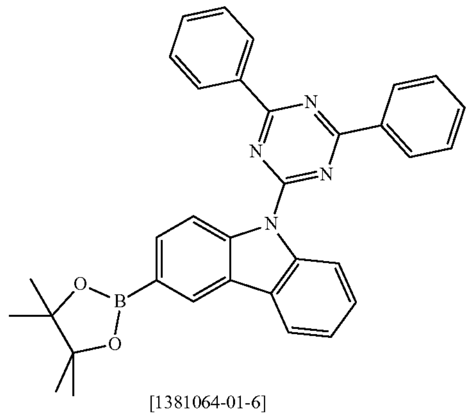 [SMILES: CC1(C)OB(c2ccc3c(c2)c2ccccc2n3-c2nc(-c3ccccc3)nc(-c3ccccc3)n2)OC1(C)C] [1381064-01-6] | 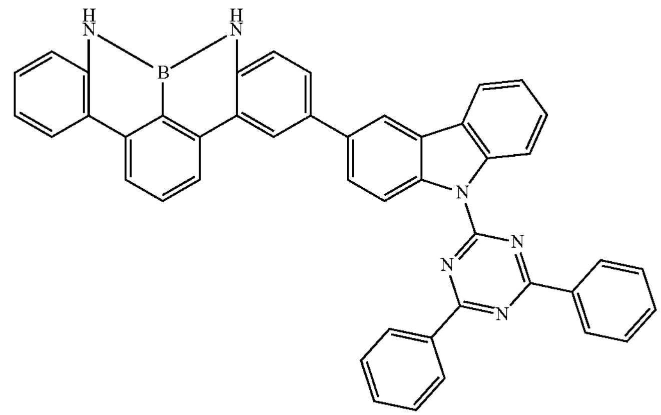 [SMILES: c1ccc(-c2nc(-c3ccccc3)nc(-n3c4ccccc4c4cc(-c5ccc6c(c5)-c5cccc7c5B(Nc5ccccc5-7)N6)ccc43)n2)cc1] | 76% |
| 29b | 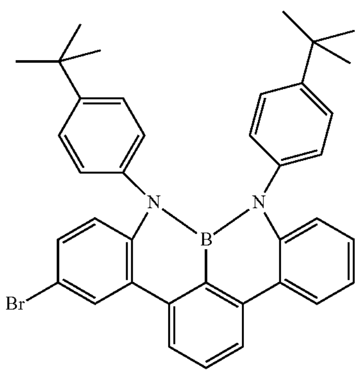 [SMILES: CC(C)(C)c1ccc(N2B3c4c(cccc4-c4cc(Br)ccc4N3c3ccc(C(C)(C)C)cc3)-c3ccccc32)cc1] | 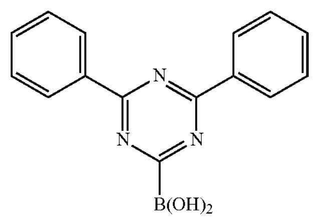 [1251825-65-6] | 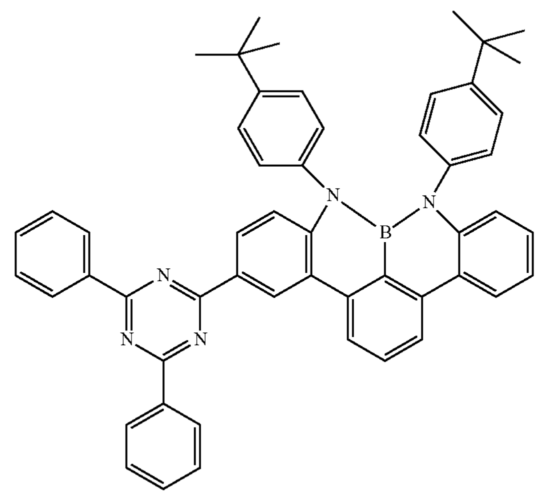 [SMILES: CC(C)(C)c1ccc(N2B3c4c(cccc4-c4cc(-c5nc(-c6ccccc6)nc(-c6ccccc6)n5)ccc4N3c3ccc(C(C)(C)C)cc3)-c3ccccc32)cc1] | 59% |

e) 8-(4,6-Diphenyl-[1,3,5]triazin-2-yl)-9-phenyl-8H, 9H-8,9-diaza-8a-borabenzo[fg]naphthacene

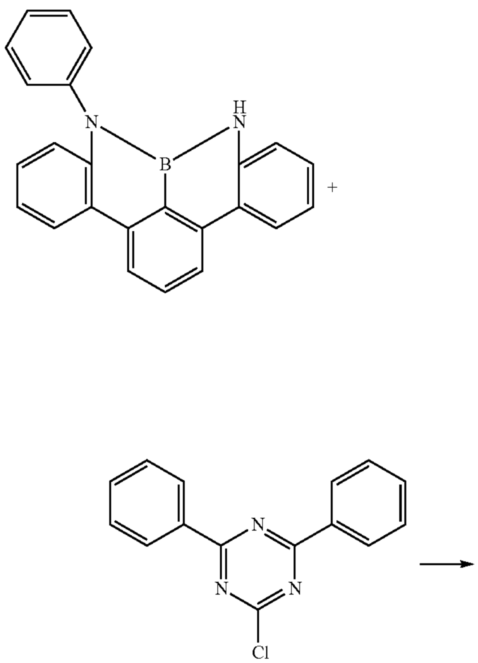

-continued

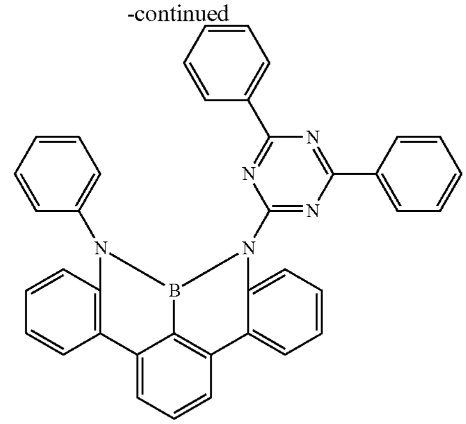

4.3 g of NaH, 60% in mineral oil, (107 mmol) is dissolved in 300 ml of dimethylformamide under a protective atmosphere. 36 g (107 mmol) of 8-phenyl-8H,9H-8,9-diaza-8a-borabenzo[fg]naphthacene is dissolved in 250 ml of DMF and added dropwise to the reaction mixture. After 1 h at room temperature, a solution of 28.5 g (107 mmol) of 2-chloro-4,6-diphenyl-[1,3,5]triazine in 200 ml of THF is added dropwise. The reaction mixture is stirred at room temperature for 12 h and then poured onto ice. After warming to room temperature, the solids that precipitate out are filtered and washed with ethanol and heptane. The residue is subjected to hot extraction with toluene, recrystallized from toluene/n-heptane and finally sublimed under high vacuum. The yield is 36 g (62 mmol; 60%); purity 99.9%.

In an analogous manner, it is possible to obtain the following compounds:

| No. | Reactant 1 | Reactant 2 | Product | Yield |
| --- | --- | --- | --- | --- |
| 1e | 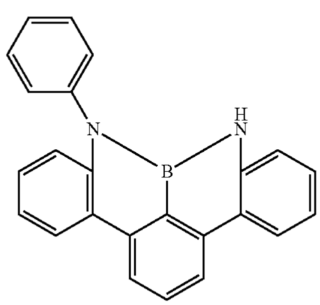 [SMILES: c1ccc(N2B3Nc4ccccc4-c4cccc(c43)-c3ccccc32)cc1] | 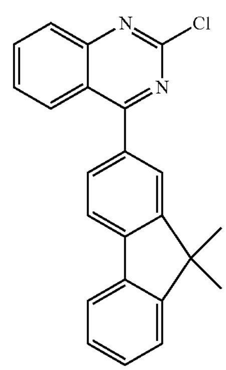 [1373265-66-7] | 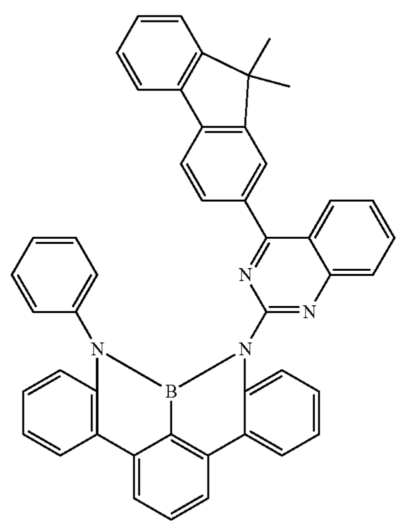 [SMILES: CC1(C)c2ccccc2-c2ccc(-c3nc(N4B5c6c(cccc6-c6ccccc64)-c4ccccc4N5c4ccccc4)nc4ccccc34)cc21] | 61% |

-continued
| No. | Reactant 1 | Reactant 2 | Product | Yield |
| --- | --- | --- | --- | --- |
| 2e | 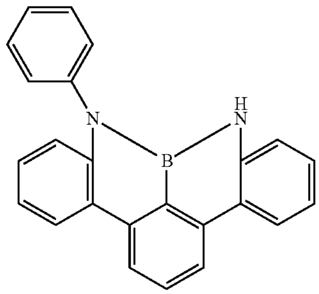 [SMILES: c1ccc(N2B3Nc4ccccc4-c4cccc(c43)-c3ccccc32)cc1] | 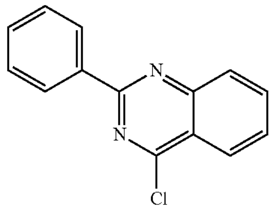 [6484-25-9] | 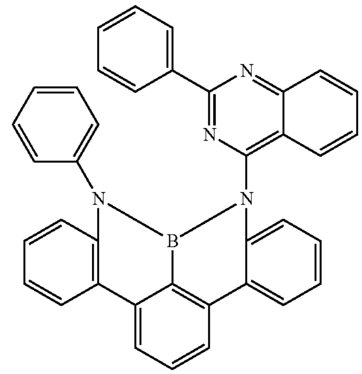 [SMILES: c1ccc(-c2nc(N3B4c5c(cccc5-c5ccccc53)-c3ccccc3N4c3ccccc3)c3ccccc3n2)cc1] | 58% |
| 3e | 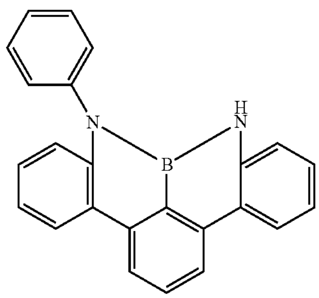 [SMILES: c1ccc(N2B3Nc4ccccc4-c4cccc(c43)-c3ccccc32)cc1] | 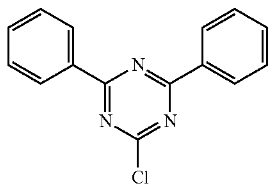 [3842-55-5] | 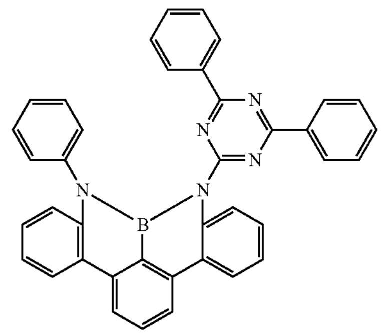 [SMILES: c1ccc(-c2nc(-c3ccccc3)nc(N3B4c5c(cccc5-c5ccccc53)-c3ccccc3N4c3ccccc3)n2)cc1] | 62% |
| 4e | 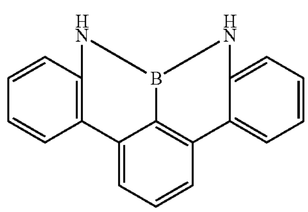 [SMILES: c1ccc2c(c1)NB1Nc3ccccc3-c3cccc-2c31] | 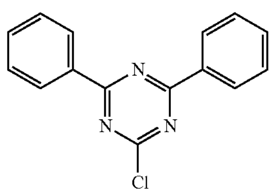 [3842-55-5] | 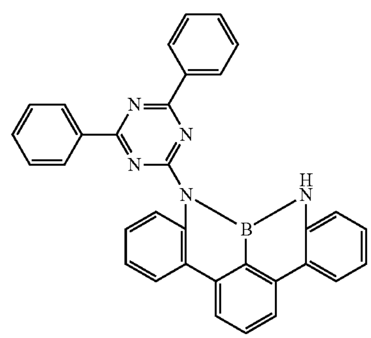 [SMILES: c1ccc(-c2nc(-c3ccccc3)nc(N3B4Nc5ccccc5-c5cccc(c54)-c4ccccc43)n2)cc1] | 61% |
| 5e | 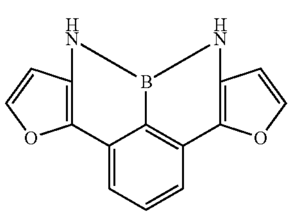 [SMILES: c1cc2c3c(c1)-c1occc1NB3Nc1ccoc1-2] | 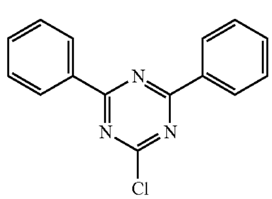 [3842-55-5] | 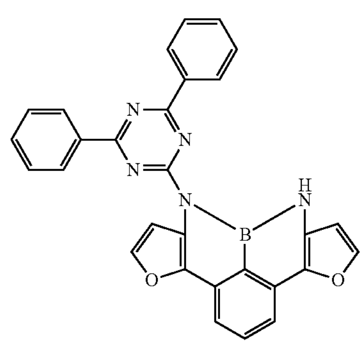 [SMILES: c1ccc(-c2nc(-c3ccccc3)nc(N3B4Nc5ccoc5-c5cccc(c54)-c4occc43)n2)cc1] | 60% |

-continued

| No. | Reactant 1 | Reactant 2 | Product | Yield |
|---|---|---|---|---|
| 6e | 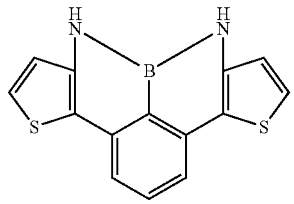 | 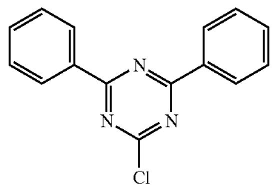 [3842-55-5] | 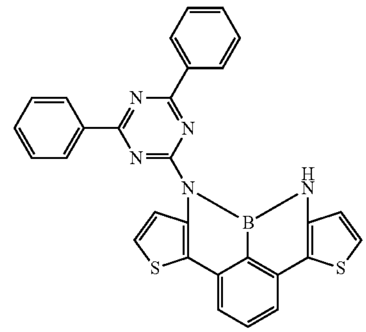 | 58% |

f) 8-[3-(4,6-Diphenyl-[1,3,5]triazin-2-yl)phenyl]-9-phenyl-8H,9H-8,9-diaza-8a-borabenzo[fg]naphthacene

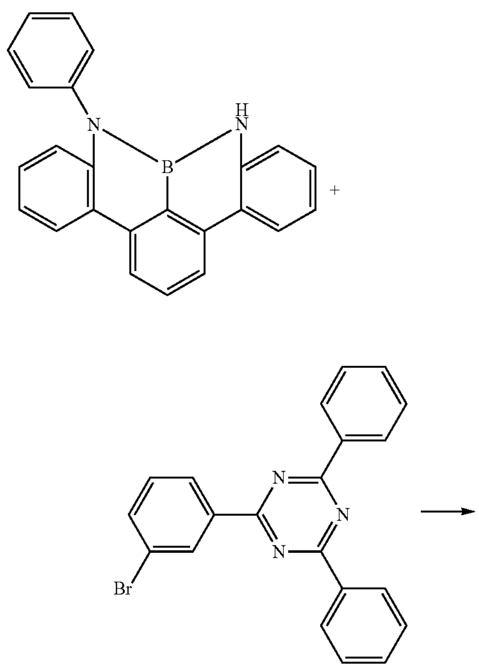

-continued

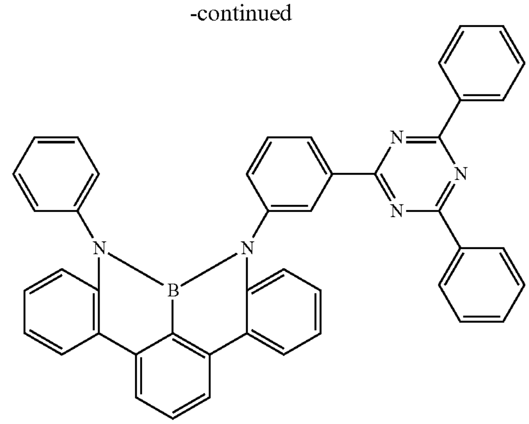

22.5 g (66 mmol) of 8-phenyl-8H,9H-8,9-diaza-8a-borabenzo[fg]naphthacene, 28.5 g (73 mmol) of 3-bromo-(4,6-diphenyl-[1,3,5]triazin-2-yl)benzene and 19 g of NaOtBu are suspended in 1 l of p-xylene. To this suspension are added 0.3 g (1.33 mmol) of $Pd(OAc)_2$ and 1.0 ml of a 1M tri-tert-butylphosphine solution in toluene. The reaction mixture is heated under reflux for 16 h. After cooling, methylene chloride is added, and the organic phase is removed, washed three times with 200 ml of water and then concentrated to dryness. The residue is subjected to hot extraction with toluene, recrystallized from toluene and finally sublimed under high vacuum. The purity is 99.9%. The yield is 29 g (45 mmol; 70%).

In an analogous manner, it is possible to obtain the following compounds:

| No. | Reactant 1 | Reactant 2 | Product | Yield |
|---|---|---|---|---|
| 1f | 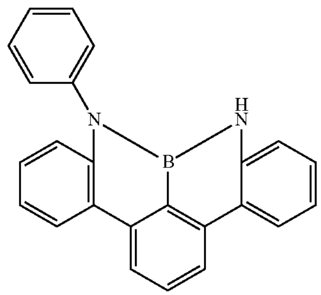 [SMILES: c1ccc(N2B3Nc4ccccc4-c4cccc(c43)-c3ccccc32)cc1] | 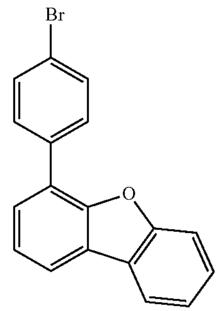 [1225053-54-2] | 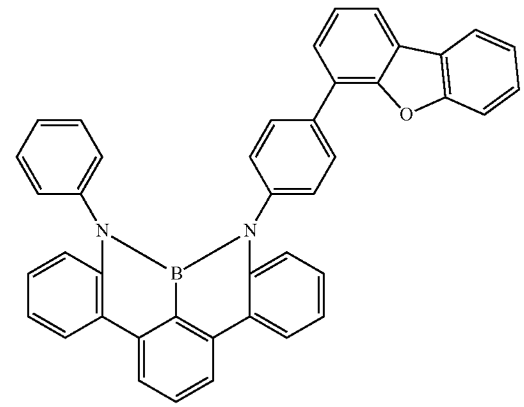 [SMILES: c1ccc(N2B3c4c(cccc4-c4ccccc4N3c3ccc(-c4cccc5c4oc4ccccc45)cc3)-c3ccccc32)cc1] | 61% |
| 2f | 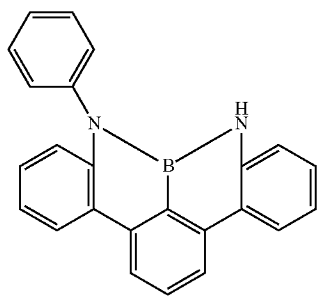 [SMILES: c1ccc(N2B3Nc4ccccc4-c4cccc(c43)-c3ccccc32)cc1] | 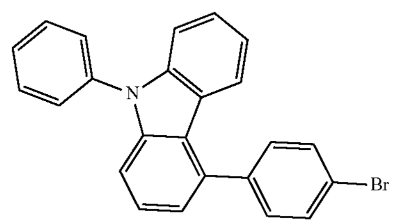 [1505512-06 - 6] | 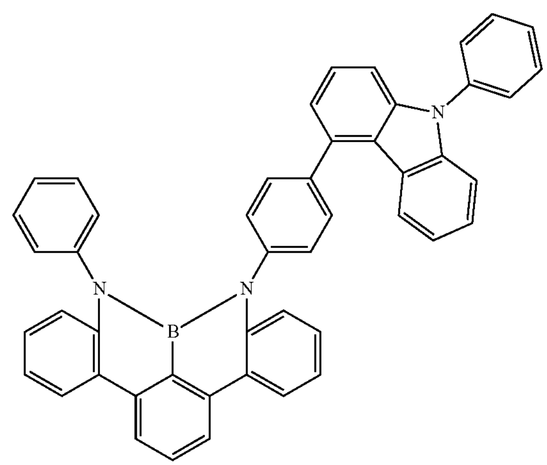 [SMILES: c1ccc(N2B3c4c(cccc4-c4ccccc4N3c3ccc(-c4cccc5c4c4ccccc4n5-c4ccccc4)cc3)-c3ccccc32)cc1] | 58% |

-continued
| No. | Reactant 1 | Reactant 2 | Product | Yield |
|---|---|---|---|---|
| 3f | 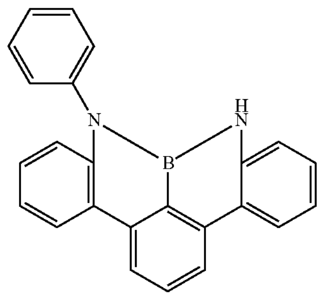 [SMILES: c1ccc(N2B3Nc4ccccc4-c4cccc(c43)-c3ccccc32)cc1] | 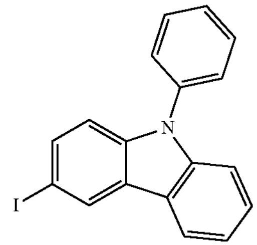 [502161-03-7] | 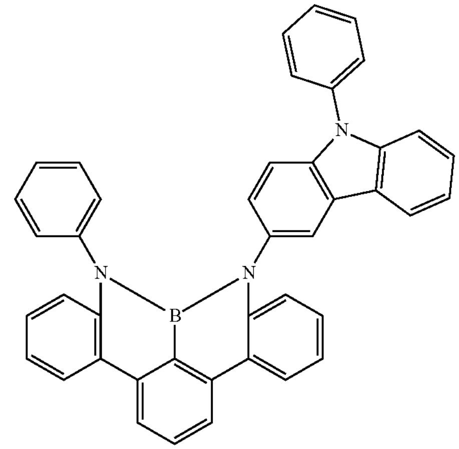 [SMILES: c1ccc(N2B3c4c(cccc4-c4ccccc4N3c3ccc4c(c3)c3ccccc3n4-c3ccccc3)-c3ccccc32)cc1] | 62% |
| 4f | 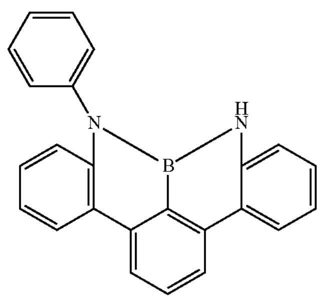 [SMILES: c1ccc(N2B3Nc4ccccc4-c4cccc(c43)-c3ccccc32)cc1] | 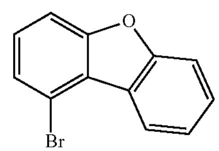 [50548-45-3] | 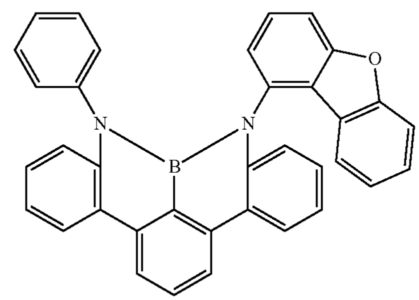 [SMILES: c1ccc(N2B3c4c(cccc4-c4ccccc4N3c3cccc4oc5ccccc5c34)-c3ccccc32)cc1] | 61% |
| 5f | 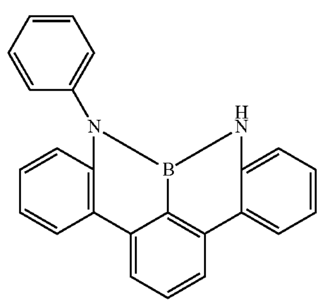 [SMILES: c1ccc(N2B3Nc4ccccc4-c4cccc(c43)-c3ccccc32)cc1] | 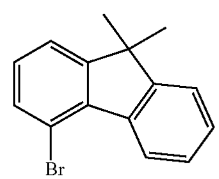 [942615-32-9] | 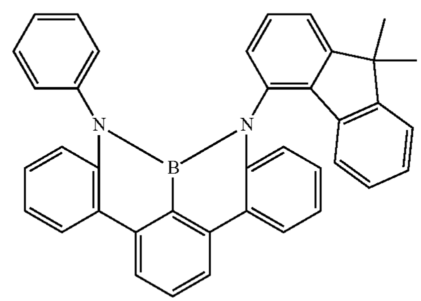 [SMILES: CC1(C)c2ccccc2-c2c(N3B4c5c(cccc5-c5ccccc53)-c3ccccc3N4c3ccccc3)cccc21] | 72% |

-continued
| No. | Reactant 1 | Reactant 2 | Product | Yield |
|---|---|---|---|---|
| 6f | 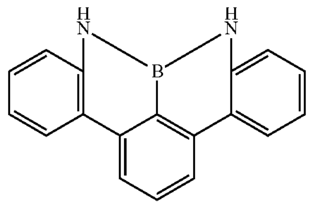 [SMILES: c1ccc2c(c1)NB1Nc3ccccc3-c3cccc-2c31] | 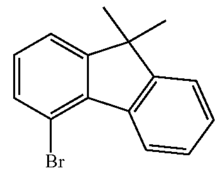 [942615-32-9] | 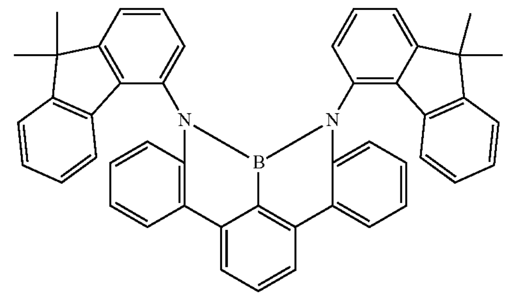 | 80% |
| 7f | 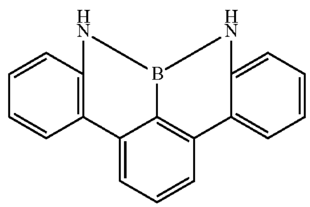 [SMILES: c1ccc2c(c1)NB1Nc3ccccc3-c3cccc-2c31] | 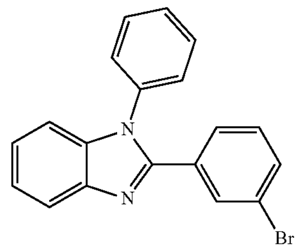 [760212-40-6] | 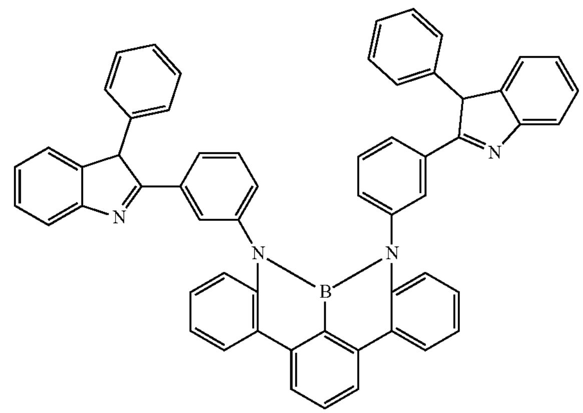 [SMILES: c1ccc(C2C(c3cccc(N4B5c6c(cccc6-c6ccccc6N5c5cccc(C6=Nc7ccccc7C6c6ccccc6)c5)-c5ccccc54)c3)=Nc3ccccc32)cc1] | 69% |

-continued
| No. | Reactant 1 | Reactant 2 | Product | Yield |
|---|---|---|---|---|
| 8f | 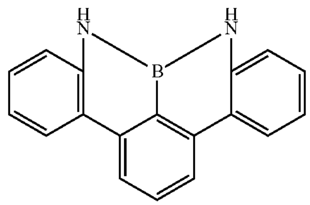 [SMILES: c1ccc2c(c1)NB1Nc3ccccc3-c3cccc-2c31] | 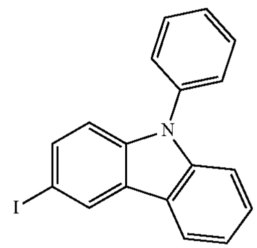 [602151-03-7] | 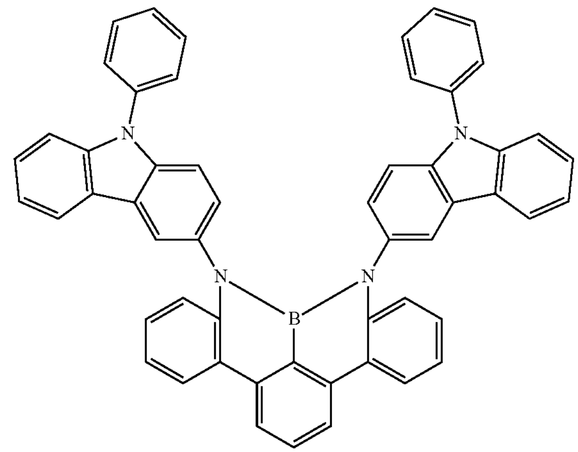 [SMILES: c1ccc(-n2c3ccccc3c3cc(N4B5c6c(cccc6-c6ccccc6N5c5ccc6c(c5)c5ccccc5n6-c5ccccc5)-c5ccccc54)ccc32)cc1] | 84% |
| 9f | 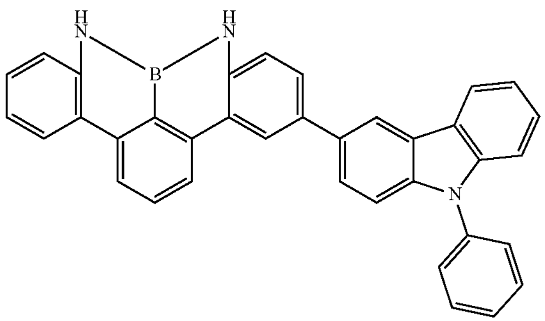 [SMILES: c1ccc(-n2c3ccccc3c3cc(-c4ccc5c(c4)-c4cccc6c4B(Nc4ccccc4-6)N5)ccc32)cc1] | 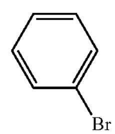 | 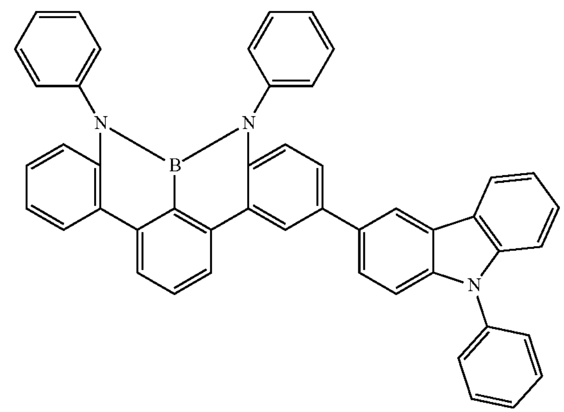 [SMILES: c1ccc(N2B3c4c(cccc4-c4cc(-c5ccc6c(c5)c5ccccc5n6-c5ccccc5)ccc4N3c3ccccc3)-c3ccccc32)cc1] | 80% |

-continued
| No. | Reactant 1 | Reactant 2 | Product | Yield |
| --- | --- | --- | --- | --- |
| 10f | 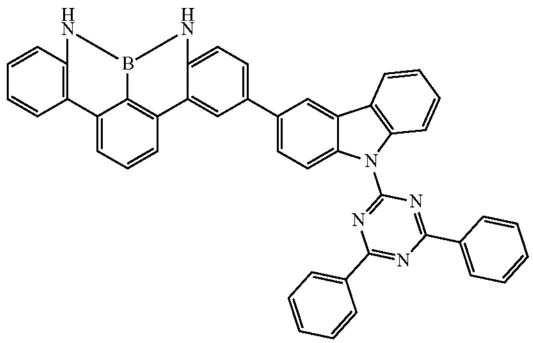 [SMILES: c1ccc(-c2nc(-c3ccccc3)nc(-n3c4ccccc4c4cc(-c5ccc6c(c5)-c5cccc7c5B(Nc5ccccc5-7)N6)ccc43)n2)cc1] | 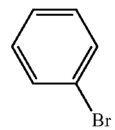 | 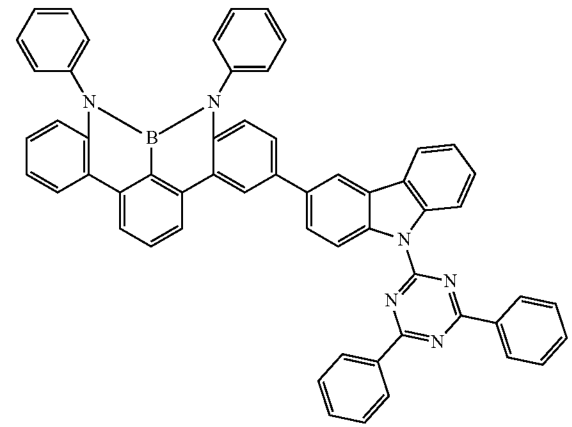 [SMILES: c1ccc(-c2nc(-c3ccccc3)nc(-n3c4ccccc4c4cc(-c5ccc6c(c5)-c5cccc7c5B(N(c5ccccc5)c5ccccc5-7)N6c5ccccc5)ccc43)n2)cc1] | 81% |
| 11f | 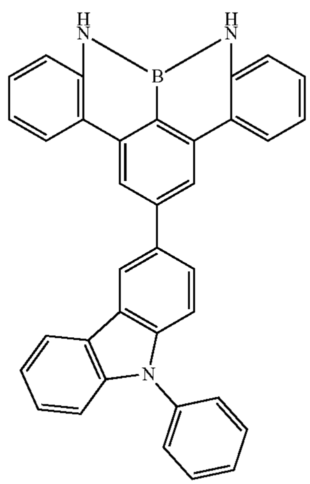 [SMILES: c1ccc(-n2c3ccccc3c3cc(-c4cc5c6c(c4)-c4ccccc4NB6Nc4ccccc4-5)ccc32)cc1] | 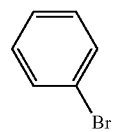 | 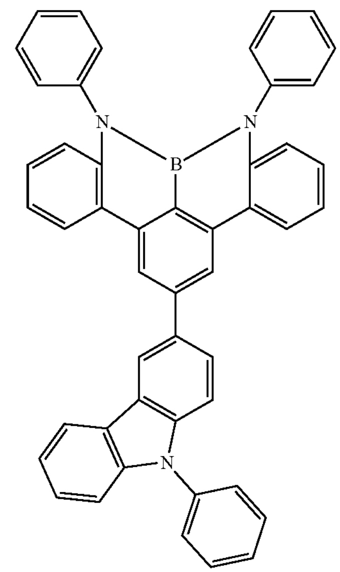 [SMILES: c1ccc(N2B3c4c(cc(-c5ccc6c(c5)c5ccccc5n6-c5ccccc5)cc4-c4ccccc4N3c3ccccc3)-c3ccccc32)cc1] | 76% |

-continued
| No. | Reactant 1 | Reactant 2 | Product | Yield |
|---|---|---|---|---|
| 12f | 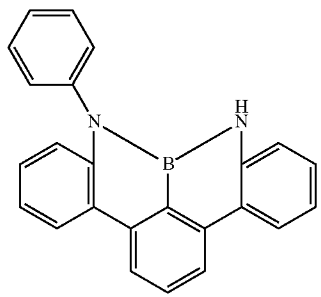 [SMILES: c1ccc(N2B3Nc4ccccc4-c4cccc(c43)-c3ccccc32)cc1] | 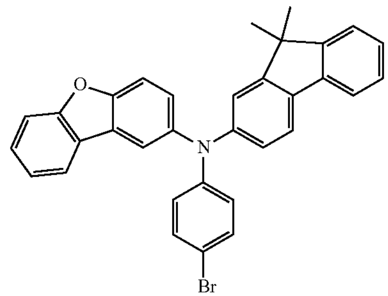 [SMILES: CC1(C)c2ccccc2-c2ccc(N(c3ccc(Br)cc3)c3ccc4oc5ccccc5c4c3)cc21] | 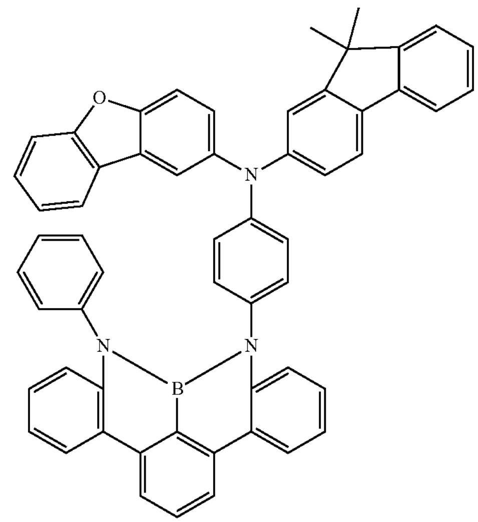 [SMILES: CC1(C)c2ccccc2-c2ccc(N(c3ccc(N4B5c6c(cccc6-c6ccccc64)-c4ccccc4N5c4ccccc4)cc3)c3ccc4oc5ccccc5c4c3)cc21] | 77% |

-continued
| No. | Reactant 1 | Reactant 2 | Product | Yield |
|---|---|---|---|---|
| 13f | 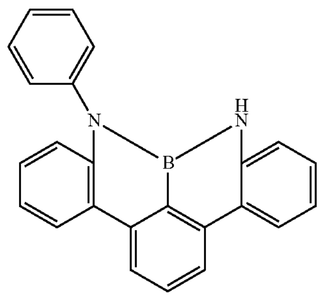 [SMILES: c1ccc(N2B3Nc4ccccc4-c4cccc(c43)-c3ccccc32)cc1] | 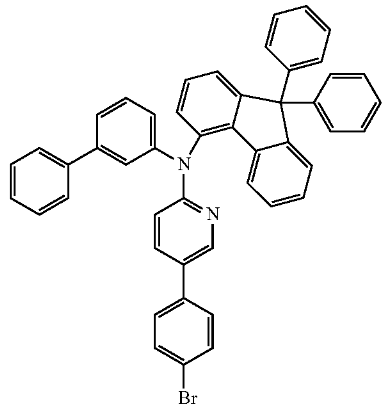 [SMILES: Brc1ccc(-c2ccc(N(c3cccc(-c4ccccc4)c3)c3cccc4c3-c3ccccc3C4(c3ccccc3)c3ccccc3)nc2)cc1] | 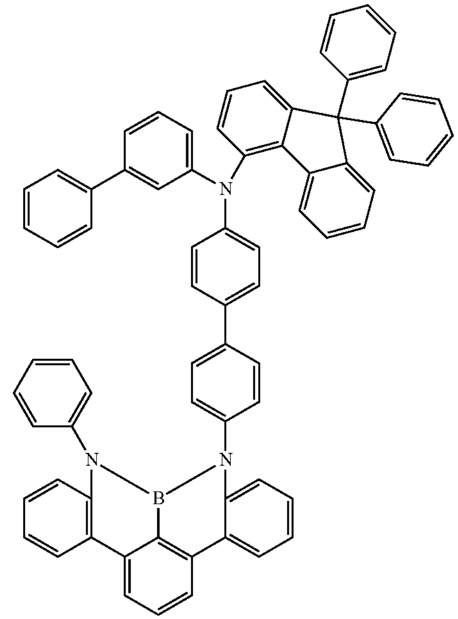 [SMILES: c1ccc(-c2cccc(N(c3ccc(-c4ccc(N5B6c7c(cccc7-c7ccccc75)-c5ccccc5N6c5ccccc5)cc4)cc3)c3cccc4c3-c3ccccc3C4(c3ccccc3)c3ccccc3)c2)cc1] | 76% |
| 14f | 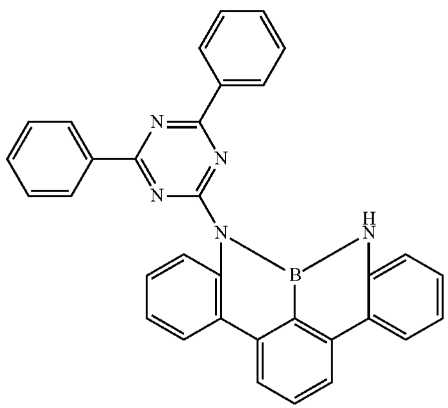 [SMILES: c1ccc(-c2nc(-c3ccccc3)nc(N3B4Nc5ccccc5-c5cccc(c54)-c4ccccc43)n2)cc1] | 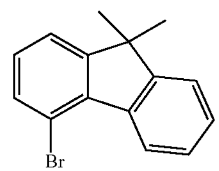 [942615-32-9] | 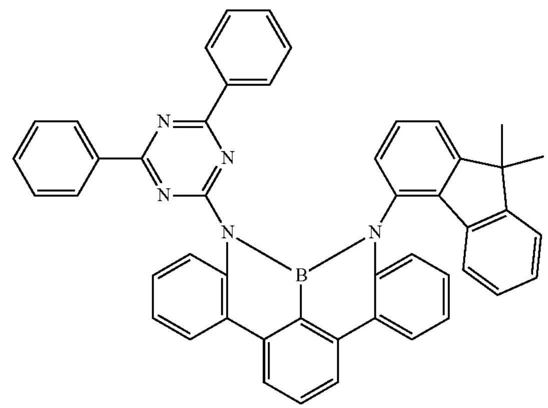 [SMILES: CC1(C)c2ccccc2-c2c(N3B4c5c(cccc5-c5ccccc53)-c3ccccc3N4c3nc(-c4ccccc4)nc(-c4ccccc4)n3)cccc21] | 78% |

-continued
| No. | Reactant 1 | Reactant 2 | Product | Yield |
|---|---|---|---|---|
| 15f | 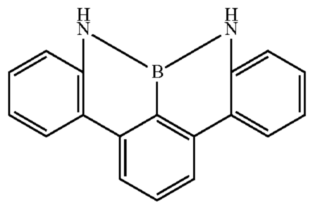 [SMILES: c1ccc2c(c1)NB1Nc3ccccc3-c3cccc-2c31] | 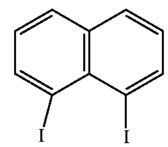 [1730-04-7] | 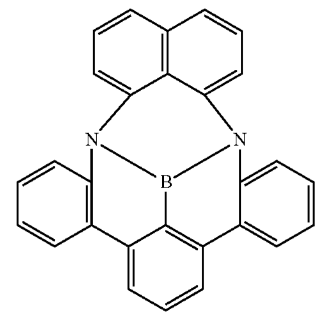 [SMILES: c1ccc2c(c1)-c1cccc3c1B1N2c2cccc4cccc(c24)N1c1ccccc1-3] | 65% |
| 16f | 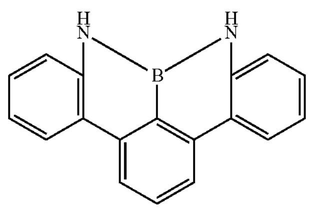 [SMILES: c1ccc2c(c1)NB1Nc3ccccc3-c3cccc-2c31] | 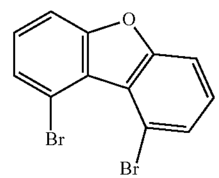 [617707-29-6] | 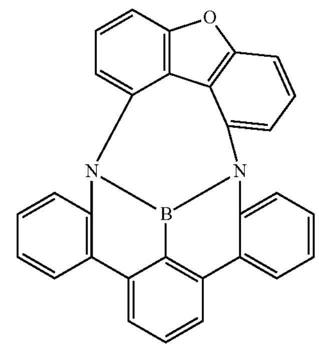 [SMILES: c1ccc2c(c1)-c1cccc3c1B1N2c2cccc4oc5cccc(c5c24)N1c1ccccc1-3] | 60% |
| 17f | 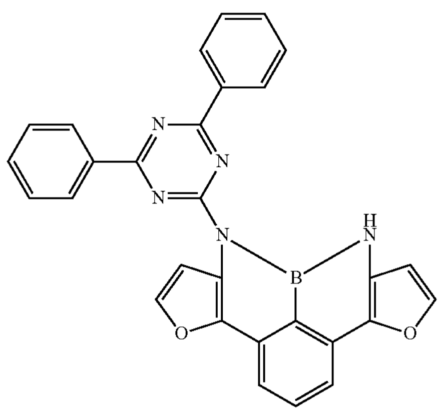 [SMILES: c1ccc(-c2nc(-c3ccccc3)nc(N3B4Nc5ccoc5-c5cccc(c54)-c4occc43)n2)cc1] | 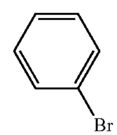 | 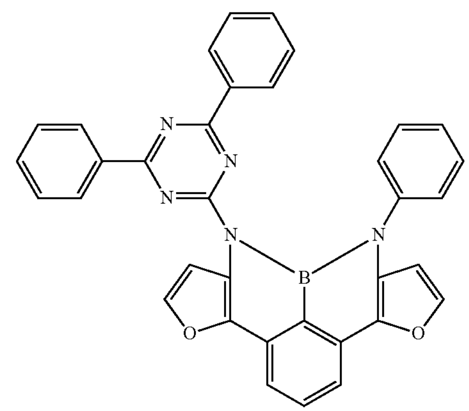 | 62% |

-continued
| No. | Reactant 1 | Reactant 2 | Product | Yield |
|---|---|---|---|---|
| 18f | 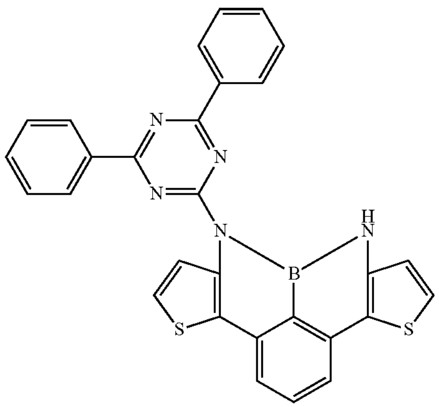 [SMILES: c1ccc(-c2nc(-c3ccccc3)nc(N3B4Nc5ccsc5-c5cccc(c54)-c4sccc43)n2)cc1] | 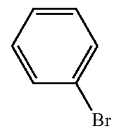 | 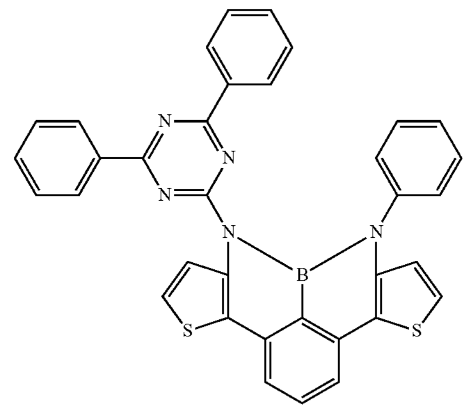 [SMILES: c1ccc(-c2nc(-c3ccccc3)nc(N3B4c5c(cccc5-c5sccc53)-c3sccc3N4c3ccccc3)n2)cc1] | 66% |

Production of the OLEDs

Examples I1 to I10 which follow (see Table 1) present the use of the materials of the invention in OLEDs.

Pretreatment for Examples I1-I10:

Glass plaques coated with structured ITO (indium tin oxide) of thickness 50 nm are treated prior to coating with an oxygen plasma, followed by an argon plasma. These plasma-treated glass plaques form the substrates to which the OLEDs are applied.

The OLEDs basically have the following layer structure: substrate/hole injection layer (HIL)/hole transport layer (HTL)/electron blocker layer (EBL)/emission layer (EML)/optional hole blocker layer (HBL)/electron transport layer (ETL)/optional electron injection layer (EIL) and finally a cathode. The cathode is formed by an aluminum layer of thickness 100 nm. The exact structure of the OLEDs can be found in table 1. The materials required for production of the OLEDs are shown in Table 2.

All materials are applied by thermal vapor deposition in a vacuum chamber. In this case, the emission layer always consists of at least one matrix material (host material) and an emitting dopant (emitter) which is added to the matrix material(s) in a particular proportion by volume by co-evaporation. Details given in such a form as EG1:IC2:TEG1 (44%:44%:12%) mean here that the material EG1 is present in the layer in a proportion of 44%, IC2 in a proportion of 44%, and TEG1 in a proportion of 12%, Analogously, the electron transport layer may also consist of a mixture of two materials.

The OLEDs are characterized in a standard manner. The electroluminescence spectra are determined at a luminance of 1000 cd/m$^2$, and the CIE 1931 x and y color coordinates are calculated therefrom.

Use of Materials of the Invention in OLEDs

The materials of the invention can be used in the emission layer in phosphorescent green OLEDs. The inventive compounds IV1 to IV10 are used in Examples 11 to 110 as matrix material in the emission layer. The color coordinates of the electroluminescence spectra of the OLEDs from these examples are CIEx=0.33 and CIEy=0.63. The materials are thus suitable for use in the emission layer of green OLEDs. In addition, the materials of the invention can be used successfully in the hole blocker layer (HBL) or in the electron blocker layer (EBL). This is shown in Examples I11 and I12. Here too, the color coordinates of the spectrum of the OLED are CIEx=0.33 and CIEy=0.63.

TABLE 1

Structure of the OLEDs

| Ex. | HIL thickness | HTL thickness | EBL thickness | EML thickness | HBL thickness | ETL thickness | EIL thickness |
|---|---|---|---|---|---|---|---|
| I1 | HATCN 5 nm | SpMA1 230 nm | SpMA2 20 nm | IV1:IC2:TEG1 (44%:44%:12%) 30 nm | ST2 10 nm | ST2:LiQ (50%:50%) 30 nm | LiQ 1 nm |
| I2 | HATCN 5 nm | SpMA1 230 nm | SpMA2 20 nm | IV2:IC2:TEG1 (44%:44%:12%) 30 nm | ST2 10 nm | ST2:LiQ (50%:50%) 30 nm | LiQ 1 nm |
| I3 | HATCN 5 nm | SpMA1 230 nm | SpMA2 20 nm | IV3:IC2:TEG1 (44%:44%:12%) 30 nm | ST2 10 nm | ST2:LiQ (50%:50%) 30 nm | LiQ 1 nm |
| I4 | HATCN 5 nm | SpMA1 230 nm | SpMA2 20 nm | IV4:IC2:TEG1 (44%:44%:12%) 30 nm | ST2 10 nm | ST2:LiQ (50%:50%) 30 nm | LiQ 1 nm |
| I5 | HATCN 5 nm | SpMA1 230 nm | SpMA2 20 nm | IV5:IC2:TEG1 (44%:44%:12%) 30 nm | ST2 10 nm | ST2:LiQ (50%:50%) 30 nm | LiQ 1 nm |
| I6 | HATCN 5 nm | SpMA1 230 nm | SpMA2 20 nm | IV6:IC2:TEG1 (44%:44%:12%) 30 nm | ST2 10 nm | ST2:LiQ (50%:50%) 30 nm | LiQ 1 nm |
| I7 | HATCN 5 nm | SpMA1 230 nm | SpMA2 20 nm | IV7:IC1:TEG1 (44%:44%:12%) 30 nm | ST2 10 nm | ST2:LiQ (50%:50%) 30 nm | LiQ 1 nm |
| I8 | HATCN 5 nm | SpMA1 230 nm | SpMA2 20 nm | IV8:IC1:TEG1 (44%:44%:12%) 30 nm | ST2 10 nm | ST2:LiQ (50%:50%) 30 nm | LiQ 1 nm |
| I9 | HATCN 5 nm | SpMA1 230 nm | SpMA2 20 nm | IV9:IC2:TEG1 (44%:44%:12%) 30 nm | ST2 10 nm | ST2:LiQ (50%:50%) 30 nm | LiQ 1 nm |
| I10 | HATCN 5 nm | SpMA1 230 nm | SpMA2 20 nm | IC1:IC2:TEG1 (44%:44%:12%) 30 nm | ST2 10 nm | ST2:LiQ (50%:50%) 30 nm | LiQ 1 nm |
| I11 | HATCN 5 nm | SpMA1 230 nm | SpMA2 20 nm | IC1:IC2:TEG1 (44%:44%:12%) 30 nm | IV1 10 nm | ST2:LiQ (50%:50%) 30 nm | LiQ 1 nm |
| I12 | HATCN 5 nm | SpMA1 230 nm | IV8 20 nm | IV9:IC2:TEG1 (44%:44%:12%) 30 nm | ST2 10 nm | ST2:LiQ (50%:50%) 30 nm | LiQ 1 nm |
| I13 | HATCN 5 nm | SpMA1 230 nm | IV8 20 nm | IV11:IC2:TEG1 (44%:44%:12%) 30 nm | ST2 10 nm | ST2:LiQ (50%:50%) 30 nm | LiQ 1 nm |
| I14 | HATCN 5 nm | SpMA1 230 nm | IV8 20 nm | IV12:IC2:TEG1 (44%:44%:12%) 30 nm | ST2 10 nm | ST2:LiQ (50%:50%) 30 nm | LiQ 1 nm |
| I15 | HATCN 5 nm | SpMA1 230 nm | IV8 20 nm | IV13:IC2:TEG1 (44%:44%:12%) 30 nm | ST2 10 nm | ST2:LiQ (50%:50%) 30 nm | LiQ 1 nm |
| I15 | HATCN 5 nm | SpMA1 230 nm | IV8 20 nm | IV14:IC2:TEG1 (44%:44%:12%) 30 nm | ST2 10 nm | ST2:LiQ (50%:50%) 30 nm | LiQ 1 nm |

TABLE 2
Structural formulae of the materials for the OLEDs
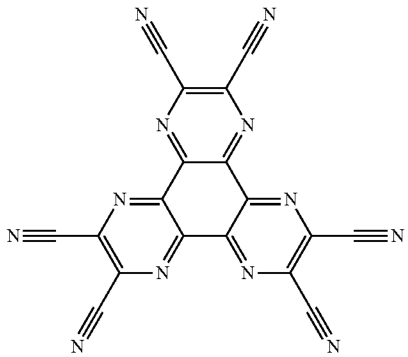
HATCN
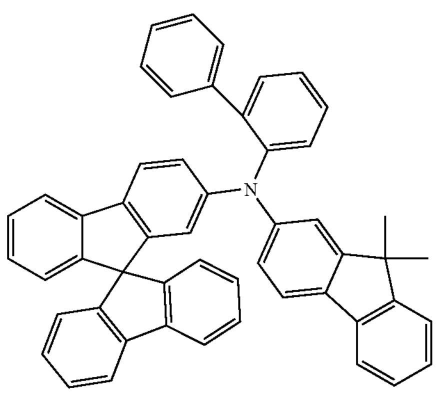
SpMA1
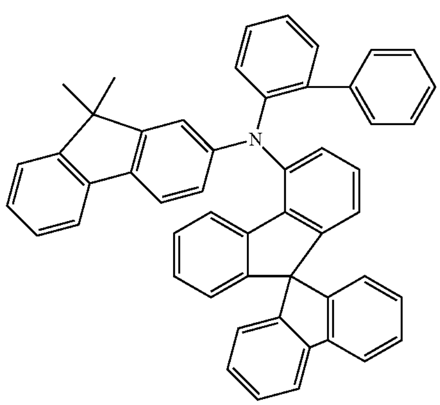
SpMA2
TABLE 2-continued
Structural formulae of the materials for the OLEDs
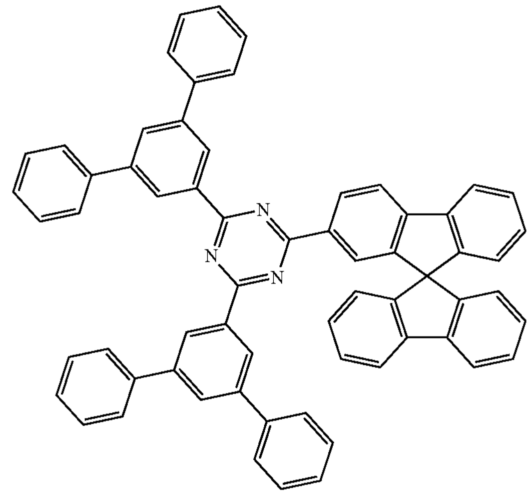
ST2
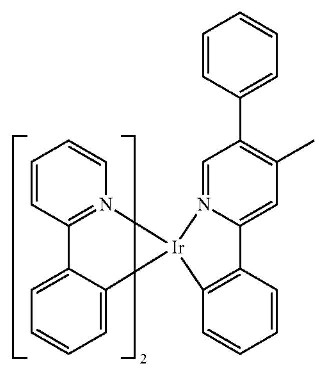
TEG1
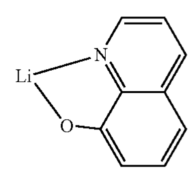
LiQ
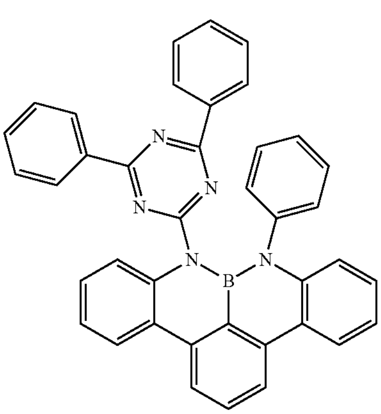
IV1

TABLE 2-continued
| Structural formulae of the materials for the OLEDs |
| --- |
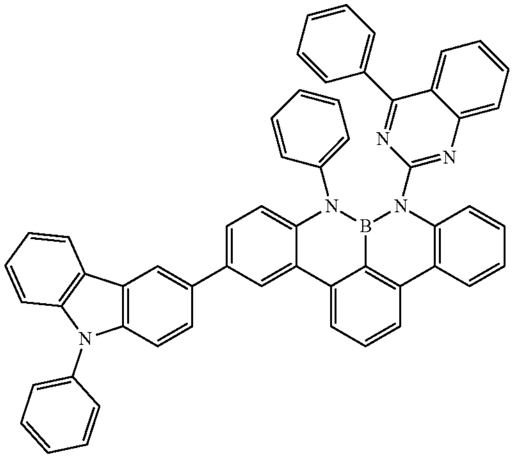
IV2
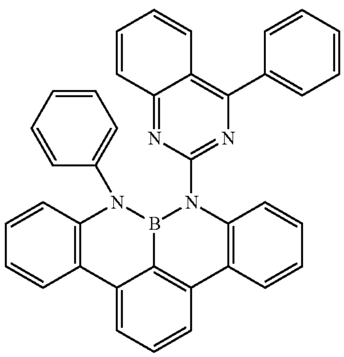
IV3
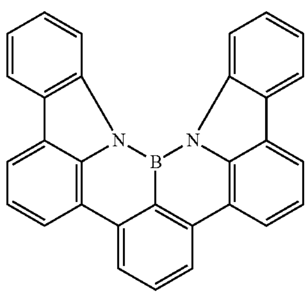
IV4
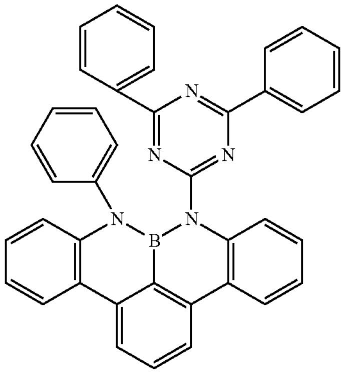
IV5
TABLE 2-continued
| Structural formulae of the materials for the OLEDs |
| --- |
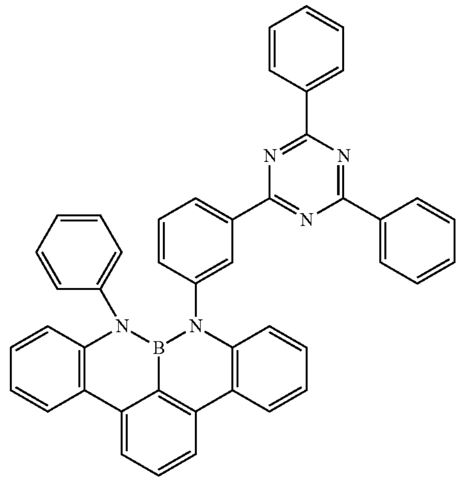
IV6
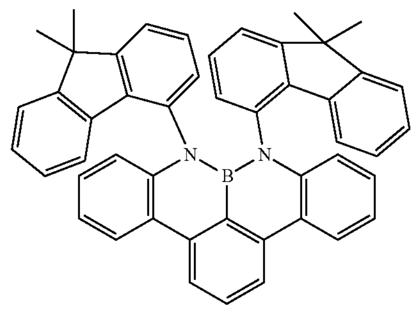
IV7
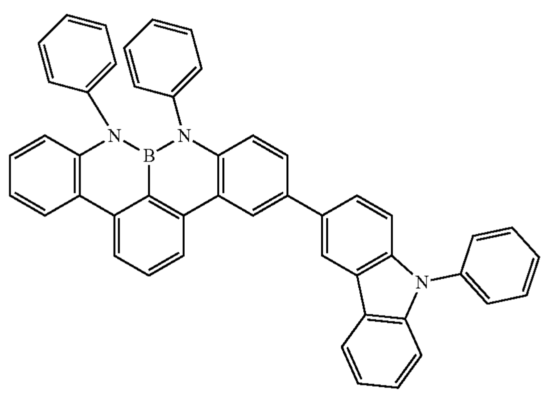
IV8

TABLE 2-continued
Structural formulae of the materials for the OLEDs
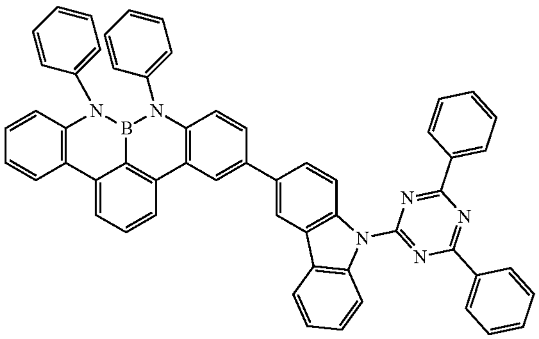
IV9
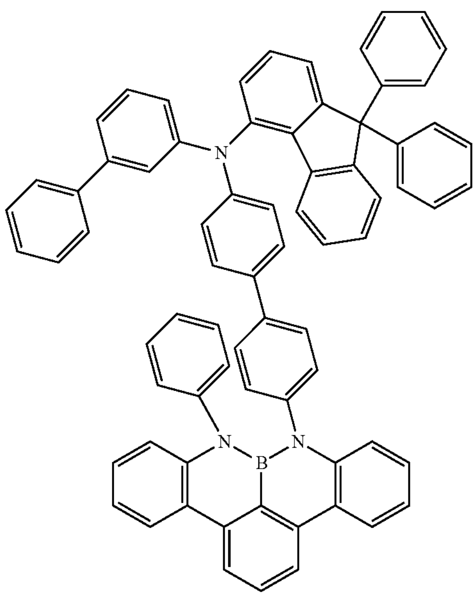
IV10
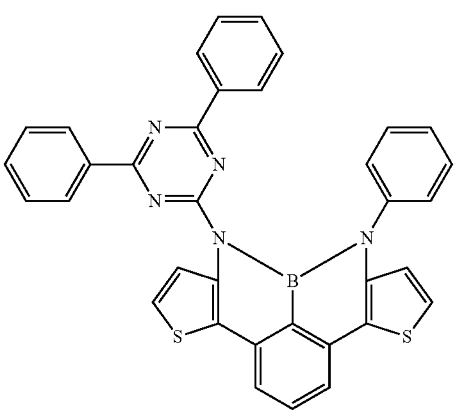
IV11
TABLE 2-continued
Structural formulae of the materials for the OLEDs
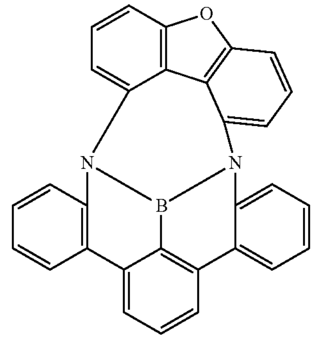
IV12
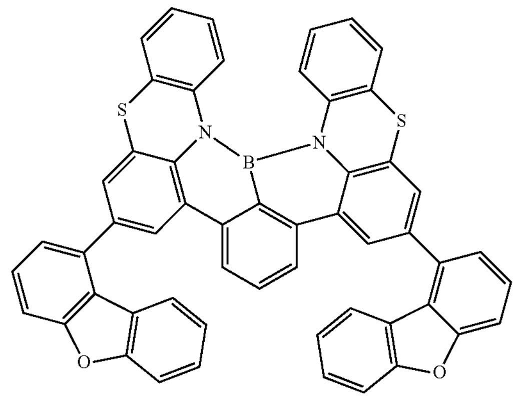
IV13
IV14
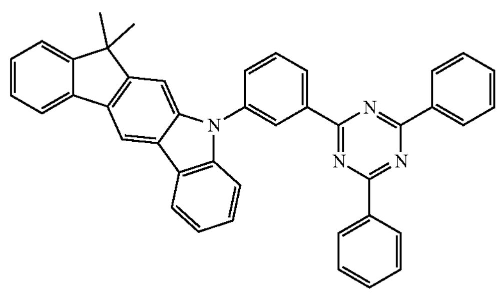
IC1
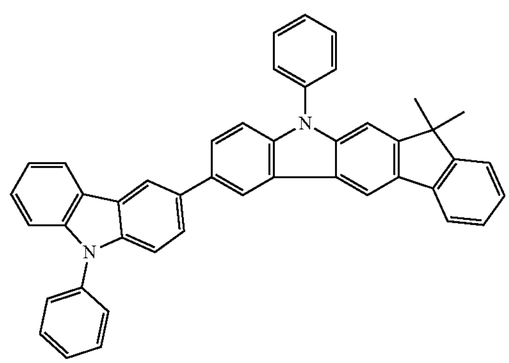
IC2

The invention claimed is:

1. A compound of formulae (2-1), (2-2) or (2-3)

Formula (2-1)

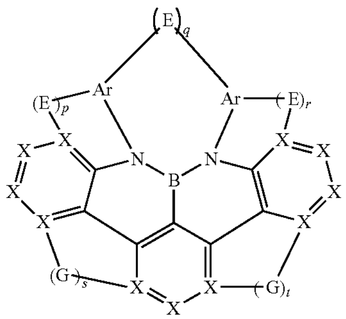

Formula (2-2)

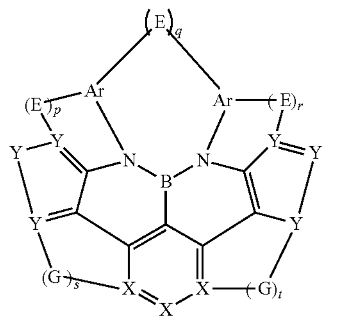

Formula (2-3)

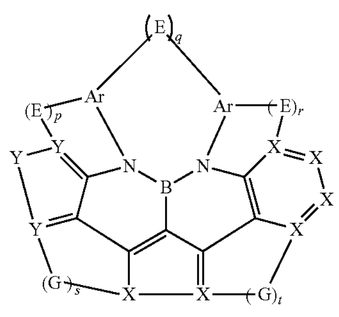

where the symbols and indices used are as follows:

E is the same or different at each instance and is selected from the group consisting of a single bond, NR, $CR_2$, O, S and C═O;

G is the same or different at each instance and is selected from the group consisting of NR, $CR_2$, O, S and C═O;

p, q, r are the same or different at each instance and are selected from the group consisting of 0, 1 and 2;

s, t are the same or different at each instance and are selected from the group consisting of 0 and 1;

and where, at least one of p, r, s or t=1;

or q is 0 and both Ar are an aromatic or heteroaromatic ring system which has 5 to 40 aromatic ring atoms and may be substituted by one or more R radicals, and which is bonded to at least both nitrogen atoms;

R is the same or different at each instance and is selected from the group consisting of H, D, F, Cl, Br, I, CN, $NO_2$, $N(Ar^4)2$, $N(R^1)_2$, $OAr^4$, $OR^1$, $SAr^4$, $SR^1$, $C(═O)Ar^4$, $C(═O)R^1$, $P(═O)(Ar^4)_2$, $P(Ar^4)_2$, $B(Ar^4)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl group or alkynyl group having 2 to 40 carbon atoms, each of which may be substituted by one or more $R^1$ radicals and where one or more nonadjacent $CH_2$ groups may be replaced by $R^1C═CR^1$,C═O, C═S, $C═NR^1$, $P(═O)(R^1)$, SO, $SO_2$, $NR^1$, O, S or $CONR^1$ and where one or more hydrogen atoms may be replaced by D, F, CI, Br, I, CN or $NO_2$, an aromatic or heteroaromatic ring system which has 5 to 60 aromatic ring atoms and may be substituted in each case by one or more $R^1$ radicals, or an aralkyl or heteroaralkyl group which has 5 to 60 aromatic ring atoms and may be substituted by one or more $R^1$ radicals; at the same time, optionally two or more substituents R may form a monocyclic or polycyclic, aliphatic, heteroaliphatic, aromatic or heteroaromatic ring system which may be substituted by one or more $R^1$ radicals;

Ar, $Ar^1$, $Ar^2$, $Ar^3$ are the same or different at each instance and are an aromatic or heteroaromatic ring system which has 5 to 40 aromatic ring atoms and may be substituted by one or more R radicals, where, when q is 0, both Ar together may also be an Ar group bonded to at least both nitrogen atoms;

$Ar^4$ is the same or different at each instance and is an aromatic or heteroaromatic ring system which has 5 to 40 aromatic ring atoms and may be substituted by one or more $R^2$ radicals; at the same time, two $Ar^4$ radicals bonded to the same nitrogen atom or phosphorus atom may also be bridged to one another by a single bond or a bridge selected from $N(R^2)$, $C(R^2)_2$, O and S;

X is the same or different at each instance and is CR or N, where X is C when there is a bond to E or G thereon, and where not more than 2 X in any cycle are N;

Y is the same or different at each instance and is CR, NR, O or S, where Y may also be N when one Y in the same cycle is already NR, O or S, where Y is C or N when there is a bond to E thereon;

$R^1$ is the same or different at each instance and is selected from the group consisting of H, D, F, Cl, Br, I, CN, $NO_2$, $N(R^2)_2$, $OR^2$, $SR^2$, $C(═O)R^2$, a straight-chain alkyl, alkoxy or thioalkyl group having 1 to 20 carbon atoms or a branched or cyclic alkyl, alkoxy or thioalkyl group having 3 to 20 carbon atoms or an alkenyl group or alkynyl group having 2 to 20 carbon atoms, each of which may be substituted by one or more $R^2$ radicals and where one or more nonadjacent $CH_2$ groups may be replaced by $R^2C═CR^2$, C═O, C═S, $C═NR^2$, $P(═O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, or an aralkyl or heteroaralkyl group which has 5 to 40 aromatic ring atoms and may be substituted by one or more $R^2$ radicals; at the same time, it is optionally possible for two substituents $R_1$ bonded to the same carbon atom or to adjacent carbon atoms to form a monocyclic or polycyclic, aliphatic, heteroaliphatic, aromatic or heteroaromatic ring system which may be substituted by one or more $R^2$ radicals; and $R^2$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F or CN or substituted by one or more alkyl groups each having 1 to 10 carbon atoms; at the same time, two or more adjacent $R^2$ substituents together may form a mono- or polycyclic, aliphatic, aromatic or heteroaromatic ring system.

2. A compound as claimed in claim 1, characterized in that it is a compound of the formula (2)

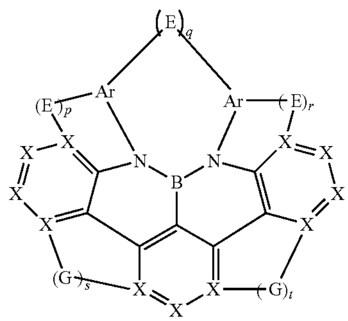

Formula (2)

where the symbols and indices have the definitions given in claim 1 and in addition:

X is the same or different at each instance and is CR, where X is C when there is a bond to E or G thereon.

3. A compound as claimed in claim 1, characterized in that p and r are the same or different at each instance and are selected from the group consisting of 0 and 1, and q is 0, 1 or 2.

4. A mixture comprising at least one compound as claimed in claim 1 and at least one further compound and/or at least one solvent.

5. A method comprising incorporating the compound as claimed in claim 1 in an electronic device.

6. An electronic device comprising at least one compound as claimed in claim 1.

7. The electronic device as claimed in claim 6, characterized in that it is an organic electroluminescent device.

8. The electronic device as claimed in claim 7, wherein the electronic device comprises the compound in an emitting layer, optionally as one or more further matrix materials, in a hole transport layer or in an electron transport layer.

* * * * *